US009012983B2

(12) United States Patent
Mine

(10) Patent No.: US 9,012,983 B2
(45) Date of Patent: Apr. 21, 2015

(54) SEMICONDUCTOR DEVICE AND METHOD OF FORMING THE SAME

(75) Inventor: Teruyuki Mine, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 273 days.

(21) Appl. No.: 13/287,295

(22) Filed: Nov. 2, 2011

(65) Prior Publication Data

US 2012/0112258 A1    May 10, 2012

(30) Foreign Application Priority Data

Nov. 5, 2010    (JP) .................................. 2010-248769

(51) Int. Cl.
*H01L 27/108*   (2006.01)
*H01L 29/78*   (2006.01)
*H01L 21/762*   (2006.01)
*H01L 29/10*   (2006.01)
*H01L 29/423*   (2006.01)

(52) U.S. Cl.
CPC .... *H01L 27/10876* (2013.01); *H01L 21/76224* (2013.01); *H01L 27/10891* (2013.01); *H01L 29/1037* (2013.01); *H01L 29/4236* (2013.01)

(58) Field of Classification Search
CPC ..................... H01L 29/4236; H01L 29/66621; H01L 27/10891; H01L 27/10876
USPC .......................... 257/330, 331, 332, 334, 296
See application file for complete search history.

(56) References Cited

U.S. PATENT DOCUMENTS

| | | | |
|---|---|---|---|
| 5,960,298 A | 9/1999 | Kim | |
| 6,759,720 B2 | 7/2004 | Shinkawata | |
| 8,390,064 B2 | 3/2013 | Mikasa | |
| 8,546,232 B2 | 10/2013 | Sako | |
| 2008/0029810 A1* | 2/2008 | Kim et al. ..................... | 257/330 |
| 2008/0253160 A1 | 10/2008 | Popp et al. | |
| 2009/0206443 A1 | 8/2009 | Juengling | |
| 2010/0102371 A1 | 4/2010 | Yeom | |
| 2010/0148236 A1 | 6/2010 | Kadoya | |
| 2010/0240191 A1 | 9/2010 | Chung et al. | |
| 2012/0025299 A1 | 2/2012 | Ko | |
| 2012/0086084 A1 | 4/2012 | Kikuchi | |

(Continued)

FOREIGN PATENT DOCUMENTS

| | | | |
|---|---|---|---|
| JP | 06-291277 A | 10/1994 | |
| JP | 08-172124 A | 7/1996 | |

(Continued)

OTHER PUBLICATIONS

Office Action mailed Mar. 28, 2014 in co-pending U.S. Appl. No. 13/944,296.

*Primary Examiner* — Matthew W Such
*Assistant Examiner* — Scott Stowe
(74) *Attorney, Agent, or Firm* — Sughrue Mion, PLLC

(57) ABSTRACT

A semiconductor device includes the following elements. A semiconductor substrate has a device formation region. The device formation region is defined by first and second device isolation regions which extend in first and second directions, respectively. The device formation region has a first gate groove which extends in the second direction. A first gate insulating film is disposed in a lower portion of the first gate groove. A first gate electrode is disposed on the first gate insulating film. The first gate electrode is disposed in the lower portion of the first gate groove. A buried insulating film is disposed over the first gate electrode. The buried insulating film is disposed in an upper portion of the first gate groove.

20 Claims, 93 Drawing Sheets

(56) References Cited

U.S. PATENT DOCUMENTS

| | | |
|---|---|---|
| 2012/0112258 A1 | 5/2012 | Mine |
| 2012/0139080 A1 | 6/2012 | Wang et al. |
| 2012/0202336 A1 | 8/2012 | Park et al. |
| 2012/0315738 A1 | 12/2012 | Kobayashi |
| 2012/0326267 A1 | 12/2012 | Song |
| 2013/0171801 A1 | 7/2013 | Park et al. |

FOREIGN PATENT DOCUMENTS

| | | |
|---|---|---|
| JP | 10-199969 A | 7/1998 |
| JP | 2008-263201 A | 10/2008 |
| JP | 2010-141107 A | 6/2010 |
| JP | 2010-147078 A | 7/2010 |
| JP | 2011-159739 A | 8/2011 |

* cited by examiner

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2010-248769, filed Nov. 5, 2010, the content of which is incorporated herein by reference.

2. Description of the Related Art

In recent years, with the development of miniaturization of semiconductor devices such as DRAMs, Dynamic Random Access Memories, specifically, miniaturization of semiconductor elements, it is becoming difficult to form a miniaturized island-shaped active region, element forming region surrounded by an element isolation region, STI (shallow trench isolation) region in a semiconductor substrate using photolithography and dry etching.

For a DRAM, a buried gate electrode, a pair of impurity diffusion regions, source/drain regions, and the like constituting a selection transistor are formed in the active region, element forming region.

When the miniaturized island-shaped active region is formed using the photolithography and the dry etching, the photolithography and the dry etching may not be well performed. Accordingly, both ends of the active region are rounded and an area of an upper surface of the active region becomes smaller than a desired value.

If an impurity diffusion region is formed in an end of the active region having such a shape, an area of an upper surface of the impurity active region becomes smaller than a desired value.

Accordingly, since an area of a contact between a contact plug contacting the upper surface of the impurity diffusion region and the impurity diffusion region also becomes small, contact resistance between the impurity diffusion region and the contact plug becomes great.

As a means for resolving such problems, a device including an element isolation region (STI region) consisting of an insulating film burying a trench formed in a semiconductor substrate and partitioning an active region extending in a first direction, and a dummy gate electrode arranged through an insulating film in a dummy gate trench (a trench formed in the semiconductor substrate) extending in a second direction intersecting the first direction and functioning as an element isolation region that partitions the active region into a plurality of element forming regions when a reverse bias is applied is disclosed in Japanese Patent Laid-open Publication No. 2010-141107.

Since the reverse bias is applied to cause the dummy gate electrode to function as an element isolation region, on current of an adjacent selection transistor cannot be sufficiently secured or junction leak current increases due to the reverse bias. Accordingly, a data retention characteristic of a DRAM is degraded.

SUMMARY

In one embodiment, a semiconductor device may include, but is not limited to, the following elements. A semiconductor substrate has first and second isolation grooves. The first isolation grooves extend in a first direction. The first isolation grooves define a first active region. The second isolation groove extends in a second direction different from the first direction. The second isolation groove extends to divide the first isolation groove into divided groove portions. The second isolation groove extends to divide the active region into device formation regions. The device formation region is defined by the first and second isolation grooves. The device formation region has a first gate groove extending in the second direction. A first isolation insulating film is disposed in the first isolation groove. A second isolation insulating film is disposed in the second isolation groove. A first gate insulating film is disposed in a lower portion of the first gate groove. A first gate electrode is disposed on the first gate insulating film. The first gate electrode is in the lower portion of the first gate groove. The first buried insulating film is disposed over the first gate electrode. The first buried insulating film is disposed in an upper portion of the first gate groove. A first diffusion region is disposed in the device formation region. The first diffusion region is disposed in a first side of the first gate groove. A second diffusion region is disposed in the device formation region. The second diffusion region is disposed in a second side of the first gate groove, opposite to the first side.

In another embodiment, a semiconductor device may include, but is not limited to, the following elements. A semiconductor substrate has a device formation region. The device formation region is defined by first and second device isolation regions which extend in first and second directions, respectively. The device formation region has a first gate groove which extends in the second direction. A first gate insulating film is disposed in a lower portion of the first gate groove. A first gate electrode is disposed on the first gate insulating film. The first gate electrode is disposed in the lower portion of the first gate groove. A buried insulating film is disposed over the first gate electrode. The buried insulating film is disposed in an upper portion of the first gate groove.

In still another embodiment, a semiconductor device may include, but is not limited to, the following elements. A semiconductor substrate has first and second isolation grooves. The first isolation grooves extend in a first direction. The first isolation grooves define active regions. The second isolation grooves extend in a second direction different from the first direction. The second isolation groove extends to divide the first isolation groove into divided groove portions. The second isolation groove extends to divide the active region into device formation regions. The device formation regions are each defined by the first and second isolation grooves. The device formation region each have first and second gate grooves extending in the second direction. First isolation insulating films are disposed in the first isolation grooves. Second isolation insulating films are disposed in the second isolation grooves. First gate insulating films are disposed in lower portions of the first gate grooves. First gate electrodes are disposed on the first gate insulating films. The first gate electrodes are disposed in the lower portions of the first gate grooves. First buried insulating films are disposed over the first gate electrodes. The first buried insulating films are disposed in upper portions of the first gate grooves. Second gate insulating films are formed in lower portions of the second gate grooves. Second gate electrodes are disposed on the second gate insulating films. The second gate electrodes are in the lower portions of the second gate grooves. Second buried insulating films are disposed over the second gate electrodes. The second buried insulating films are disposed in upper portions of the second gate grooves. The first diffusion region is disposed in the device formation region. The first diffusion region is disposed between the first and second gate grooves. A second diffusion region is disposed in the device formation region. The second diffusion region is disposed in an opposite side to the first diffusion region with reference to the first gate groove. A third diffusion region is disposed in the device formation region. The third diffusion region is disposed in an opposite side to the first diffusion region with reference to the second gate groove.

BRIEF DESCRIPTION OF THE DRAWINGS

The above features and advantages of the present invention will be more apparent from the following description of certain preferred embodiments taken in conjunction with the accompanying drawings, in which:

FIG. 30B is a fragmentary cross sectional elevation view, taken along an A-A line of FIG. 30A, illustrative of the same step as of FIG. 30A, involved in the method of forming the memory cell area of the semiconductor device of FIG. 28 in accordance with a modification to the second embodiment of the present invention;

FIG. 30C is a fragmentary cross sectional elevation view, taken along a B-B line of FIG. 30A, illustrative of the same step as of FIG. 30A, involved in the method of forming the memory cell area of the semiconductor device of FIG. 28 in accordance with a modification to the second embodiment of the present invention;

FIG. 30D is a fragmentary cross sectional elevation view, taken along a C-C line of FIG. 30A, illustrative of the same step as of FIG. 30A, involved in the method of forming the memory cell area of the semiconductor device of FIG. 28 in accordance with a modification to the second embodiment of the present invention;

FIG. 30E is a fragmentary cross sectional elevation view, taken along a D-D line of FIG. 30A, illustrative of the same step as of FIG. 30A, involved in the method of forming the memory cell area of the semiconductor device of FIG. 28 in accordance with a modification to the second embodiment of the present invention;

FIG. 31A is a fragmentary schematic plain view of a step, subsequent to the step of FIGS. 30A through 30E, involved in a method of forming the memory cell area of the semiconductor device of FIG. 28 in accordance with a modification to the second embodiment of the present invention;

FIG. 31B is a fragmentary cross sectional elevation view, taken along an A-A line of FIG. 31A, illustrative of the same step as of FIG. 31A, subsequent to the step of FIGS. 30A through 30E, involved in the method of forming the memory cell area of the semiconductor device of FIG. 28 in accordance with a modification to the second embodiment of the present invention;

FIG. 31C is a fragmentary cross sectional elevation view, taken along a B-B line of FIG. 31A, illustrative of the same step as of FIG. 31A, subsequent to the step of FIGS. 30A through 30E, involved in the method of forming the memory cell area of the semiconductor device of FIG. 28 in accordance with a modification to the second embodiment of the present invention;

FIG. 31D is a fragmentary cross sectional elevation view, taken along a C-C line of FIG. 31A, illustrative of the same step as of FIG. 31A, subsequent to the step of FIGS. 30A through 30E, involved in the method of forming the memory cell area of the semiconductor device of FIG. 28 in accordance with a modification to the second embodiment of the present invention;

FIG. 31E is a fragmentary cross sectional elevation view, taken along a D-D line of FIG. 31A, illustrative of the same step as of FIG. 31A, subsequent to the step of FIGS. 30A through 30E, involved in the method of forming the memory cell area of the semiconductor device of FIG. 28 in accordance with a modification to the second embodiment of the present invention;

FIG. 32 is a fragmentary schematic plain view of a memory cell array of a semiconductor device in accordance with a third embodiment of the present invention;

FIG. 33A is a fragmentary schematic plain view of a step involved in a method of forming the memory cell area of the semiconductor device of FIG. 32 in accordance with a third embodiment of the present invention;

FIG. 33B is a fragmentary cross sectional elevation view, taken along an A-A line of FIG. 33A, illustrative of the same step as of FIG. 33A, involved in the method of forming the memory cell area of the semiconductor device of FIG. 32 in accordance with a third embodiment of the present invention;

Figure 28:
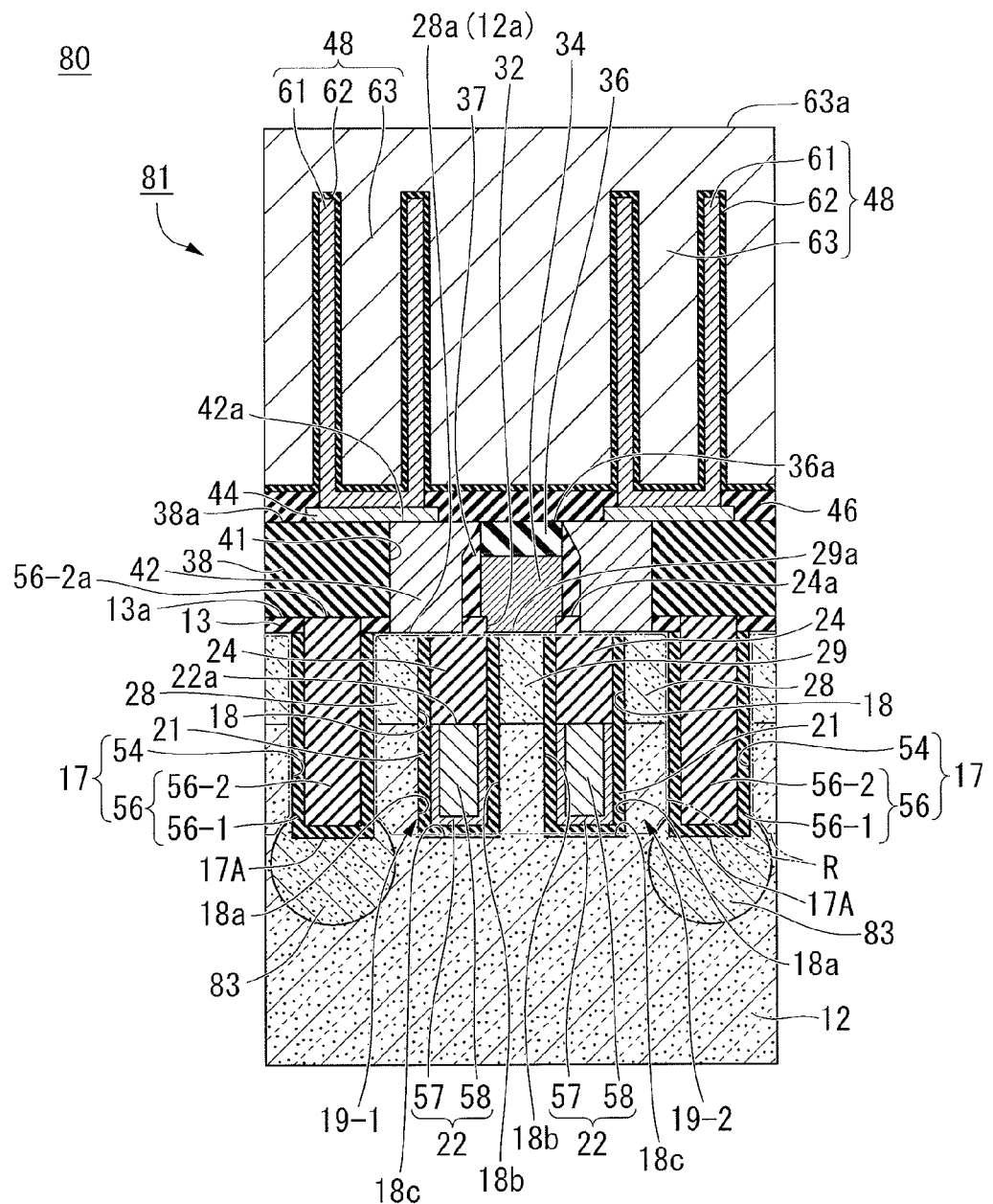
FIG. 28 is a fragmentary schematic plain view of a memory cell array of a semiconductor device in accordance with a second embodiment of the present invention.
Figure 32:
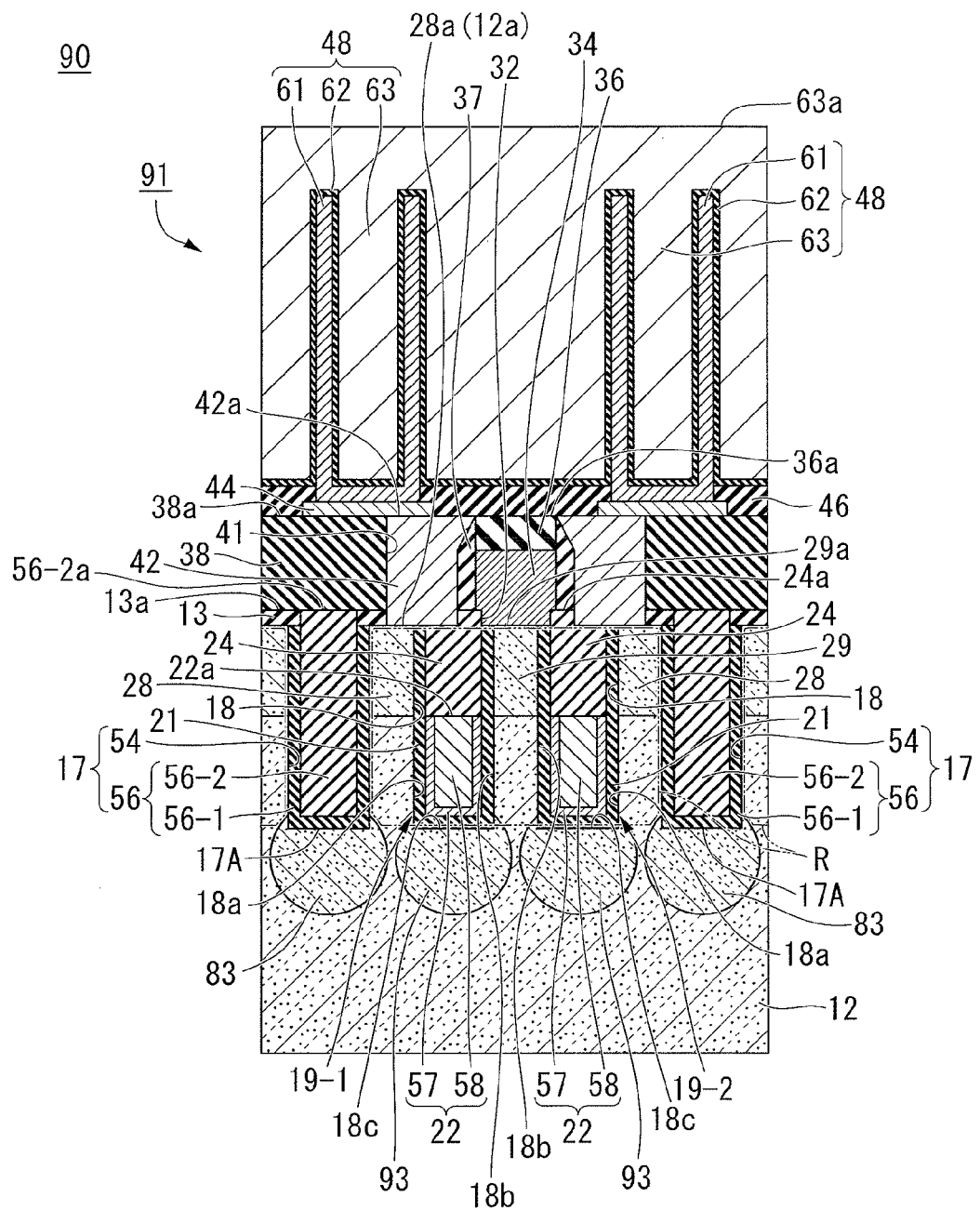
Figure 33A:
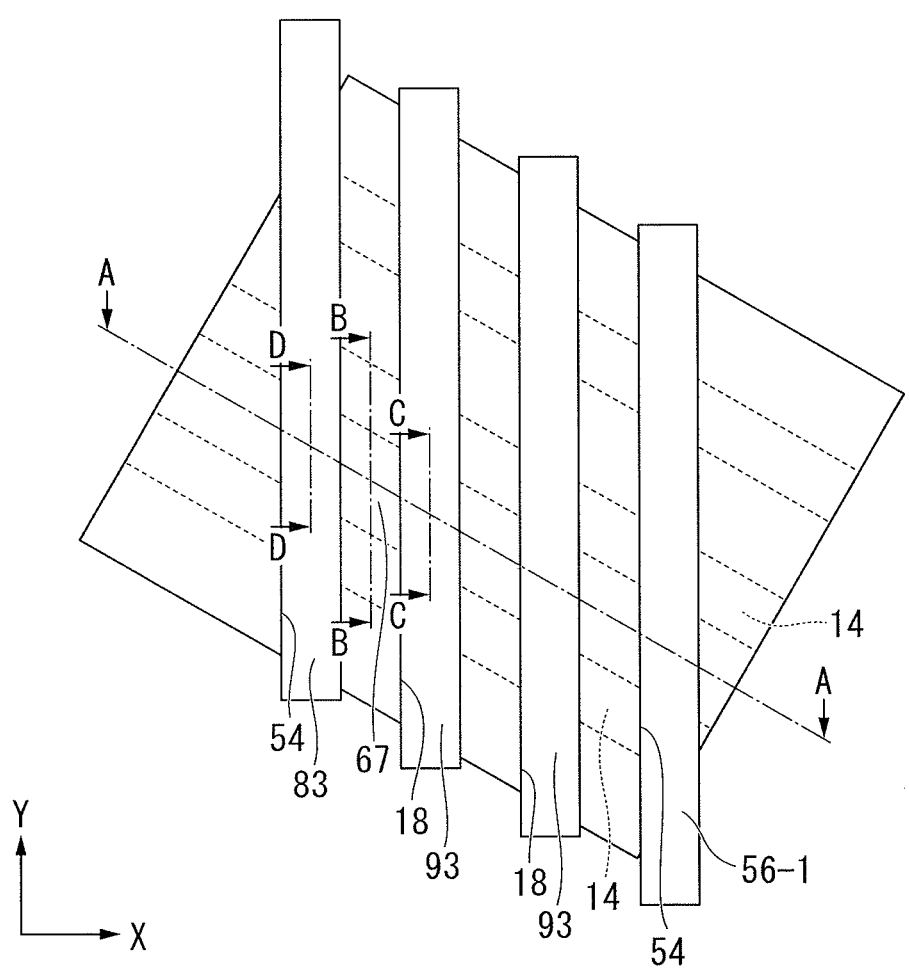
Figure 33B:
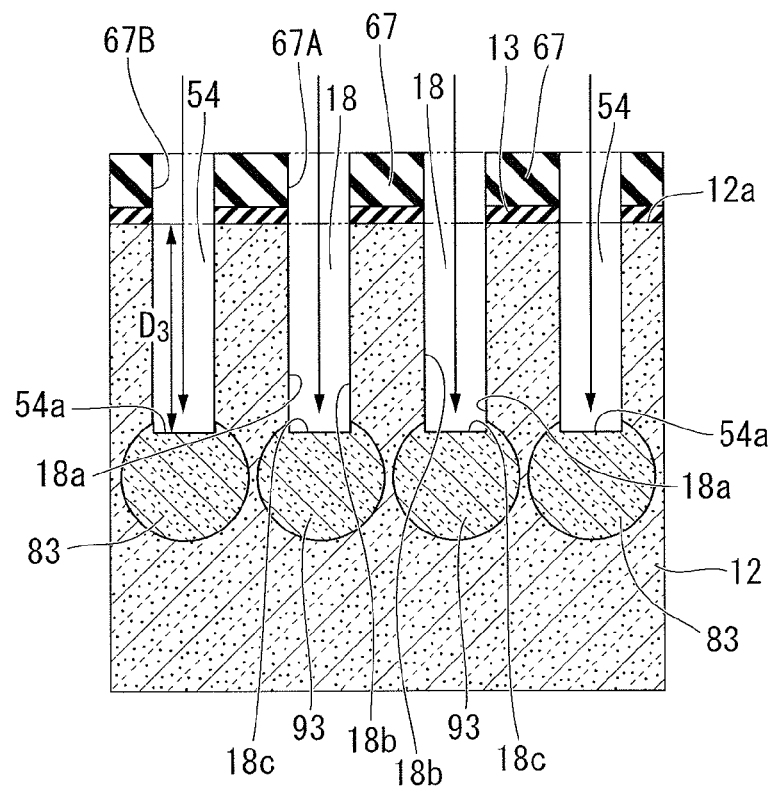
Figure 33C:
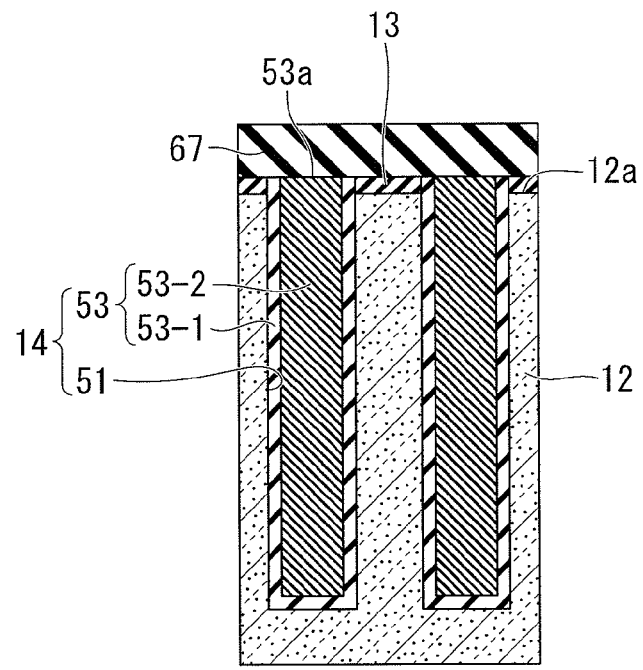
Figure 33D:
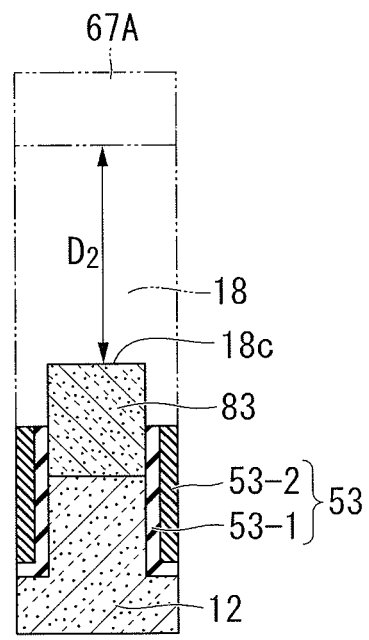
Figure 33E:
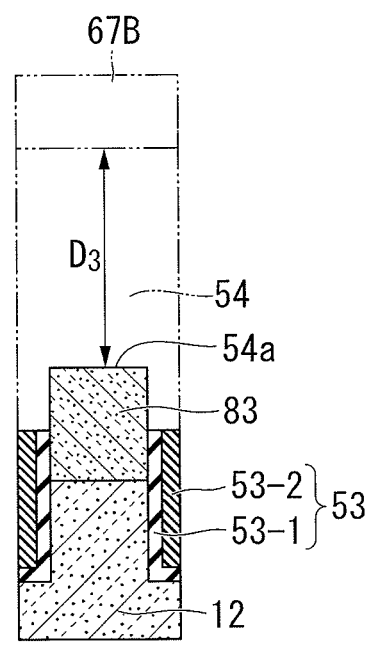
Figure 34:
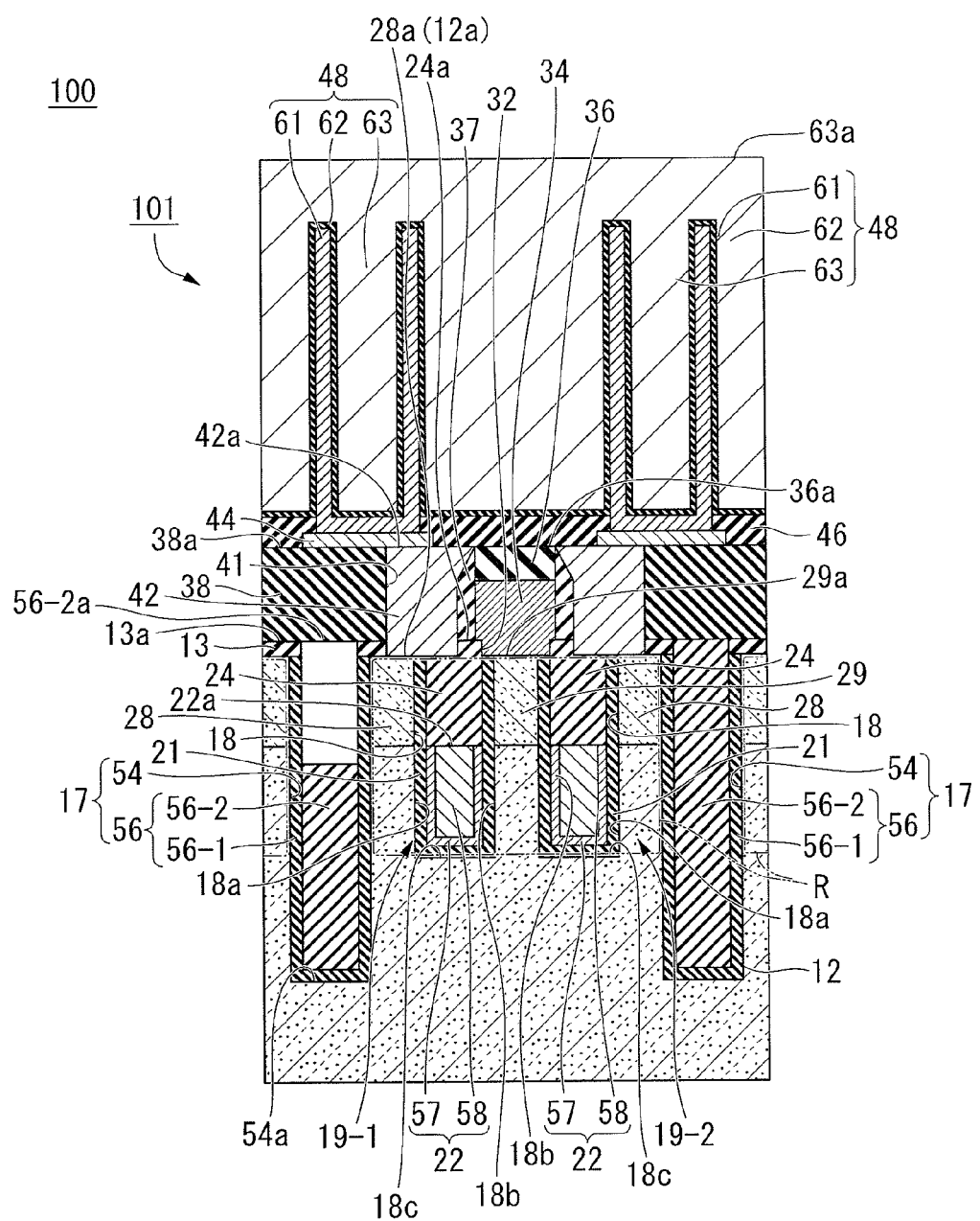
Figure 35A:
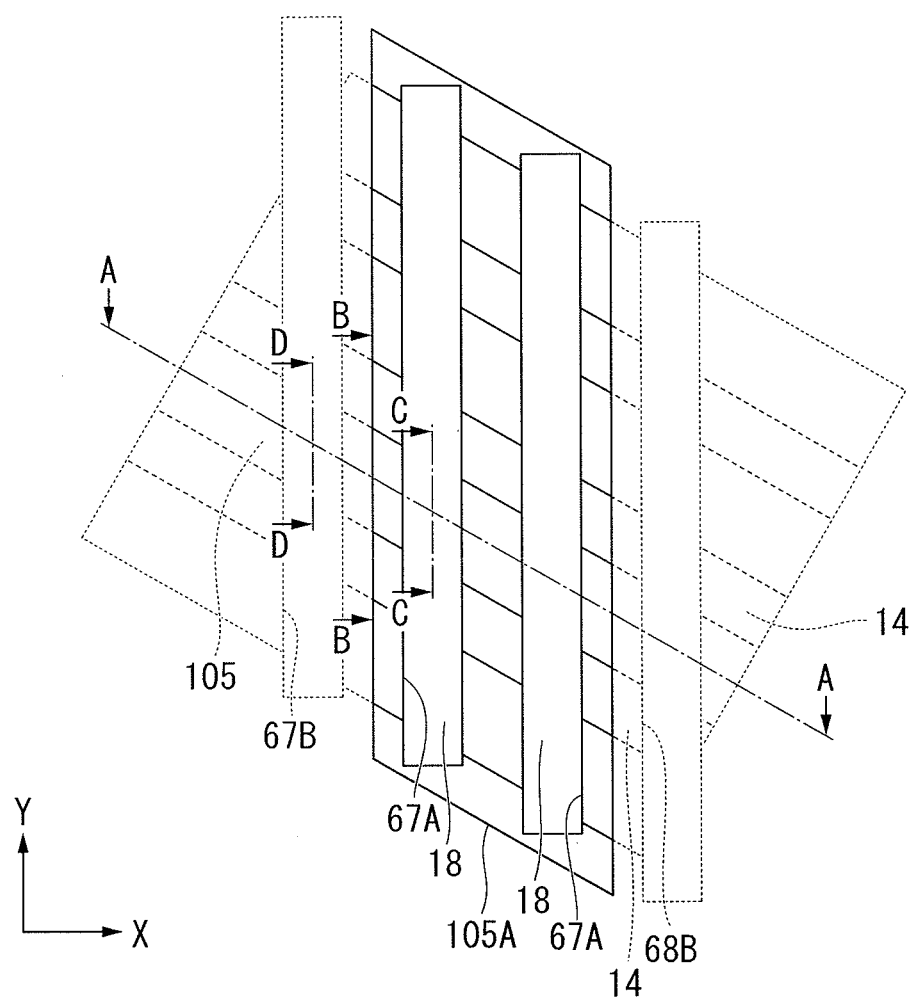
Figure 35B:
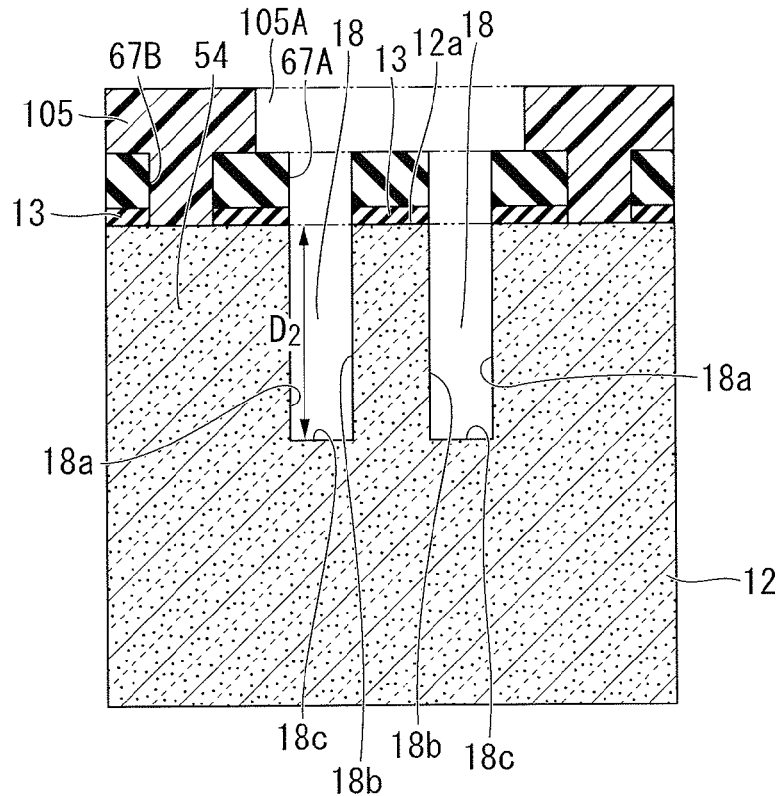
Figure 35C:
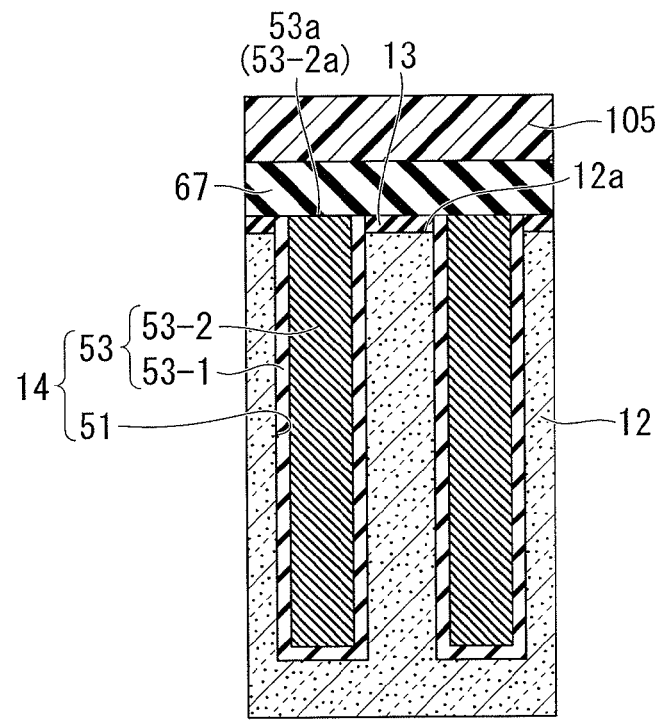
Figure 35D:
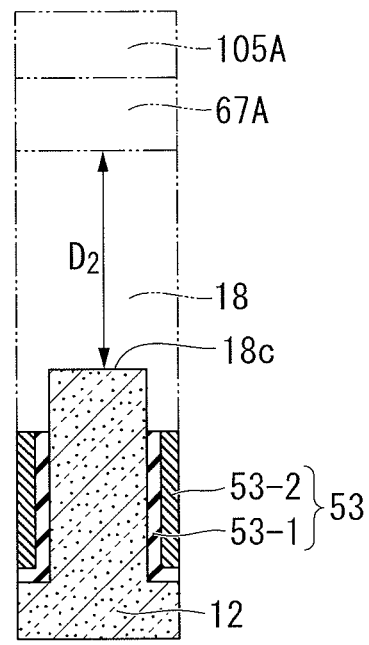
Figure 35E:
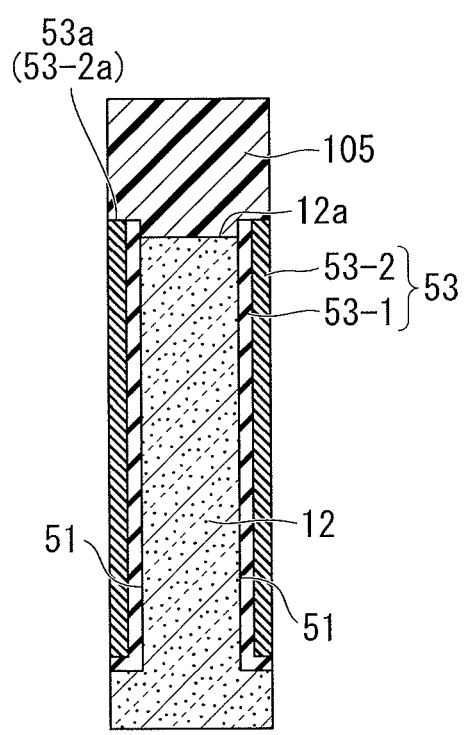
Figure 36A:
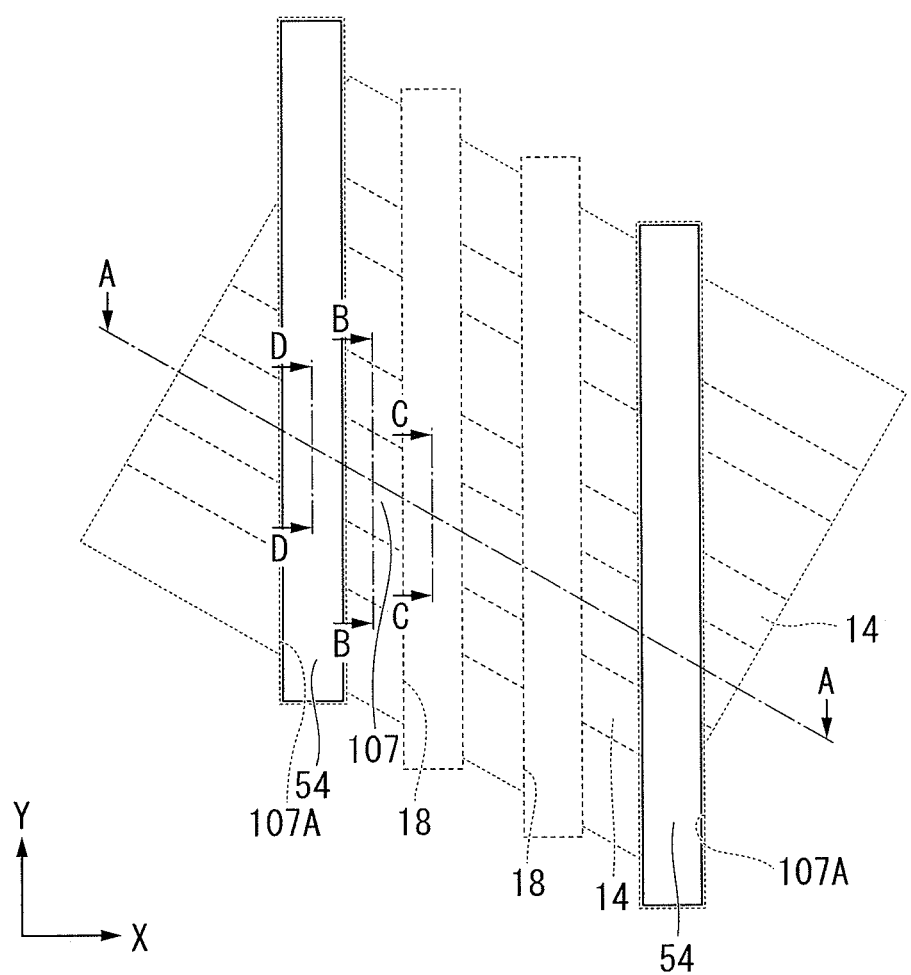
Figure 36B:
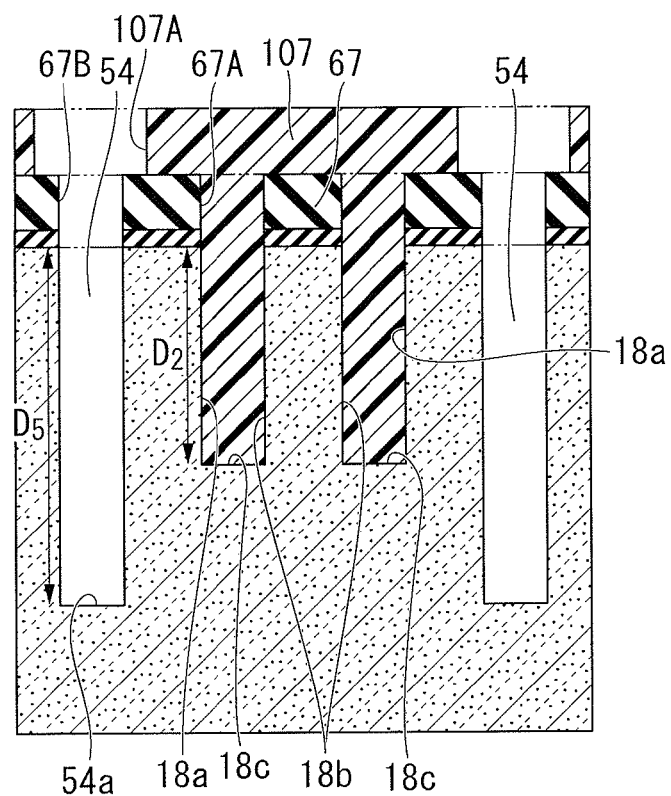
Figure 36C:
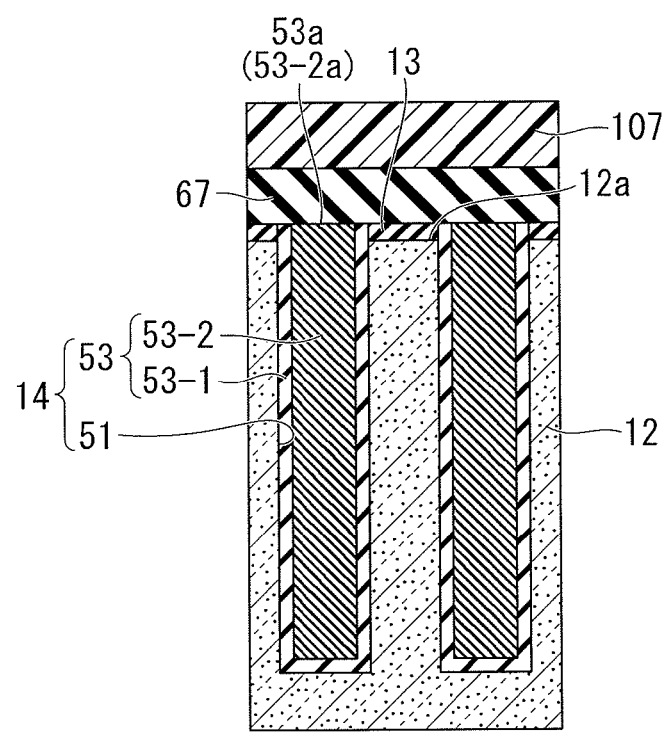
Figure 36D:
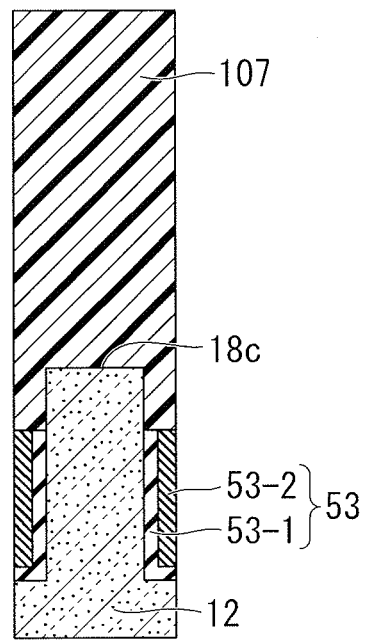
Figure 36E:
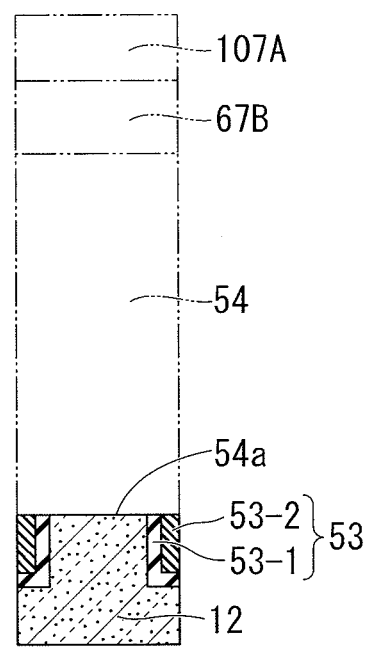
Figure 37A:
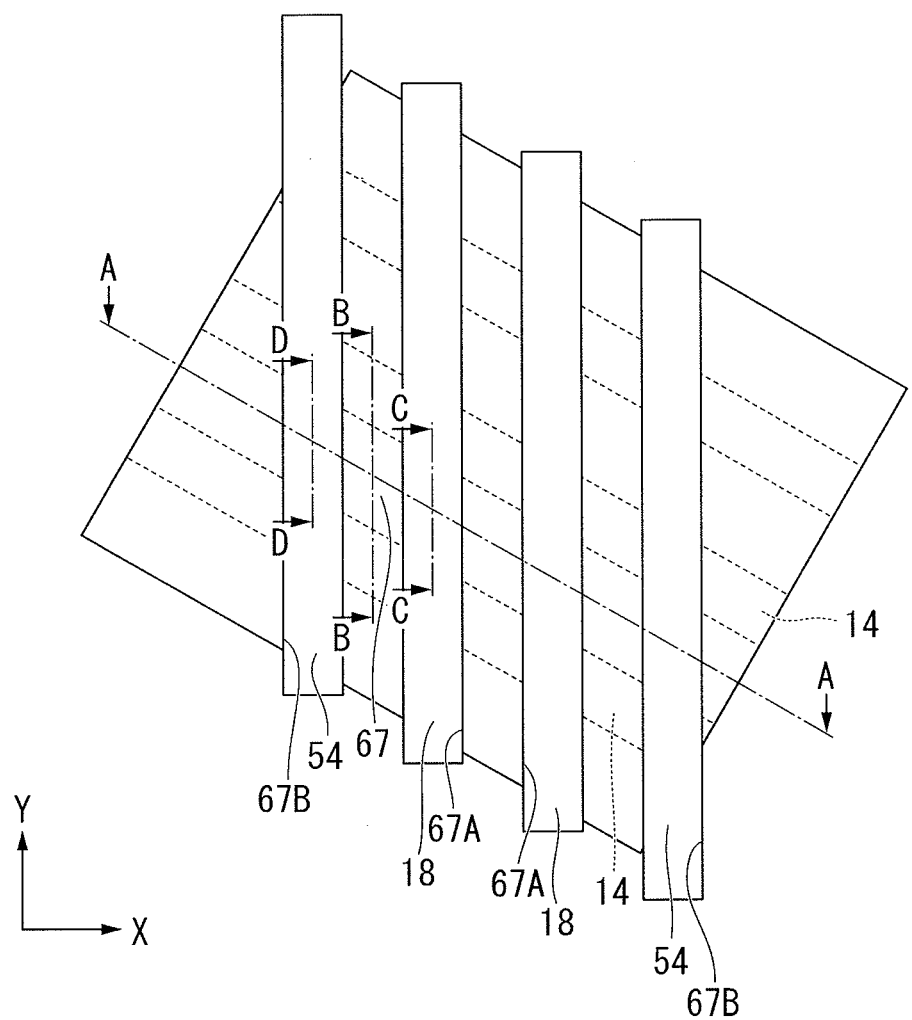
Figure 37B:
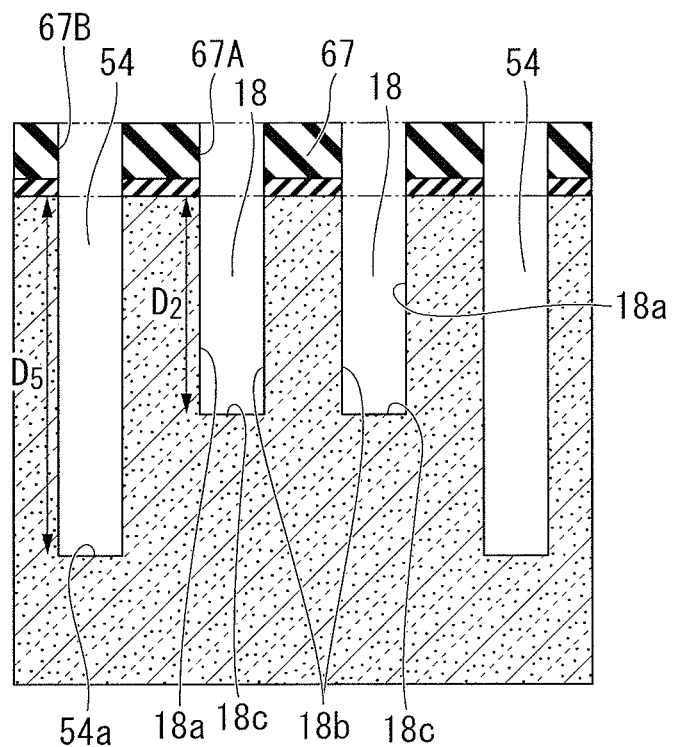
Figure 37C:
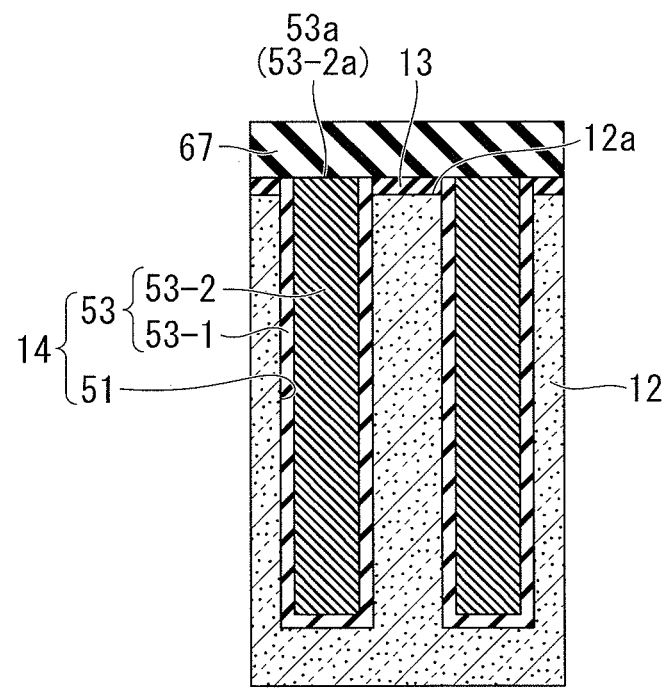
Figure 37D:
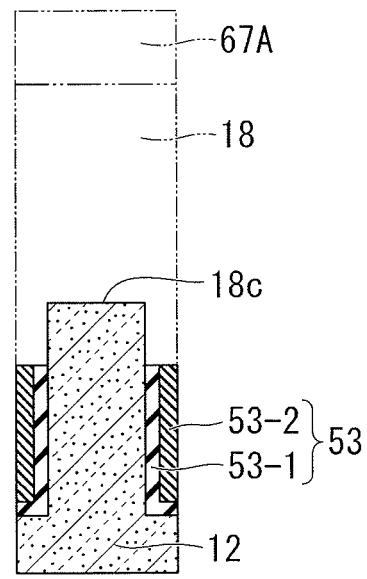
Figure 37E:
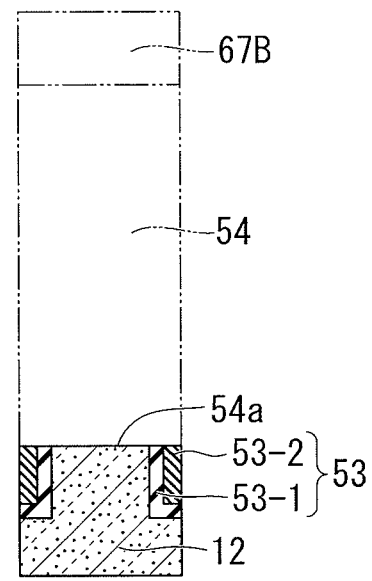

FIG. 33C is a fragmentary cross sectional elevation view, taken along a B-B line of FIG. 33A, illustrative of the same step as of FIG. 33A, involved in the method of forming the memory cell area of the semiconductor device of FIG. 32 in accordance with a third embodiment of the present invention;

FIG. 33D is a fragmentary cross sectional elevation view, taken along a C-C line of FIG. 33A, illustrative of the same step as of FIG. 33A, involved in the method of foaming the memory cell area of the semiconductor device of FIG. 32 in accordance with a third embodiment of the present invention;

FIG. 33E is a fragmentary cross sectional elevation view, taken along a D-D line of FIG. 33A, illustrative of the same step as of FIG. 33A, involved in the method of forming the memory cell area of the semiconductor device of FIG. 32 in accordance with a third embodiment of the present invention;

FIG. 34 is a fragmentary schematic plain view of a memory cell array of a semiconductor device in accordance with a fourth embodiment of the present invention;

FIG. 35A is a fragmentary schematic plain view of a step involved in a method of forming the memory cell area of the semiconductor device of FIG. 34 in accordance with a fourth embodiment of the present invention;

FIG. 35B is a fragmentary cross sectional elevation view, taken along an A-A line of FIG. 35A, illustrative of the same step as of FIG. 35A, involved in the method of forming the memory cell area of the semiconductor device of FIG. 34 in accordance with a fourth embodiment of the present invention;

FIG. 35C is a fragmentary cross sectional elevation view, taken along a B-B line of FIG. 35A, illustrative of the same step as of FIG. 35A, involved in the method of forming the memory cell area of the semiconductor device of FIG. 34 in accordance with a fourth embodiment of the present invention;

FIG. 35D is a fragmentary cross sectional elevation view, taken along a C-C line of FIG. 35A, illustrative of the same step as of FIG. 35A, involved in the method of forming the memory cell area of the semiconductor device of FIG. 34 in accordance with a fourth embodiment of the present invention;

FIG. 35E is a fragmentary cross sectional elevation view, taken along a D-D line of FIG. 35A, illustrative of the same step as of FIG. 35A, involved in the method of forming the memory cell area of the semiconductor device of FIG. 34 in accordance with a fourth embodiment of the present invention;

FIG. 36A is a fragmentary schematic plain view of a step, subsequent to the step of FIGS. 35A through 35E, involved in a method of forming the memory cell area of the semiconductor device of FIG. 28 in accordance with a fourth embodiment of the present invention;

FIG. 36B is a fragmentary cross sectional elevation view, taken along an A-A line of FIG. 36A, illustrative of the same step as of FIG. 36A, subsequent to the step of FIGS. 35A through 35E, involved in the method of forming the memory cell area of the semiconductor device of FIG. 28 in accordance with a fourth embodiment of the present invention;

FIG. 36C is a fragmentary cross sectional elevation view, taken along a B-B line of FIG. 36A, illustrative of the same step as of FIG. 36A, subsequent to the step of FIGS. 35A through 35E, involved in the method of forming the memory cell area of the semiconductor device of FIG. 28 in accordance with a fourth embodiment of the present invention;

FIG. 36D is a fragmentary cross sectional elevation view, taken along a C-C line of FIG. 36A, illustrative of the same step as of FIG. 36A, subsequent to the step of FIGS. 35A through 35E, involved in the method of forming the memory cell area of the semiconductor device of FIG. 28 in accordance with a fourth embodiment of the present invention;

FIG. 36E is a fragmentary cross sectional elevation view, taken along a D-D line of FIG. 36A, illustrative of the same step as of FIG. 36A, subsequent to the step of FIGS. 35A through 35E, involved in the method of forming the memory cell area of the semiconductor device of FIG. 28 in accordance with a fourth embodiment of the present invention;

FIG. 37A is a fragmentary schematic plain view of a step, subsequent to the step of FIGS. 36A through 36E, involved in a method of forming the memory cell area of the semiconductor device of FIG. 28 in accordance with a fourth embodiment of the present invention;

FIG. 37B is a fragmentary cross sectional elevation view, taken along an A-A line of FIG. 37A, illustrative of the same step as of FIG. 37A, subsequent to the step of FIGS. 36A through 36E, involved in the method of forming the memory cell area of the semiconductor device of FIG. 28 in accordance with a fourth embodiment of the present invention;

FIG. 37C is a fragmentary cross sectional elevation view, taken along a B-B line of FIG. 37A, illustrative of the same step as of FIG. 37A, subsequent to the step of FIGS. 36A through 36E, involved in the method of forming the memory cell area of the semiconductor device of FIG. 28 in accordance with a fourth embodiment of the present invention;

FIG. 37D is a fragmentary cross sectional elevation view, taken along a C-C line of FIG. 37A, illustrative of the same step as of FIG. 37A, subsequent to the step of FIGS. 36A through 36E, involved in the method of forming the memory cell area of the semiconductor device of FIG. 28 in accordance with a fourth embodiment of the present invention; and FIG. 37E is a fragmentary cross sectional elevation view, taken along a D-D line of FIG. 37A, illustrative of the same step as of FIG. 37A, subsequent to the step of FIGS. 36A through 36E, involved in the method of forming the memory cell area of the semiconductor device of FIG. 28 in accordance with a fourth embodiment of the present invention.

DETAILED DESCRIPTION OF THE PREFERRED EMBODIMENTS

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, the following elements. A semiconductor substrate has first and second isolation grooves. The first isolation grooves extend in a first direction. The first isolation grooves define a first active region. The second isolation groove extends in a second direction different from the first direction. The second isolation groove extends to divide the first isolation groove into divided groove portions. The second isolation groove extends to divide the active region into device formation regions. The device formation region is defined by the first and second isolation grooves. The device formation region has a first gate groove extending in the second direction. A first isolation insulating film is disposed in the first isolation groove. A second isolation insulating film is disposed in the second isolation groove. A first gate insulating film is disposed in a lower portion of the first gate groove. A first gate electrode is disposed on the first gate insulating film. The first gate electrode is in the lower portion of the first gate groove. The first buried insulating film is disposed over the first gate electrode. The first buried insulating film is disposed in an upper portion of the first gate groove. A first diffusion region is disposed in the device formation region. The first diffusion region is disposed in a first side of the first gate groove. A second diffusion region is disposed in the device formation region. The second diffusion region is disposed in a second side of the first gate groove, opposite to the first side.

In some cases, the device formation region has a second gate groove extending in the second direction. The first diffusion region is disposed between the first and second gate grooves.

In some cases, the semiconductor device may include, but is not limited to, the following elements. A second gate insulating film is disposed in a lower portion of the second gate groove. A second gate electrode is disposed on the second gate insulating film. The second gate electrode is disposed in the lower portion of the second gate groove. A second buried insulating film is disposed over the second gate electrode. The second buried insulating film is disposed in an upper portion of the second gate groove. A third diffusion region is disposed in the device formation region. The third diffusion region is disposed in an opposite side to the first diffusion region with reference to the second gate groove.

In some cases, the first and second gate grooves have substantially the same depth as the second isolation groove.

In some cases, the first gate groove has substantially the same depth as the second isolation groove.

In some cases, the semiconductor device may include, but is not limited to, the following element. A fourth diffusion region is disposed in the semiconductor substrate. The fourth diffusion region is disposed under the second isolation region. The fourth diffusion region is higher in impurity concentration than the semiconductor substrate.

In some cases, the semiconductor device may include, but is not limited to, the following element. A fifth diffusion region is disposed in the semiconductor substrate. The fifth diffusion region is disposed under the first gate groove. The fifth diffusion region is higher in impurity concentration than the semiconductor substrate.

In some cases, the first gate groove has a shallower depth than the second isolation groove.

In some cases, the first and second gate grooves have a shallower depth than the second isolation groove.

In some cases, the first isolation insulating film may include, but is not limited to, a first insulating layer covering inside walls of the first isolation groove; and a second insulating layer on the first insulating layer, the second insulating layer filling the first isolation groove.

In some cases, the first insulating layer may include, but is not limited to, a thermal oxidation layer.

In some cases, the second isolation insulating film may include, but is not limited to, a third insulating layer covering inside walls of the second isolation groove; and a fourth insulating layer on the third insulating layer, the fourth insulating layer filling the second isolation groove.

In some cases, the third insulating layer may include, but is not limited to, a thermal oxidation layer.

In some cases, the semiconductor device may include, but is not limited to, the following element. A bit line is electrically coupled to the first diffusion region.

In some cases, the semiconductor device may include, but is not limited to, the following element. An inter-layer insulating film is disposed over the semiconductor substrate. A contact plug is disposed in the inter-layer insulating film. The contact plug is coupled to the second diffusion region.

In some cases, the semiconductor device may include, but is not limited to, the following element. A capacitive contact pad is formed over the inter-layer insulating film, the capacitive contact pad being in contact with the contact plug; and a capacitor coupled to the capacitive contact pad.

In another embodiment, a semiconductor device may include, but is not limited to, the following elements. A semiconductor substrate has a device formation region. The device formation region is defined by first and second device isolation regions which extend in first and second directions, respectively. The device formation region has a first gate groove which extends in the second direction. A first gate insulating film is disposed in a lower portion of the first gate groove. A first gate electrode is disposed on the first gate insulating film. The first gate electrode is disposed in the lower portion of the first gate groove. A buried insulating film is disposed over the first gate electrode. The buried insulating film is disposed in an upper portion of the first gate groove.

In some cases, the semiconductor device may include, but is not limited to, the following element. First and second diffusion regions are disposed in the device formation region, the first and second diffusion regions being disposed in opposite sides of the first gate groove.

In still another embodiment, a semiconductor device may include, but is not limited to, the following elements. A semiconductor substrate has first and second isolation grooves. The first isolation grooves extend in a first direction. The first isolation grooves define active regions. The second isolation grooves extend in a second direction different from the first direction. The second isolation groove extends to divide the first isolation groove into divided groove portions. The second isolation groove extends to divide the active region into device formation regions. The device formation regions are each defined by the first and second isolation grooves. The device formation region each have first and second gate grooves extending in the second direction. First isolation insulating films are disposed in the first isolation grooves. Second isolation insulating films are disposed in the second isolation grooves. First gate insulating films are disposed in lower portions of the first gate grooves. First gate electrodes are disposed on the first gate insulating films. The first gate electrodes are disposed in the lower portions of the first gate grooves. First buried insulating films are disposed over the first gate electrodes. The first buried insulating films are disposed in upper portions of the first gate grooves. Second gate insulating films are formed in lower portions of the second gate grooves. Second gate electrodes are disposed on the second gate insulating films. The second gate electrodes are in the lower portions of the second gate grooves. Second buried insulating films are disposed over the second gate electrodes. The second buried insulating films are disposed in upper portions of the second gate grooves. The first diffusion region is disposed in the device formation region. The first diffusion region is disposed between the first and second gate grooves. A second diffusion region is disposed in the device formation region. The second diffusion region is disposed in an opposite side to the first diffusion region with reference to the first gate groove. A third diffusion region is disposed in the device formation region. The third diffusion region is disposed in an opposite side to the first diffusion region with reference to the second gate groove.

In some cases, the semiconductor device may include, but is not limited to, the following elements. A fourth diffusion region is disposed in the semiconductor substrate. The fourth diffusion region is disposed under the second isolation region. The fourth diffusion region is higher in impurity concentration than the semiconductor substrate. A fifth diffusion region is disposed in the semiconductor substrate. The fifth diffusion region is disposed under the first gate groove. The fifth diffusion region is higher in impurity concentration than the semiconductor substrate. A bit line is electrically coupled to the first diffusion region. An inter-layer insulating film is disposed over the semiconductor substrate. A contact plug is disposed in the inter-layer insulating film. The contact plug is coupled to the second diffusion region. A capacitive contact pad is disposed over the inter-layer insulating film. The capacitive contact pad is in contact with the contact plug. A capacitor is coupled to the capacitive contact pad.

In yet another embodiment, a method of forming a semiconductor device may include, but is not limited to, the following processes. First isolation grooves are formed in a semiconductor substrate. The first isolation grooves extend in a first direction. The first isolation grooves are filled with a first isolation insulating film to form first isolation regions which define active regions. Second isolation grooves are formed in the semiconductor substrate. The second isolation grooves extend in a second direction which is different from the first direction so as to divide the first isolation grooves into divided groove portions. The second isolation grooves are filled with a second isolation insulating film to form second isolation regions which define a plurality of device formation regions included in the active regions. Gate grooves are formed in the device formation regions. The gate grooves extend in the second direction. Gate insulating films are formed on inside walls of the gate grooves. Gate electrodes are formed on the gate insulating films. The gate electrodes are formed in lower portions of the gate grooves. Buried insulating films are formed to fill up the gate grooves. The buried insulating films cover upper surfaces of the gate electrodes. A first diffusion region is disposed in the device formation region. The first diffusion region is disposed in a first side of the gate groove. A second diffusion region is disposed in the device formation region. The second diffusion region is disposed in a second side of the gate groove opposite to the first side thereof.

In some cases, the semiconductor device may include, but is not limited to, the following processes. Two gate grooves are formed in the gate groove. The gate insulating films are formed on side walls of the gate grooves. The gate electrodes are formed in the gate grooves. The first diffusion regions are formed between the gate grooves and the second isolation grooves. The second diffusion region is Ruined between the two gate grooves.

In some cases, the second isolation grooves and the gate grooves are formed concurrently so that the second isolation grooves and the gate grooves have substantially the same depth.

In some cases, the first isolation insulating film is formed by carrying out a thermal oxidation method to form a first insulating layer which covers the inside wall of the first isolation grooves and then burying a first buried insulating layer to bury the first isolation grooves.

In some cases, the second isolation insulating film is formed by carrying out a thermal oxidation method to form a second insulating layer which covers the inside wall of the second isolation grooves and then burying a second buried insulating layer to bury the second isolation grooves.

In some cases, an ion-implantation is carried out to introduce an impurity of the same conductivity type as the semiconductor substrate through the second insulating layer in the second isolation groove into the semiconductor substrate under the second isolation groove, thereby forming a third diffusion layer, being higher in impurity concentration than the semiconductor substrate, under the second isolation groove before the second insulating layer is formed.

In some cases, before the second insulating layer is formed, an ion-implantation is carried out to introduce an impurity of the same conductivity type as the semiconductor substrate through the third insulating layer in the second isolation groove into the semiconductor substrate under the second isolation groove, thereby forming a third diffusion layer, being higher in impurity concentration than the semiconductor substrate, under the second isolation groove before the second insulating layer is formed, and the third insulating layer is removed after the third diffusion layer is foamed. After the third insulating layer is removed, then the second insulating layer is formed.

In some cases, before the second insulating layer and the gate insulating film are formed, an ion-implantation is carried out to introduce an impurity of the same conductivity type as the semiconductor substrate into the semiconductor substrate under the second isolation groove and under the gate groove, to form third diffusion regions under the second isolation groove and under the gate groove.

In some cases, the second isolation groove and the gate groove are formed in different processes so that the second isolation groove is deeper than the gate groove.

In some cases, the second isolation groove and the gate groove are formed in the same process using a thermal oxidation method.

In some cases, a bit line is formed over the second diffusion region, the bit line extends in a direction crossing the gate electrode, and the bit line is electrically coupled to the second diffusion region.

In some cases, an inter-layer insulating film is formed over the buried insulating film. A contact plug is formed in the buried insulating film and the inter-layer insulating film. The contact plug is in contact with the upper surface of the second diffusion region. A capacitive contact pad is formed over the inter-layer insulating film. The capacitive contact pad is in contact with an upper surface of the contact plug. A capacitor is formed on the capacitive contact pad.

First Embodiment

Figure 1:
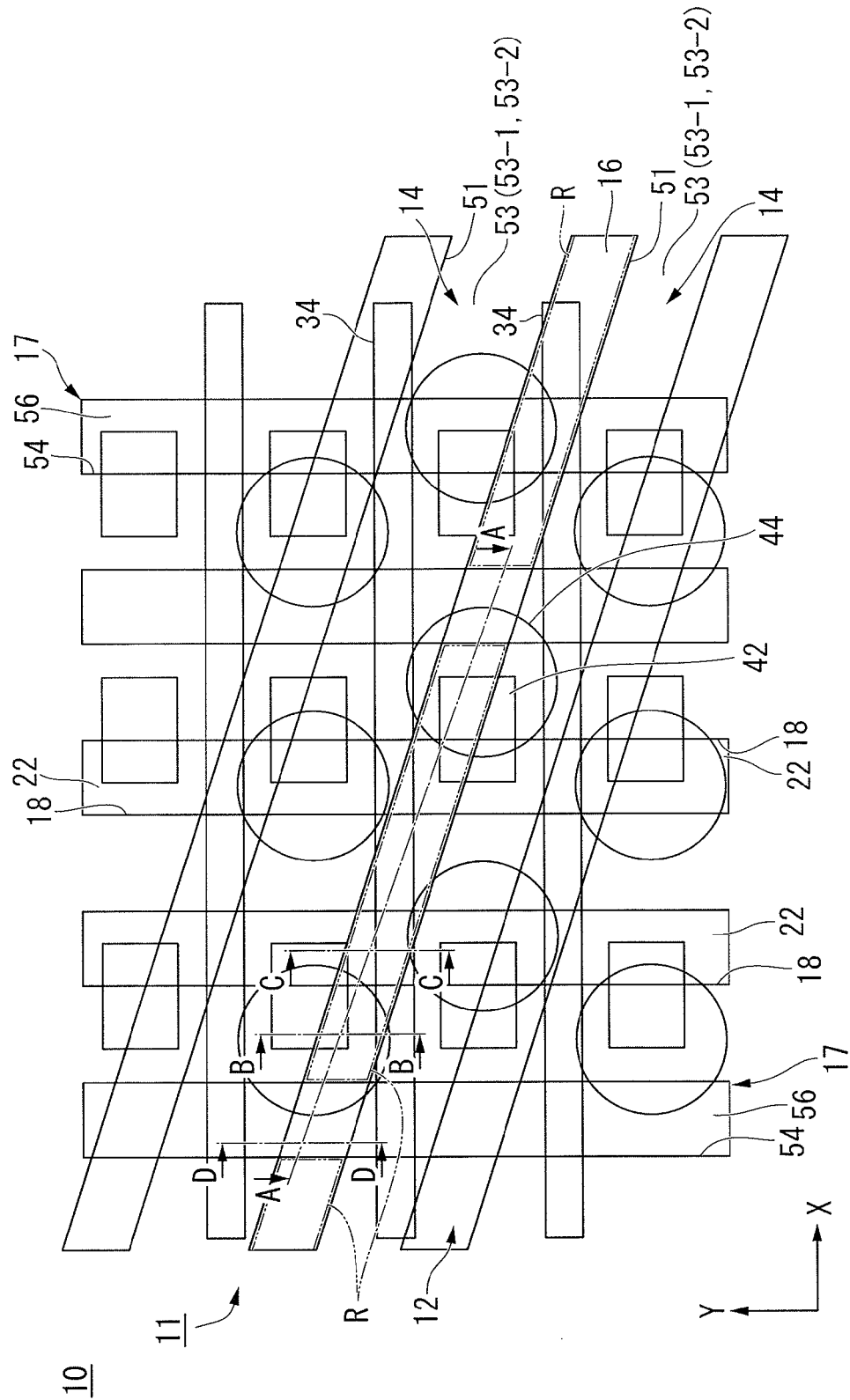
FIG. 1 is a fragmentary schematic plain view of a memory cell array of a semiconductor device in accordance with one or more embodiments of the present invention.
Figure 2:
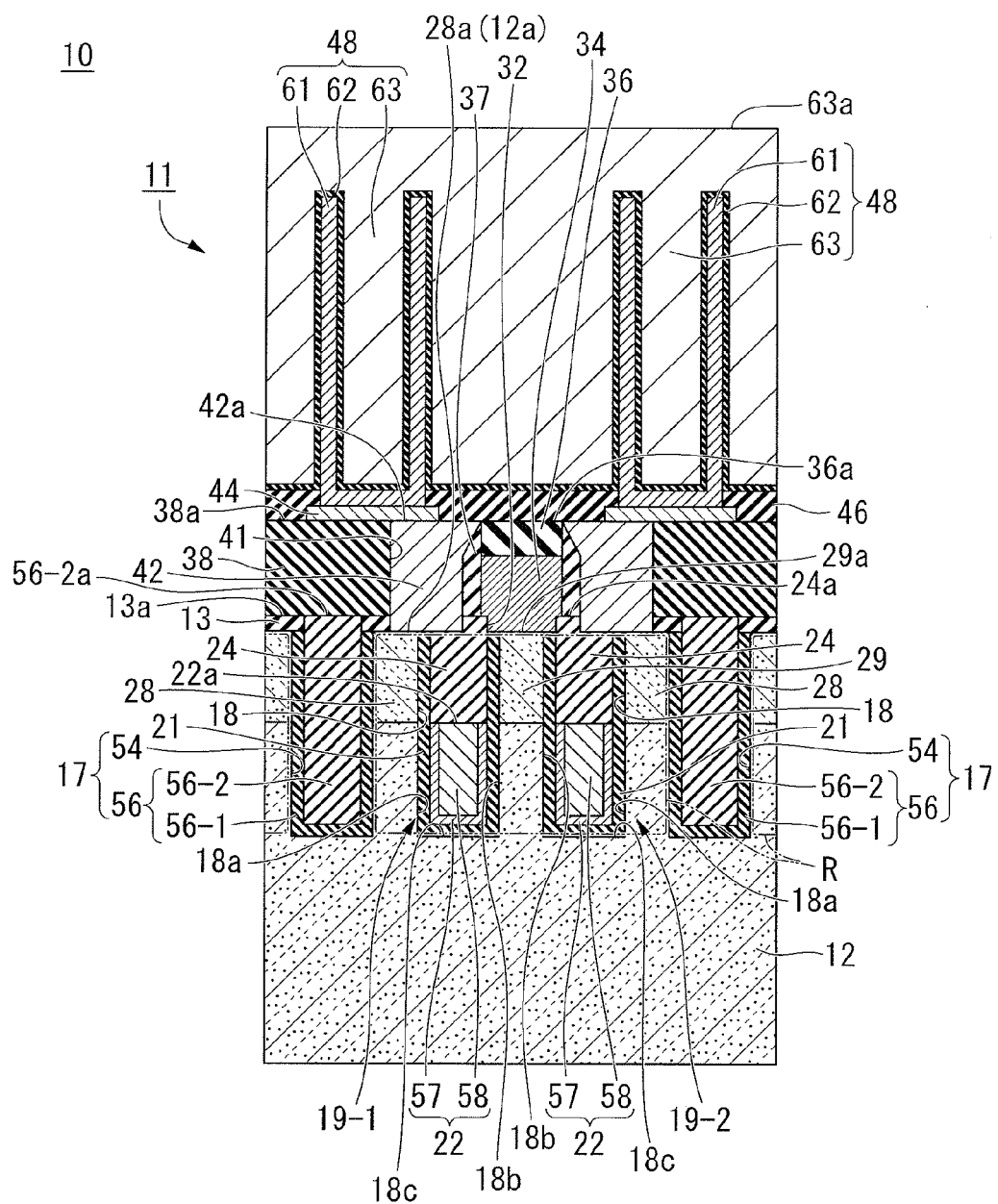
FIG. 2 is a fragmentary cross sectional elevation view, taken along an A-A line of FIG. 1, illustrative of the memory cell array of the semiconductor device in accordance with one or more embodiments of the present invention.

FIG. 1 is a schematic plan view of a memory cell array provided in a semiconductor device according to a first embodiment of the present invention, and FIG. 2 is a cross-sectional view taken along a line A-A of the memory cell array shown in FIG. 1.

In FIGS. 1 and 2, a DRAM (Dynamic Random Access Memory) is described as an example of the semiconductor device 10 of the first embodiment. Further, in FIG. 1, an example of a layout of a memory cell array of the DRAM is shown.

In FIG. 1, an X direction indicates an extending direction of a bit line 34, and a Y direction indicates an extending direction (a second direction) of a gate electrode 22 and a second element isolation region 17, which intersects the X direction.

In FIG. 1, for convenience of explanation, among components of the memory cell array 11, a semiconductor substrate 12, a first element isolation region 14, an active region 16, a second element isolation region 17, a gate electrode trench 18, a gate electrode 22, the bit line 34, a contact plug 42, a capacitive contact pad 44, and a plurality of element forming regions R are shown on the same plane, and other components of the memory cell array 11 are not shown.

In FIG. 2, in fact, the bit line 34 extending in the X direction shown in FIG. 1 is schematically shown. In FIG. 2, the same components as those of the semiconductor device 10 shown in FIG. 1 are assigned the same reference numerals.

The semiconductor device 10 of the first embodiment includes a memory cell region in which the memory cell array 11 shown in FIGS. 1 and 2 is formed, and a peripheral circuit region (a region in which a peripheral circuit is formed; not shown) arranged around the memory cell region.

Referring to FIGS. 1 and 2, the memory cell array 11 provided in the semiconductor device 10 of the first embodiment includes a semiconductor substrate 12, a pad oxide film 13, the first element isolation region 14, an active region 16 having a plurality of element forming regions R, the second element isolation region 17, the gate electrode trench 18, transistors 19-1 and 19-2, a gate insulating film 21, the gate electrode 22 that is a buried gate electrode, a buried insulating film 24, a first impurity diffusion region 28, a second impurity diffusion region 29, an opening 32, the bit line 34, a cap insulating film 36, a sidewall film 37, an interlayer insulating film 38, a contact hole 41, a contact plug 42, a capacitive contact pad 44, a silicon nitride film 46, and a capacitor 48.

Referring to FIGS. 1 and 2, the semiconductor substrate 12 is a plate-shaped substrate. As the semiconductor substrate 12, for example, a p-type silicon substrate may be used. In this case, a p-type impurity concentration of the semiconductor substrate 12 may be, for example, $1E14$ $cm^{-3}$ to $1E15$ $cm^{-3}$. Hereinafter, a case in which the p-type silicon substrate is used as the semiconductor substrate 12 will be described by way of example.

Referring to FIG. 2, the pad oxide film 13 is provided to cover an upper surface 28a of the first impurity diffusion region 28. A thickness of the pad oxide film 13 may be, for example, 5 nm.

Referring to FIG. 1, the first element isolation region 14 includes a first element isolation trench 51 and a first element isolation insulating film 53.

The first element isolation trench 51 is formed in the semiconductor substrate 12 to extend in a direction (a first direction) tilted at a given angle with respect to the X direction shown in FIG. 1. A plurality of first element isolation trenches 51 are formed at given intervals with respect to the Y direction shown in FIG. 1. A depth of the first element isolation trench 51 may be, for example, 250 nm.

The first element isolation insulating film 53 includes a first insulating film 53-1 and a first buried insulating film 53-2 (see FIG. 5C that will be described later). The first insulating film 53-1 is provided to cover an inner surface of the first element isolation trench 51 (see FIG. 5C). The first insulating film 53-1 is a thermal oxide film (silicon oxide film ($SiO_2$ film)) formed using a thermal oxidation method, and a thickness thereof may be, for example, 5 nm.

The first buried insulating film 53-2 is arranged to bury the first element isolation trench 51 through the first insulating film 53-1. Although not shown, an upper surface of the first element isolation insulating film 53 is coplanar with an upper surface 13a of the pad insulating film 13 (see FIG. 5C). For example, a silicon oxide film ($SiO_2$ film) may be used as the first element isolation insulating film 53.

The first formed element isolation region 14 extends in a band shape in the first direction and partitions the active region 16 having the plurality of element forming regions R.

Referring to FIGS. 1 and 2, the second element isolation region 17 includes a second element isolation trench 54 and a second element isolation insulating film 56. The second element isolation trench 54 is formed in the semiconductor substrate 12 to extend in the Y direction (a second direction) shown in FIG. 1.

Accordingly, the second element isolation trench 54 partitions a part of the first element isolation region 14. The second element isolation trench 54 is formed to be sandwiched between two gate electrodes 22 arranged to be adjacent to each other. A depth of the second element isolation trench 54 is substantially the same as that of the gate electrode trench 18. The depth of the second element isolation trench 54 may be, for example, 150 nm.

The second element isolation insulating film 56 includes a second insulating film 56-1 and a second buried insulating film 56-2. The second insulating film 56-1 is provided to cover an inner surface of the second element isolation trench 54. The second insulating film 56-1 is a thermal oxide film (silicon oxide film ($SiO_2$ film)) formed using a thermal oxidation method, and a thickness thereof may be, for example, 5 nm.

The second insulating film 56-1 is a film formed together with the gate insulating film 21 when the gate insulating film 21 is formed. That is, the second insulating film 56-1 has the same configuration (specifically, the same film type and thickness) as the gate insulating film 21.

The second buried insulating film 56-2 is arranged to bury the second element isolation trench 54 through the second insulating film 56-1. An upper end of the second buried insulating film 56-2 slightly protrudes, and an outer peripheral side surface of the protruding part is covered by the pad oxide film 13.

An upper surface 56-2a of the second buried insulating film 56-2 is flush with an upper surface 13a of the pad oxide film 13.

The second buried insulating film 56-2 is a film simultaneously formed with the buried insulating film 24 when the buried insulating film 24 is formed. A silicon oxide film ($SiO_2$ film) may be used as the second buried insulating film 56-2.

The second formed element isolation region 17 partitions the active region 16 into the plurality of element forming regions R (see FIG. 1).

Thus, the first element isolation region 14 formed by burying the first insulating film 53-1 and the first buried insulating film 53-2 in the first element isolation trench 51 formed in the semiconductor substrate 12, and the second element isolation region 17 formed by burying the second insulating film 56-1 and the second buried insulating film 56-2 in the second element isolation trench 54 formed in the semiconductor substrate 12 are provided to thereby partition the active region 16 into the plurality of element forming regions R. Accordingly, since the transistors 19-1 and 19-2 can be easily turned on and junction leak current can be suppressed in comparison with a case in which a dummy gate electrode (not shown) to which a reverse bias is applied through the gate insulating film 21 is provided in the second element isolation trench 54 to thereby partition the plurality of element forming regions R, a data retention characteristic of the semiconductor device 10 can be improved.

Further, since it is unnecessary to provide a wiring (not shown) for applying a reverse bias to a dummy gate electrode (not shown), which is required when the dummy gate electrode is provided, it is possible to achieve miniaturization of the semiconductor device 10.

Referring to FIGS. 1 and 2, the two gate electrode trenches 18 are provided to extend in the Y direction in the element forming region R located between the two second element isolation regions 17. The gate electrode trench 18 is partitioned by inner surfaces consisting of a bottom 18c and first and second opposing side surfaces 18a and 18b. The two gate electrode trenches 18 are arranged so that the second side surfaces 18b face each other.

A depth of the gate electrode trench 18 is smaller than that of the first element isolation trench 51 and is substantially the same as that of the second element isolation trench 54. If the depth of the second element isolation trench 54 is 150 nm, the depth of the gate electrode trench 18 may be, for example, 150 nm.

Referring to FIG. 2, the transistors 19-1 and 19-2 are trench gate transistors, each including a gate insulating film 21, a gate electrode 22, a buried insulating film 24, a first impurity diffusion region 28, and a second impurity diffusion region 29.

As shown in FIG. 2, the transistors 19-1 and 19-2 are arranged to be adjacent to each other. The second impurity diffusion region 29 functions as a common impurity diffusion region (a drain region in the structure shown in FIG. 2) of the transistors 19-1 and 19-2.

Referring to FIG. 2, the gate insulating film 21 is provided to cover the first and second side surfaces 18a and 18b of the gate electrode trench 18 and the bottom 18c of the gate electrode trench 18. For example, a silicon oxide film ($SiO_2$ film) of a single layer, a film (SiON film) formed by nitriding a silicon oxide film, a stacked silicon oxide film ($SiO_2$ film), a stacked film formed by stacking a silicon nitride film (SiN film) on a silicon oxide film ($SiO_2$ film), or the like may be used as the gate insulating film 21.

If the silicon oxide film ($SiO_2$ film) of the single layer is used as the gate insulating film 21, a thickness of the gate insulating film 21 may be, for example, 5 nm.

Referring to FIG. 2, the gate electrode 22 is arranged to bury a lower portion of the gate electrode trench 18 through the gate insulating film 21. Accordingly, an upper surface 22a of the gate electrode 22 is arranged in a position lower than a main surface 12a of the semiconductor substrate 12. The gate electrode 22 is formed by sequentially stacking a first conductive film 57 and a second conductive film 58. A titanium nitride film may be used as the first conductive film 57. In this case, a tungsten film may be used as the second conductive film 58.

Referring to FIG. 2, the buried insulating film 24 is provided to bury the gate electrode trench 18 in which the gate insulating film 21 and the gate electrode 22 are formed. Accordingly, the upper surface 22a of the gate electrode 22 is covered with the buried insulating film 24.

Further, an upper end of the buried insulating film 24 slightly protrudes from the main surface 12a of the semiconductor substrate 12. The upper surface 24a of the buried insulating film 24 is flush with the upper surface 13a of the pad oxide film 13. The silicon oxide film ($SiO_2$ film) may be used as the buried insulating film 24.

Referring to FIG. 2, the first impurity diffusion region 28 is provided in the element forming region R (specifically, semiconductor substrate 12) located at a side of the first side surface 18a of the gate electrode trench 18. Specifically, the first impurity diffusion region 28 is formed in the element forming region R located between the gate electrode trench 18 and the second element isolation trench 54. The upper surface 28a of the first impurity diffusion region 28 is substantially flush with the main surface 12a of the semiconductor substrate 12.

The first impurity diffusion region 28 is provided for each gate electrode 22 forming the transistors 19-1 and 19-2. The first impurity diffusion region 28 is an impurity diffusion region functioning as a source/drain region (a source region in the structure shown in FIG. 2) of the transistors 19-1 and 19-2. If the semiconductor substrate 12 is a p-type silicon substrate, the first impurity diffusion region 28 is formed by ion-implanting n-type impurities into the semiconductor substrate 12.

Referring to FIG. 2, the second impurity diffusion region 29 is provided in the element forming region R arranged between the two gate electrode trenches 18.

The second impurity diffusion region 29 is an impurity diffusion region functioning as a source/drain region (a drain region in the structure shown in FIG. 2) that is common to the transistors 19-1 and 19-2. If the semiconductor substrate 12 is a p-type silicon substrate, the second impurity diffusion region 29 is formed by ion-implanting n-type impurities into the semiconductor substrate 12.

Referring to FIG. 2, the opening 32 is formed between the buried insulating films 24 protruding from the two gate electrode trenches 18. The opening 32 is formed to expose the upper surface 29a of the second impurity diffusion region 29.

Referring to FIG. 2, the bit line 34 is provided on the upper surface 24a of the buried insulating film 24, and a lower end thereof contacts the upper surface 29a of the second impurity diffusion region 29. Accordingly, the bit line 34 is electrically connected with the second impurity diffusion region 29.

A stacked film formed by sequentially stacking a polysilicon film, a titanium nitride film and a tungsten film, a polysilicon film, a titanium nitride film, or the like may be used as a material of the bit line 34.

Referring to FIG. 2, the cap insulating film 36 is provided to cover an upper surface of the bit line 34. The cap insulating film 36 protects the upper surface of the bit line 34 and functions as an etching mask when a base material (conductive film) that becomes the bit line 34 is patterned by anisotropic etching (specifically, dry etching). A stacked film formed by sequentially stacking a silicon nitride film (SiN film) and a silicon oxide film ($SiO_2$ film) may be used as the cap insulating film 36.

Referring to FIG. 2, the sidewall film 37 is provided to cover a side surface of the bit line 34. The sidewall film 37 has a function of protecting a sidewall of the bit line 34. A stacked film formed by sequentially stacking a silicon nitride film (SiN film) and a silicon oxide film ($SiO_2$ film) may be used as the sidewall film 37.

Referring to FIG. 2, the interlayer insulating film 38 is provided on the upper surface 13a of the pad insulating film 13 and the upper surface 56-2a of the second buried insulating film 56-2.

An upper surface 38a of the interlayer insulating film 38 is flush with the upper surface 36a of the cap insulating film 36. For example, a silicon oxide film ($SiO_2$ film) formed using CVD (Chemical Vapor Deposition) or a coated insulating film (silicon oxide film ($SiO_2$ film)) formed using SOG (Spin on Grass) may be used as the interlayer insulating film 38.

Referring to FIG. 2, the contact hole 41 is formed in the pad insulating film 13, the buried insulating film 24, and the interlayer insulating film 38 to expose a part of the upper surface 28a of the first impurity diffusion region 28.

Referring to FIG. 2, the contact plug 42 is provided to bury the contact hole 41. A lower end of the contact plug 42 contacts a part of the upper surface 28a of the first impurity diffusion region 28.

Accordingly, the contact plug 42 is electrically connected with the first impurity diffusion region 28. An upper surface 42a of the contact plug 42 is flush with the upper surface 38a of the interlayer insulating film 38. The contact plug 42, for example, may be a stacked structure formed by sequentially stacking a titanium nitride film and a tungsten film.

Referring to FIG. 2, the capacitive contact pad 44 is provided on the upper surface 38a of the interlayer insulating film 38 so that a part of the capacitive contact pad 44 contacts the upper surface 42a of the contact plug 42. A lower electrode 61 forming a capacitor 48 is connected to the capacitive contact pad 44.

Accordingly, the capacitive contact pad 44 electrically connects the contact plug 42 with the lower electrode 61.

Referring to FIG. 1, the capacitive contact pad 44 is circular and arranged in a position different from the contact plug 42 in the Y direction. The capacitive contact pads 44 are arranged between the adjacent bit lines 34 in the X direction.

That is, the capacitive contact pads 44 are repeatedly arranged in a staggered arrangement, in which a center portion of the capacitive contact pad 44 is arranged on the gate electrode 22 or upward from the side surface of the gate electrode 22 at one interval in the Y direction. In other words, the capacitive contact pads 44 are arranged in a flock formation in the Y direction.

Referring to FIG. 2, the silicon nitride film 46 is provided on the upper surface 38a of the interlayer insulating film 38 to surround an outer peripheral portion of the capacitive contact pad 44.

One capacitor 48 is provided for each capacitive contact pad 44.

Each capacitor 48 includes a lower electrode 61, a capacitive insulating film 62 that is common to a plurality of lower electrodes 61, and an upper electrode 63 that is common to the plurality of lower electrodes 61.

The lower electrode 61 is provided on the capacitive contact pad 44 and connected with the capacitive contact pad 44. The lower electrode 61 is crown-shaped.

The capacitive insulating film 62 is provided to cover surfaces of the plurality of lower electrodes 61 exposed from the silicon nitride film 46 and the upper surface of the silicon nitride film 46.

The upper electrode 63 is provided to cover a surface of the capacitive insulating film 62. The upper electrode 63 is arranged to bury the inside of the lower electrode 61 in which the capacitive insulating film 62 is formed and spaces between the plurality of lower electrodes 61. An upper surface 63a of the upper electrode 63 is arranged upward from upper ends of the plurality of lower electrodes 61.

The formed capacitor 48 is electrically connected with the first impurity diffusion region 28 via the capacitive contact pad 44.

Further, an interlayer insulating film (not shown) covering the upper surface 63a of the upper electrode 63, a contact plug (not shown) provided in the interlayer insulating film, a wiring (not shown) connected with the contact plug, and the like may be provided.

According to the semiconductor device of the first embodiment, the first element isolation region 14 formed by burying the first insulating film 53-1 and the first buried insulating film 53-2 in the first element isolation trench 51 formed in the semiconductor substrate 12, and the second element isolation region 17 formed by burying the second insulating film 56-1 and the second buried insulating film 56-2 in the second element isolation trench 54 formed in the semiconductor substrate 12 are provided to thereby partition the active region 16 into the plurality of element forming regions R. Accordingly, the transistors 19-1 and 19-2 can be easily turned on and junction leak current can be suppressed in comparison with a case in which a dummy gate electrode (not shown) to which a reverse bias is applied through the gate insulating film 21 is provided in the second element isolation trench 54 to partition a plurality of element forming regions R. Thus, it is possible to improve a data retention characteristic of the semiconductor device 10.

Further, since it is unnecessary to provide a wiring (not shown) for applying a reverse bias to a dummy gate electrode (not shown), which is required when the dummy gate electrode is provided, it is possible to achieve miniaturization of the semiconductor device 10.

FIGS. 3A through 3E, FIGS. 4A through 4E, FIGS. 5A through 5E, FIGS. 6A through 6E, FIGS. 7A through 7E, FIGS. 8A through 8E, FIGS. 9A through 9E, FIGS. 10A through 10E, FIGS. 11A through 11E, FIGS. 12A through 12E, FIGS. 13A through 13E, FIGS. 14A through 14E, FIGS. 15A through 15E, FIGS. 16A through 16E, FIGS. 17A through 17E, FIG. 18, FIG. 19, FIG. 20, and FIG. 21 are diagrams showing a process of fabricating the memory cell array provided in the semiconductor device according to the first embodiment of the present invention.

Figure 3A:
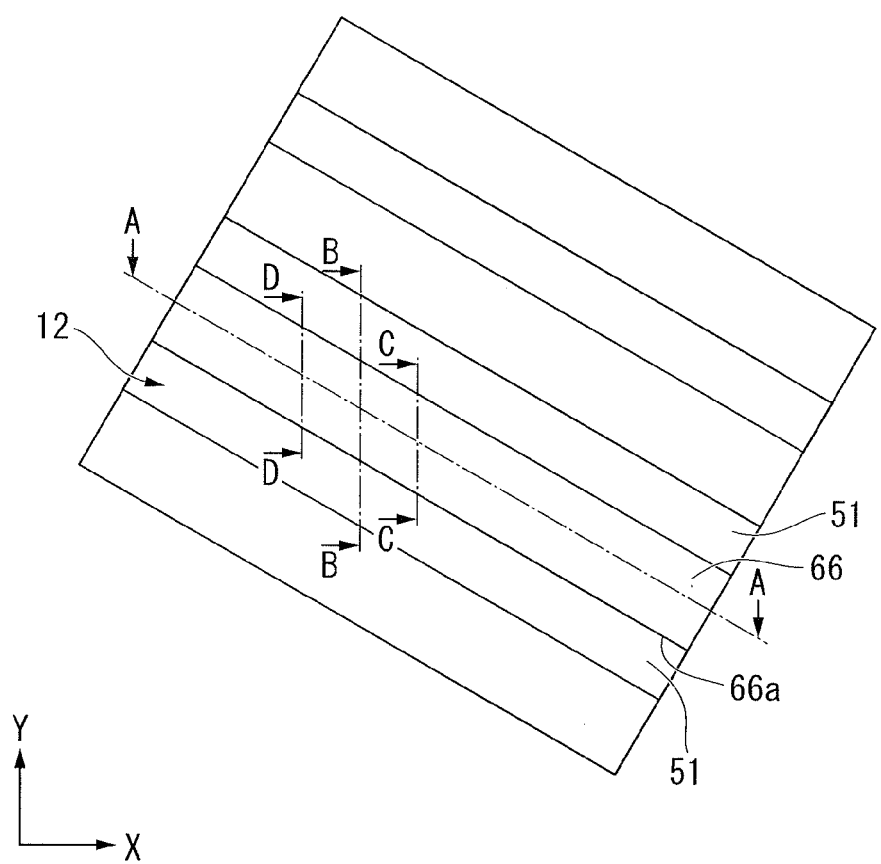
FIG. 3A is a fragmentary schematic plain view of a step involved in a method of forming the memory cell area of the semiconductor device of FIGS. 1 and 2 in accordance with one or more embodiments of the present invention.
Figure 3B:
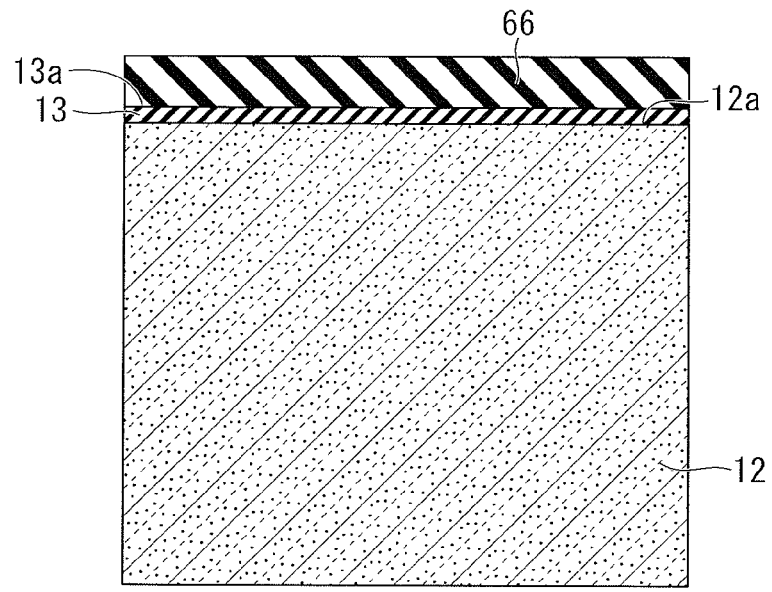
FIG. 3B is a fragmentary cross sectional elevation view, taken along an A-A line of FIG. 3A, illustrative of the same step as of FIG. 3A, involved in the method of forming the memory cell area of the semiconductor device of FIGS. 1 and 2 in accordance with one or more embodiments of the present invention.
Figure 3C:
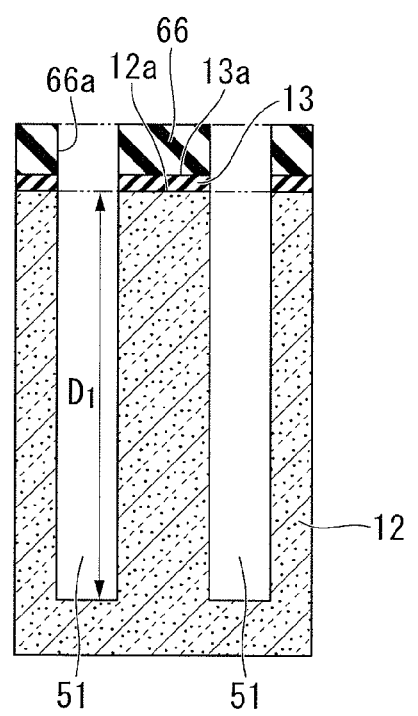
FIG. 3C is a fragmentary cross sectional elevation view, taken along a B-B line of FIG. 3A, illustrative of the same step as of FIG. 3A, involved in the method of forming the memory cell area of the semiconductor device of FIGS. 1 and 2 in accordance with one or more embodiments of the present invention.
Figure 3D:
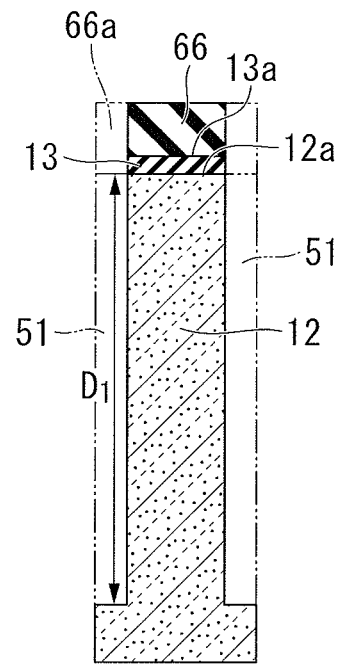
FIG. 3D is a fragmentary cross sectional elevation view, taken along a C-C line of FIG. 3A, illustrative of the same step as of FIG. 3A, involved in the method of forming the memory cell area of the semiconductor device of FIGS. 1 and 2 in accordance with one or more embodiments of the present invention.
Figure 3E:
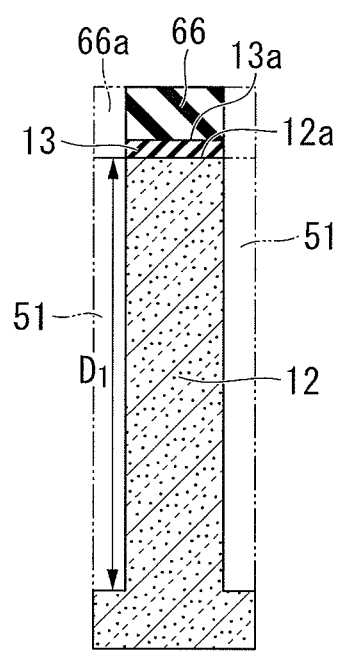
FIG. 3E is a fragmentary cross sectional elevation view, taken along a D-D line of FIG. 3A, illustrative of the same step as of FIG. 3A, involved in the method of forming the memory cell area of the semiconductor device of FIGS. 1 and 2 in accordance with one or more embodiments of the present invention.

FIG. 3A is a plan view of a region in which the memory cell array is formed, FIG. 3B is a cross-sectional view taken along a line A-A of a structure shown in FIG. 3A, FIG. 3C is a cross-sectional view taken along a line B-B of the structure shown in FIG. 3A, FIG. 3D is a cross-sectional view taken along a line C-C of the structure shown in FIG. 3A, and FIG. 3E is a cross-sectional view taken along a line D-D of the structure shown in FIG. 3A.

Figure 4A:
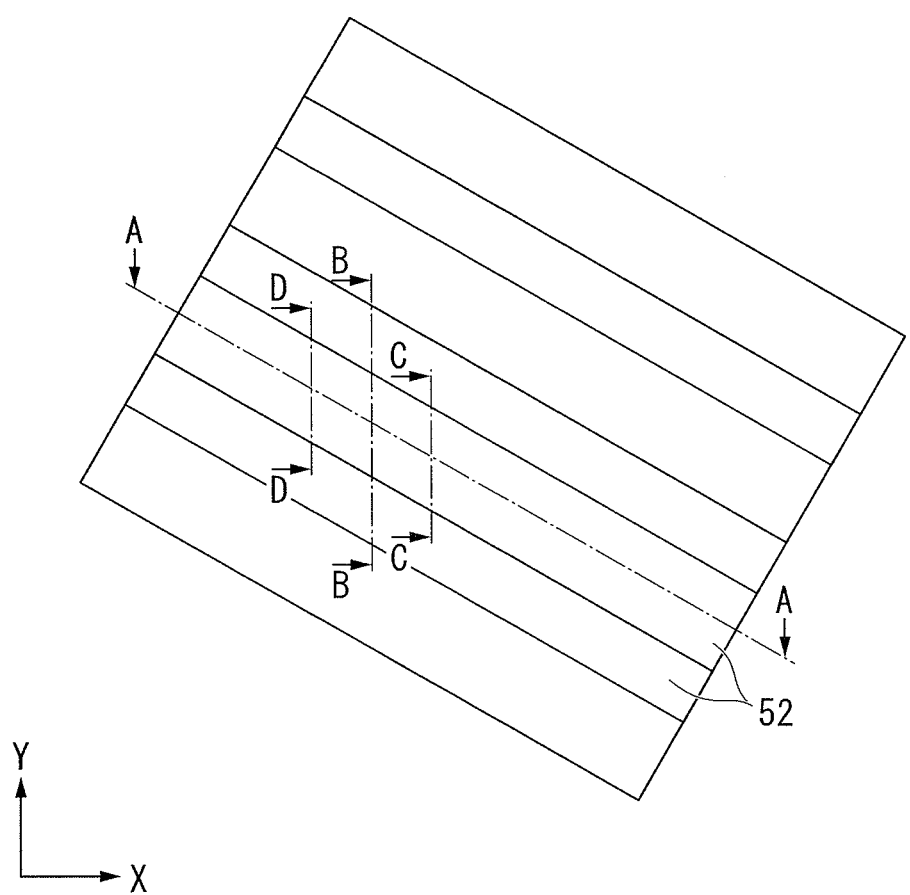
FIG. 4A is a fragmentary schematic plain view of a step, subsequent to the step of FIGS. 3A through 3E, involved in a method of forming the memory cell area of the semiconductor device of FIGS. 1 and 2 in accordance with one or more embodiments of the present invention.
Figure 4B:
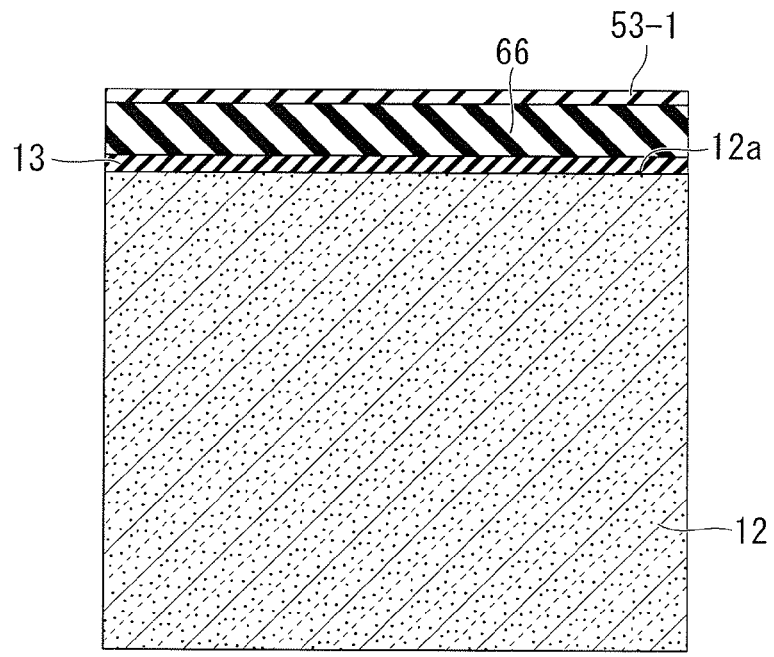
FIG. 4B is a fragmentary cross sectional elevation view, taken along an A-A line of FIG. 4A, illustrative of the same step as of FIG. 4A, subsequent to the step of FIGS. 3A through 3E, involved in the method of forming the memory cell area of the semiconductor device of FIGS. 1 and 2 in accordance with one or more embodiments of the present invention.
Figure 4C:
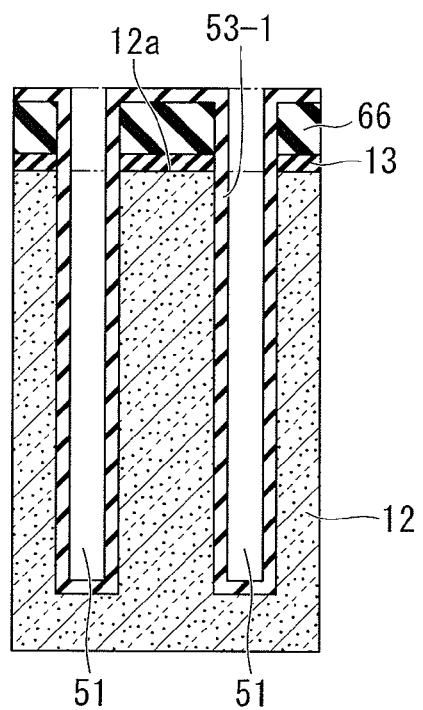
FIG. 4C is a fragmentary cross sectional elevation view, taken along a B-B line of FIG. 4A, illustrative of the same step as of FIG. 4A, subsequent to the step of FIGS. 3A through 3E, involved in the method of forming the memory cell area of the semiconductor device of FIGS. 1 and 2 in accordance with one or more embodiments of the present invention.
Figure 4D:
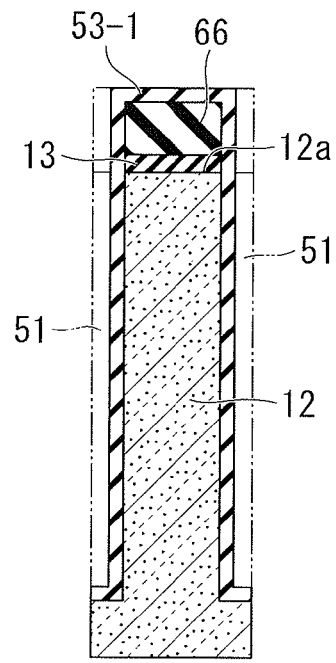
FIG. 4D is a fragmentary cross sectional elevation view, taken along a C-C line of FIG. 4A, illustrative of the same step as of FIG. 4A, subsequent to the step of FIGS. 3A through 3E, involved in the method of forming the memory cell area of the semiconductor device of FIGS. 1 and 2 in accordance with one or more embodiments of the present invention.
Figure 4E:
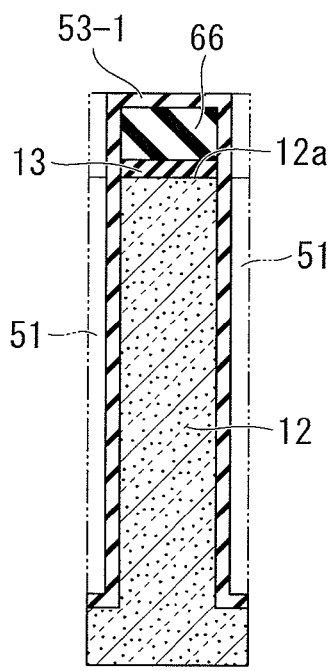
FIG. 4E is a fragmentary cross sectional elevation view, taken along an D-D line of FIG. 4A, illustrative of the same step as of FIG. 4A, subsequent to the step of FIGS. 3A through 3E, involved in the method of forming the memory cell area of the semiconductor device of FIGS. 1 and 2 in accordance with one or more embodiments of the present invention.

FIG. 4A is a plan view of a region in which the memory cell array is formed, FIG. 4B is a cross-sectional view taken along a line A-A of a structure shown in FIG. 4A, FIG. 4C is a cross-sectional view taken along a line B-B of the structure shown in FIG. 4A, FIG. 4D is a cross-sectional view taken along a line C-C of the structure shown in FIG. 4A, and FIG. 4E is a cross-sectional view taken along a line D-D of the structure shown in FIG. 4A.

Figure 5A:
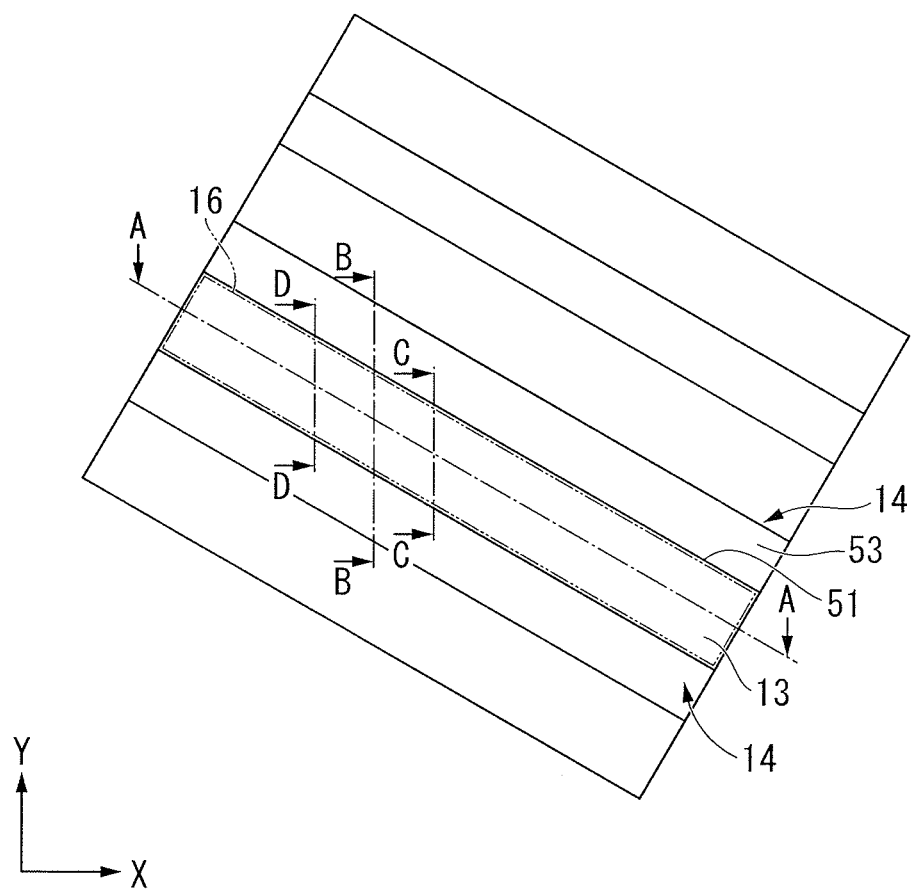
FIG. 5A is a fragmentary schematic plain view of a step, subsequent to the step of FIGS. 4A through 4E, involved in a method of forming the memory cell area of the semiconductor device of FIGS. 1 and 2 in accordance with one or more embodiments of the present invention.
Figure 5B:
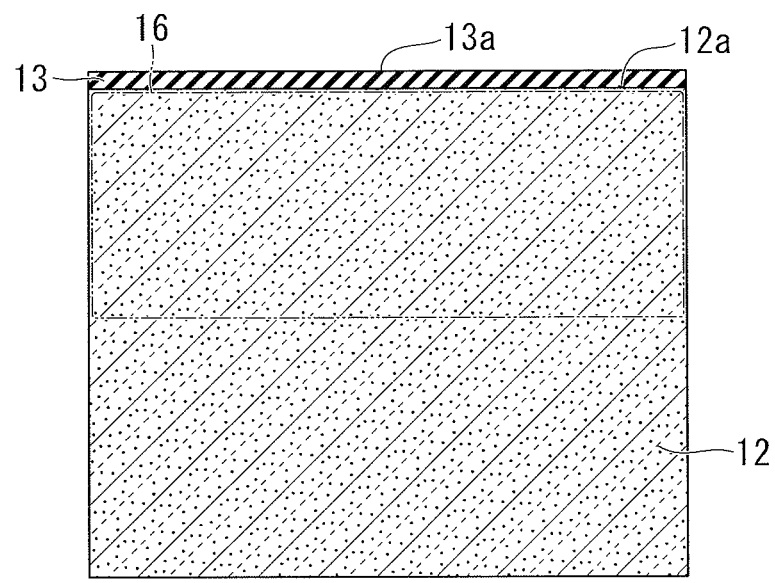
FIG. 5B is a fragmentary cross sectional elevation view, taken along an A-A line of FIG. 5A, illustrative of the same step as of FIG. 5A, subsequent to the step of FIGS. 4A through 4E, involved in the method of forming the memory cell area of the semiconductor device of FIGS. 1 and 2 in accordance with one or more embodiments of the present invention.
Figure 5C:
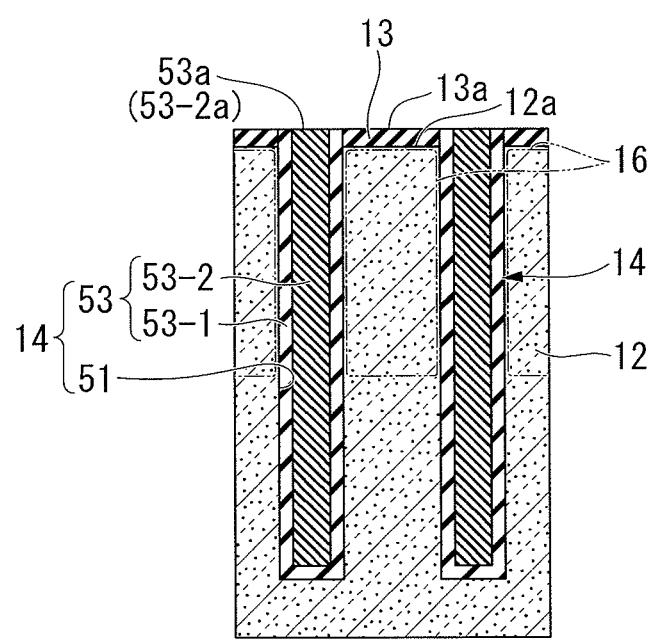
FIG. 5C is a fragmentary cross sectional elevation view, taken along a B-B line of FIG. 5A, illustrative of the same step as of FIG. 5A, subsequent to the step of FIGS. 4A through 4E, involved in the method of forming the memory cell area of the semiconductor device of FIGS. 1 and 2 in accordance with one or more embodiments of the present invention.
Figure 5D:
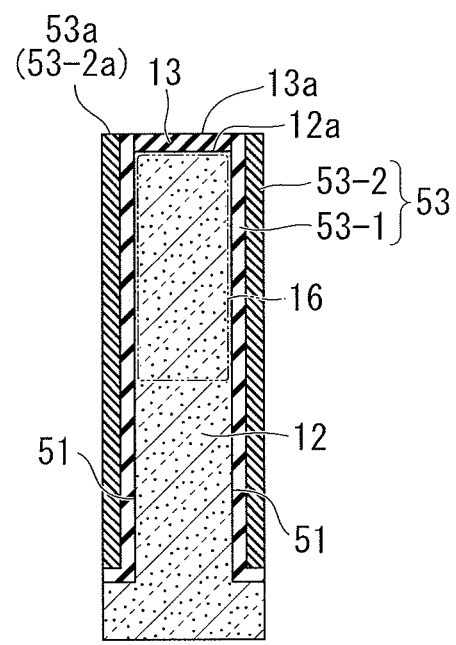
FIG. 5D is a fragmentary cross sectional elevation view, taken along a C-C line of FIG. 5A, illustrative of the same step as of FIG. 5A, subsequent to the step of FIGS. 4A through 4E, involved in the method of forming the memory cell area of the semiconductor device of FIGS. 1 and 2 in accordance with one or more embodiments of the present invention.
Figure 5E:
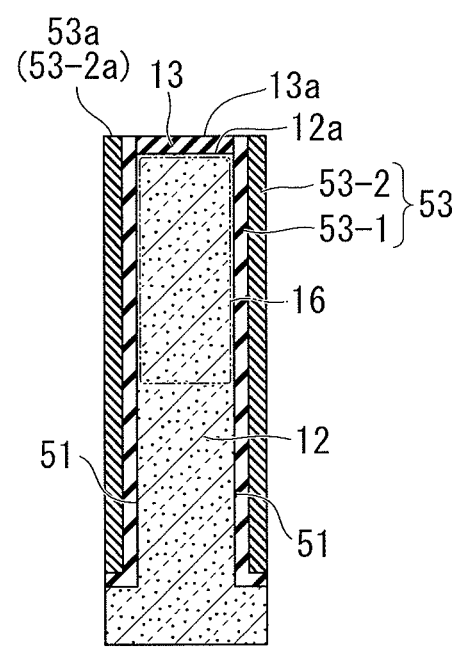
FIG. 5E is a fragmentary cross sectional elevation view, taken along a D-D line of FIG. 5A, illustrative of the same step as of FIG. 5A, subsequent to the step of FIGS. 4A through 4E, involved in the method of forming the memory cell area of the semiconductor device of FIGS. 1 and 2 in accordance with one or more embodiments of the present invention.

FIG. 5A is a plan view of a region in which the memory cell array is formed, FIG. 5B is a cross-sectional view taken along a line A-A of a structure shown in FIG. 5A, FIG. 5C is a cross-sectional view taken along a line B-B of the structure shown in FIG. 5A, FIG. 5D is a cross-sectional view taken along a line C-C of the structure shown in FIG. 5A, and FIG. 5E is a cross-sectional view taken along a line D-D of the structure shown in FIG. 5A.

Figure 6A:
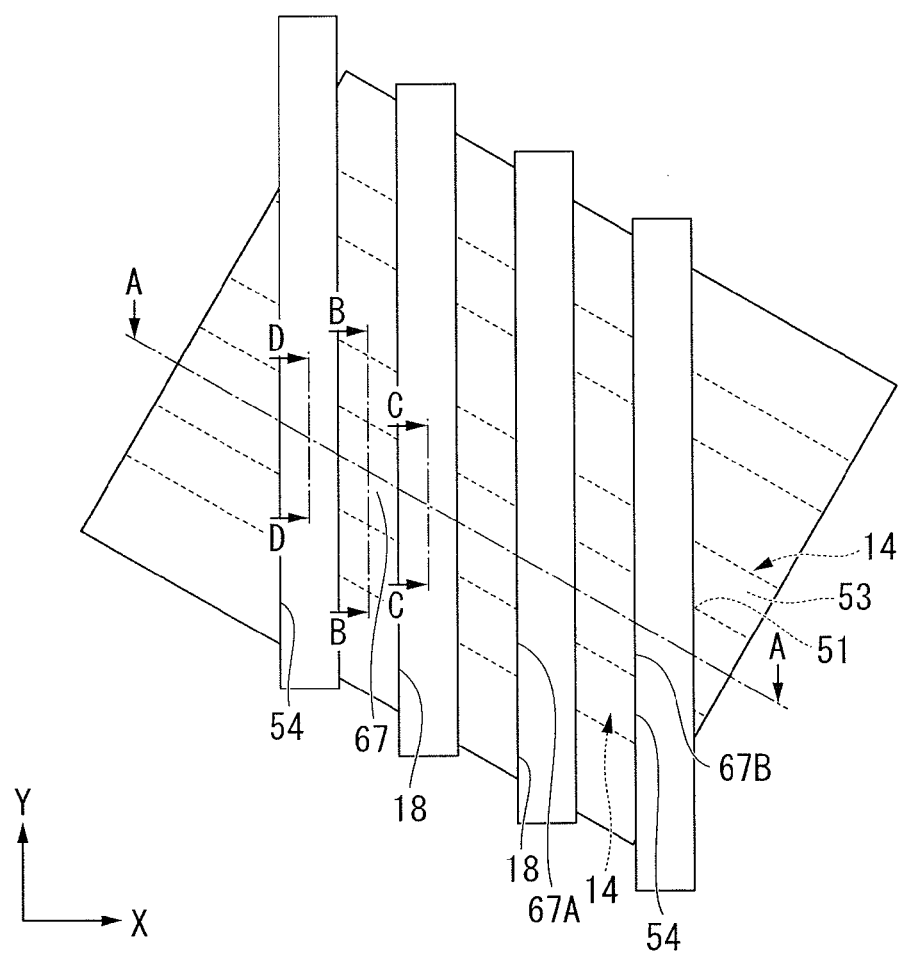
FIG. 6A is a fragmentary schematic plain view of a step, subsequent to the step of FIGS. 5A through 5E, involved in a method of forming the memory cell area of the semiconductor device of FIGS. 1 and 2 in accordance with one or more embodiments of the present invention.
Figure 6B:
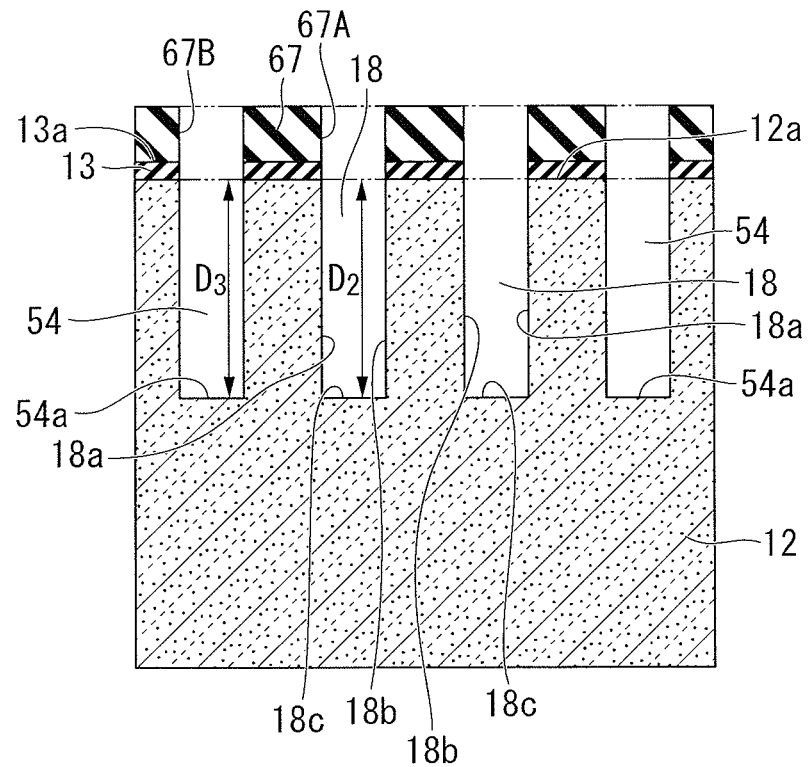
FIG. 6B is a fragmentary cross sectional elevation view, taken along an A-A line of FIG. 6A, illustrative of the same step as of FIG. 6A, subsequent to the step of FIGS. 5A through 5E, involved in the method of forming the memory cell area of the semiconductor device of FIGS. 1 and 2 in accordance with one or more embodiments of the present invention.
Figure 6C:
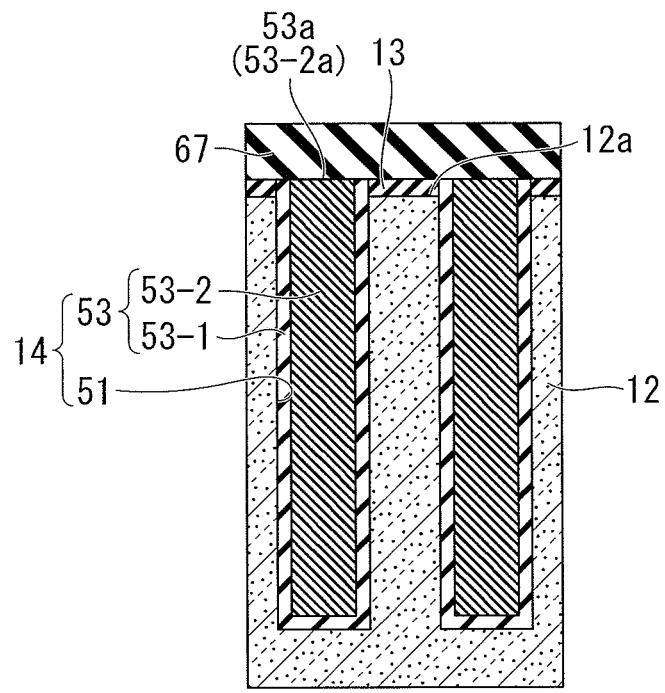
FIG. 6C is a fragmentary cross sectional elevation view, taken along a B-B line of FIG. 6A, illustrative of the same step as of FIG. 6A, subsequent to the step of FIGS. 5A through 5E, involved in the method of forming the memory cell area of the semiconductor device of FIGS. 1 and 2 in accordance with one or more embodiments of the present invention.
Figure 6D:
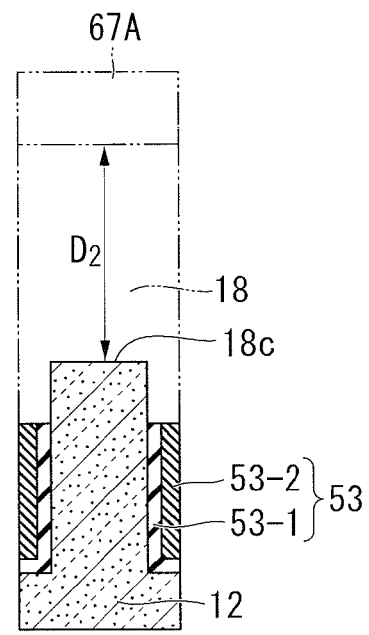
FIG. 6D is a fragmentary cross sectional elevation view, taken along a C-C line of FIG. 6A, illustrative of the same step as of FIG. 6A, subsequent to the step of FIGS. 5A through 5E, involved in the method of forming the memory cell area of the semiconductor device of FIGS. 1 and 2 in accordance with one or more embodiments of the present invention.
Figure 6E:
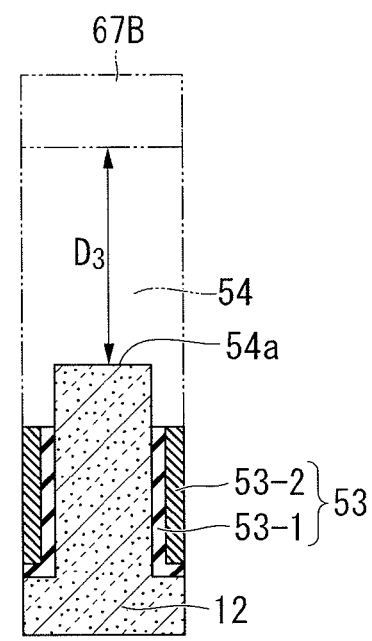
FIG. 6E is a fragmentary cross sectional elevation view, taken along a D-D line of FIG. 6A, illustrative of the same step as of FIG. 6A, subsequent to the step of FIGS. 5A through 5E, involved in the method of forming the memory cell area of the semiconductor device of FIGS. 1 and 2 in accordance with one or more embodiments of the present invention.

FIG. 6A is a plan view of a region in which the memory cell array is formed, FIG. 6B is a cross-sectional view taken along a line A-A of a structure shown in FIG. 6A, FIG. 6C is a cross-sectional view taken along a line B-B of the structure shown in FIG. 6A, FIG. 6D is a cross-sectional view taken along a line C-C of the structure shown in FIG. 6A, and FIG. 6E is a cross-sectional view taken along a line D-D of the structure shown in FIG. 6A.

Figure 7A:
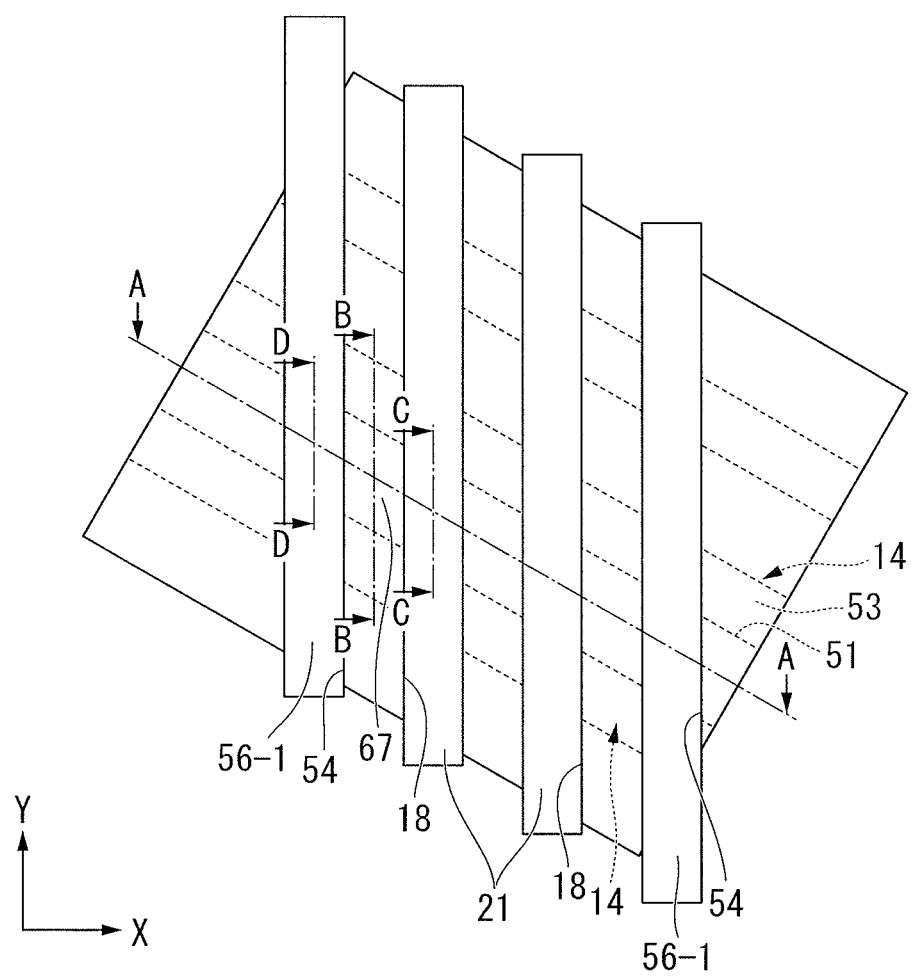
FIG. 7A is a fragmentary schematic plain view of a step, subsequent to the step of FIGS. 6A through 6E, involved in a method of forming the memory cell area of the semiconductor device of FIGS. 1 and 2 in accordance with one or more embodiments of the present invention.
Figure 7B:
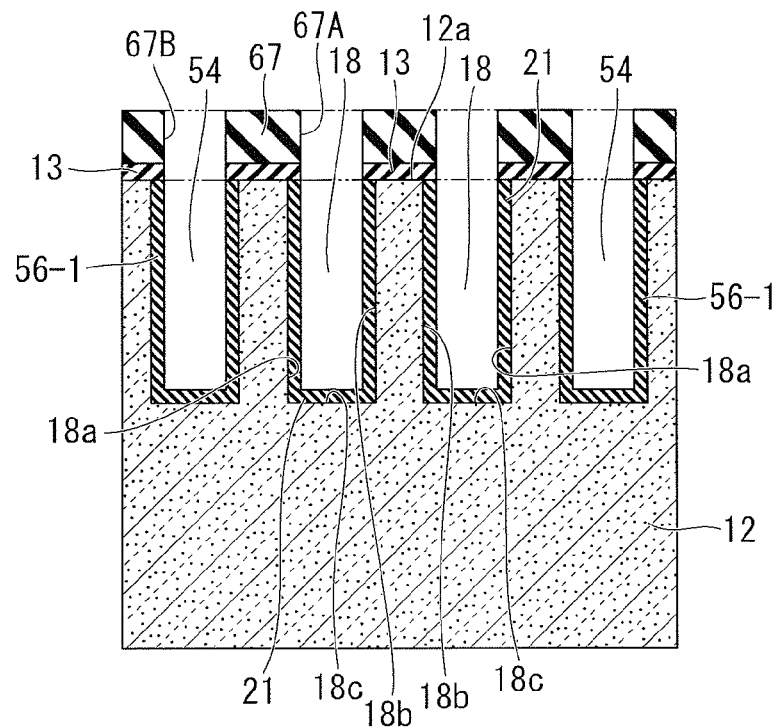
FIG. 7B is a fragmentary cross sectional elevation view, taken along an A-A line of FIG. 7A, illustrative of the same step as of FIG. 7A, subsequent to the step of FIGS. 6A through 6E, involved in the method of forming the memory cell area of the semiconductor device of FIGS. 1 and 2 in accordance with one or more embodiments of the present invention.
Figure 7C:
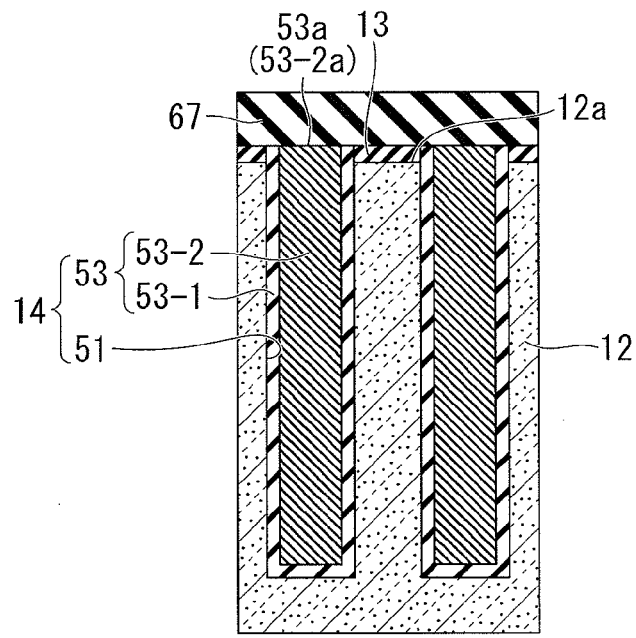
FIG. 7C is a fragmentary cross sectional elevation view, taken along a B-B line of FIG. 7A, illustrative of the same step as of FIG. 7A, subsequent to the step of FIGS. 6A through 6E, involved in the method of forming the memory cell area of the semiconductor device of FIGS. 1 and 2 in accordance with one or more embodiments of the present invention.
Figure 7D:
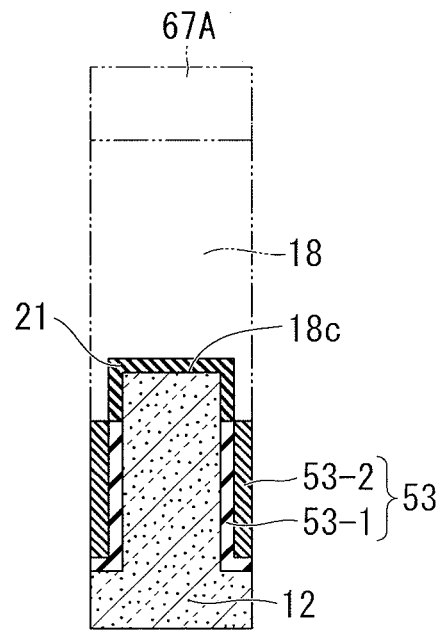
FIG. 7D is a fragmentary cross sectional elevation view, taken along a C-C line of FIG. 7A, illustrative of the same step as of FIG. 7A, subsequent to the step of FIGS. 6A through 6E, involved in the method of forming the memory cell area of the semiconductor device of FIGS. 1 and 2 in accordance with one or more embodiments of the present invention.
Figure 7E:
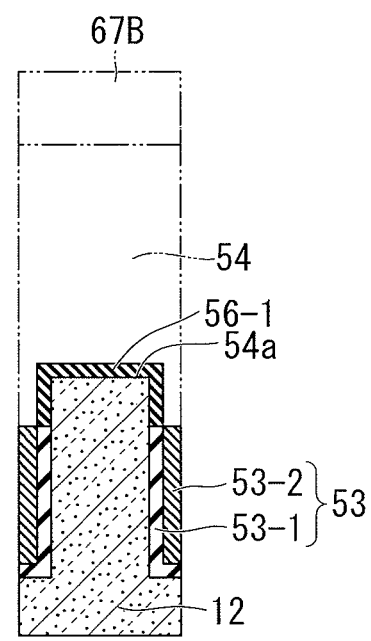
FIG. 7E is a fragmentary cross sectional elevation view, taken along a D-D line of FIG. 7A, illustrative of the same step as of FIG. 7A, subsequent to the step of FIGS. 6A through 6E, involved in the method of forming the memory cell area of the semiconductor device of FIGS. 1 and 2 in accordance with one or more embodiments of the present invention.

FIG. 7A is a plan view of a region in which the memory cell array is formed, FIG. 7B is a cross-sectional view taken along a line A-A of a structure shown in FIG. 7A, FIG. 7C is a cross-sectional view taken along a line B-B of the structure shown in FIG. 7A, FIG. 7D is a cross-sectional view taken along a line C-C of the structure shown in FIG. 7A, and FIG. 7E is a cross-sectional view taken along a line D-D of the structure shown in FIG. 7A.

Figure 8A:
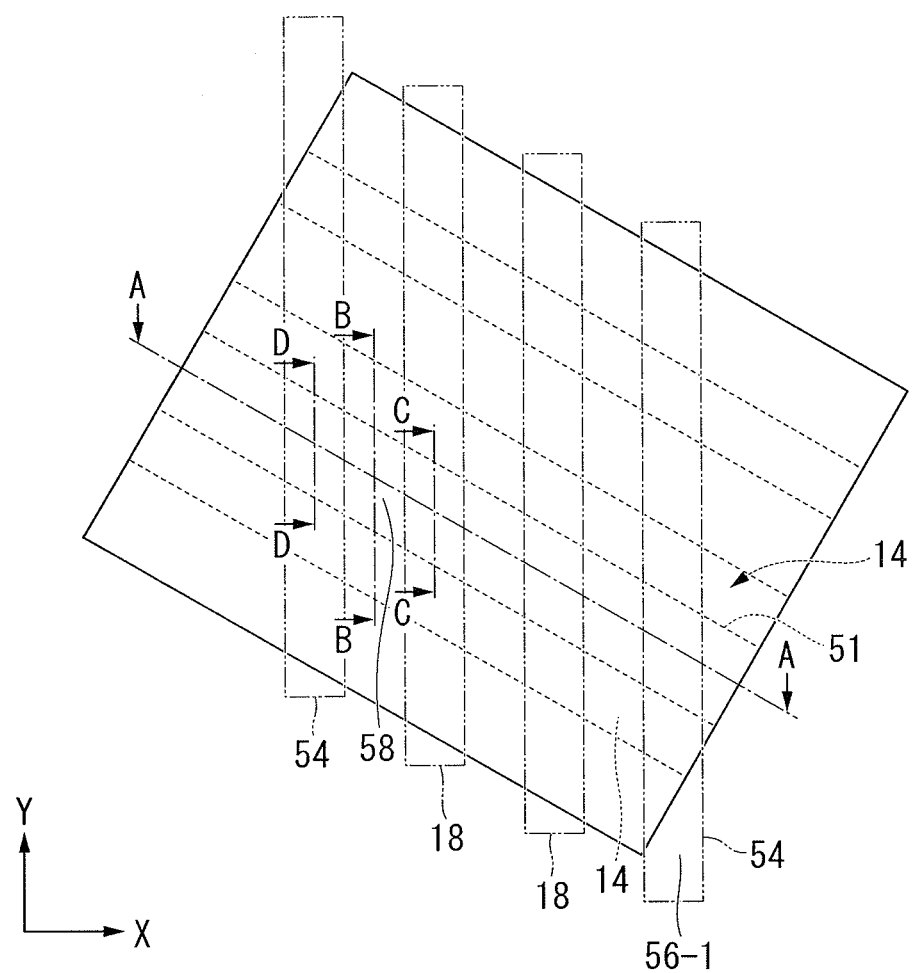
FIG. 8A is a fragmentary schematic plain view of a step, subsequent to the step of FIGS. 7A through 7E, involved in a method of forming the memory cell area of the semiconductor device of FIGS. 1 and 2 in accordance with one or more embodiments of the present invention.
Figure 8B:
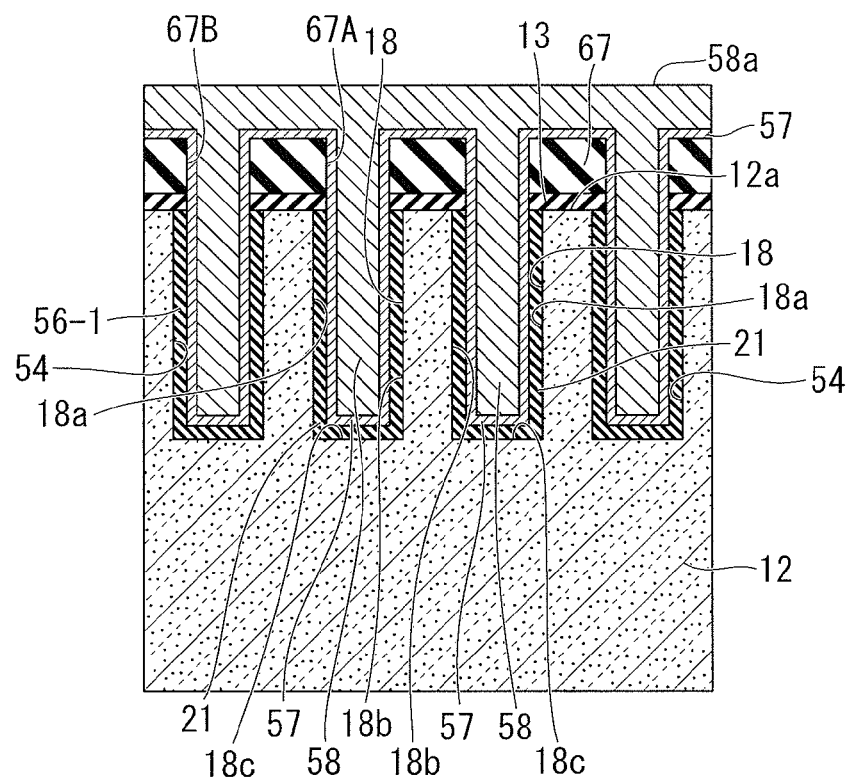
FIG. 8B is a fragmentary cross sectional elevation view, taken along an A-A line of FIG. 8A, illustrative of the same step as of FIG. 8A, subsequent to the step of FIGS. 7A through 7E, involved in the method of forming the memory cell area of the semiconductor device of FIGS. 1 and 2 in accordance with one or more embodiments of the present invention.
Figure 8C:
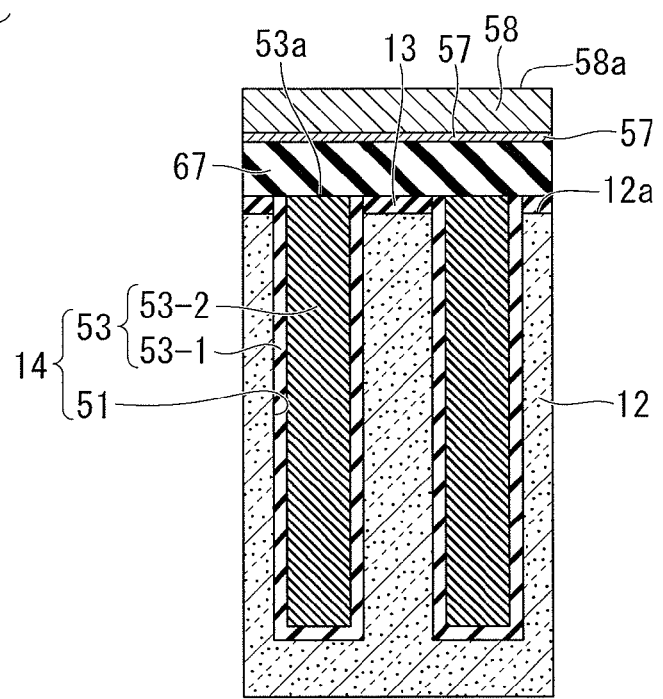
FIG. 8C is a fragmentary cross sectional elevation view, taken along a B-B line of FIG. 8A, illustrative of the same step as of FIG. 8A, subsequent to the step of FIGS. 7A through 7E, involved in the method of forming the memory cell area of the semiconductor device of FIGS. 1 and 2 in accordance with one or more embodiments of the present invention.
Figure 8D:
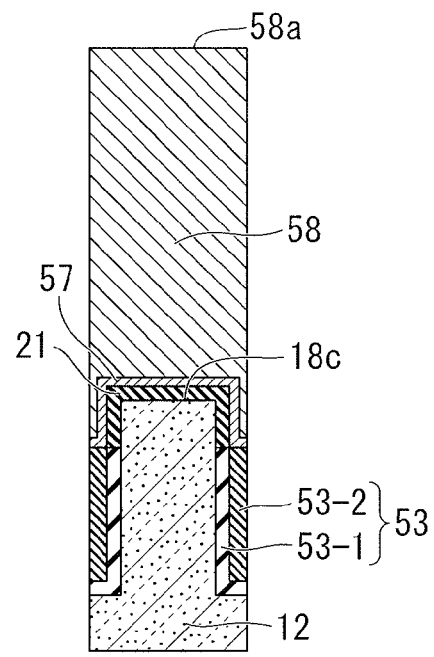
FIG. 8D is a fragmentary cross sectional elevation view, taken along a C-C line of FIG. 8A, illustrative of the same step as of FIG. 8A, subsequent to the step of FIGS. 7A through 7E, involved in the method of forming the memory cell area of the semiconductor device of FIGS. 1 and 2 in accordance with one or more embodiments of the present invention.
Figure 8E:
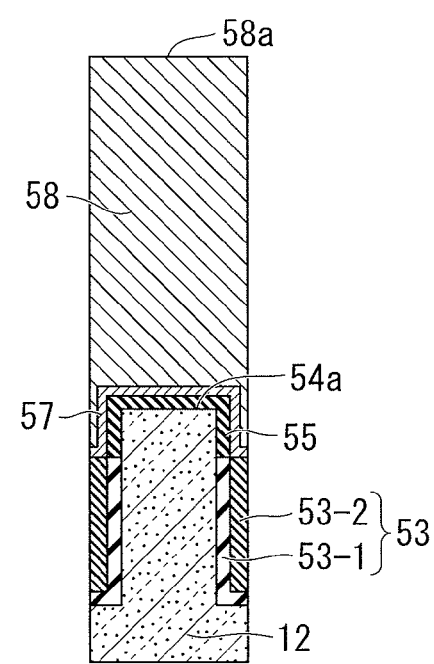
FIG. 8E is a fragmentary cross sectional elevation view, taken along a D-D line of FIG. 8A, illustrative of the same step as of FIG. 8A, subsequent to the step of FIGS. 7A through 7E, involved in the method of forming the memory cell area of the semiconductor device of FIGS. 1 and 2 in accordance with one or more embodiments of the present invention.

FIG. 8A is a plan view of a region in which the memory cell array is formed, FIG. 8B is a cross-sectional view taken along a line A-A of a structure shown in FIG. 8A, FIG. 8C is a cross-sectional view taken along a line B-B of the structure shown in FIG. 8A, FIG. 8D is a cross-sectional view taken along a line C-C of the structure shown in FIG. 8A, and FIG. 8E is a cross-sectional view taken along a line D-D of the structure shown in FIG. 8A.

Figure 9A:
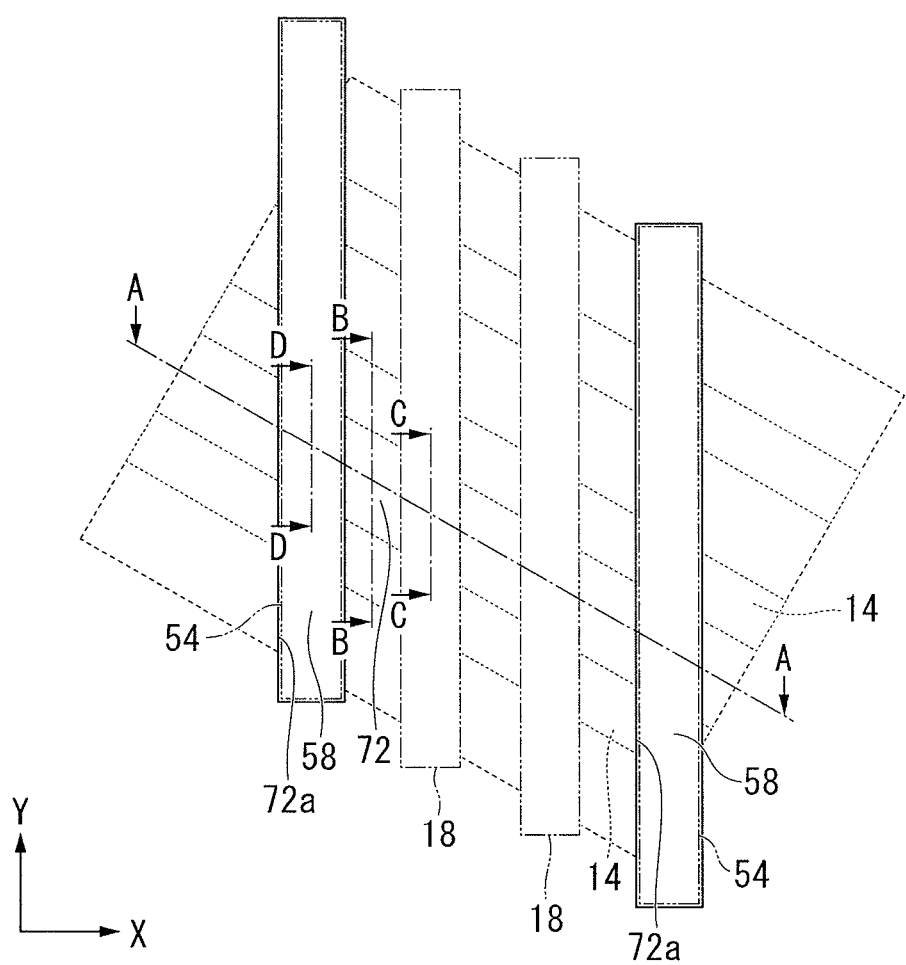
FIG. 9A is a fragmentary schematic plain view of a step, subsequent to the step of FIGS. 8A through 8E, involved in a method of forming the memory cell area of the semiconductor device of FIGS. 1 and 2 in accordance with one or more embodiments of the present invention.
Figure 9B:
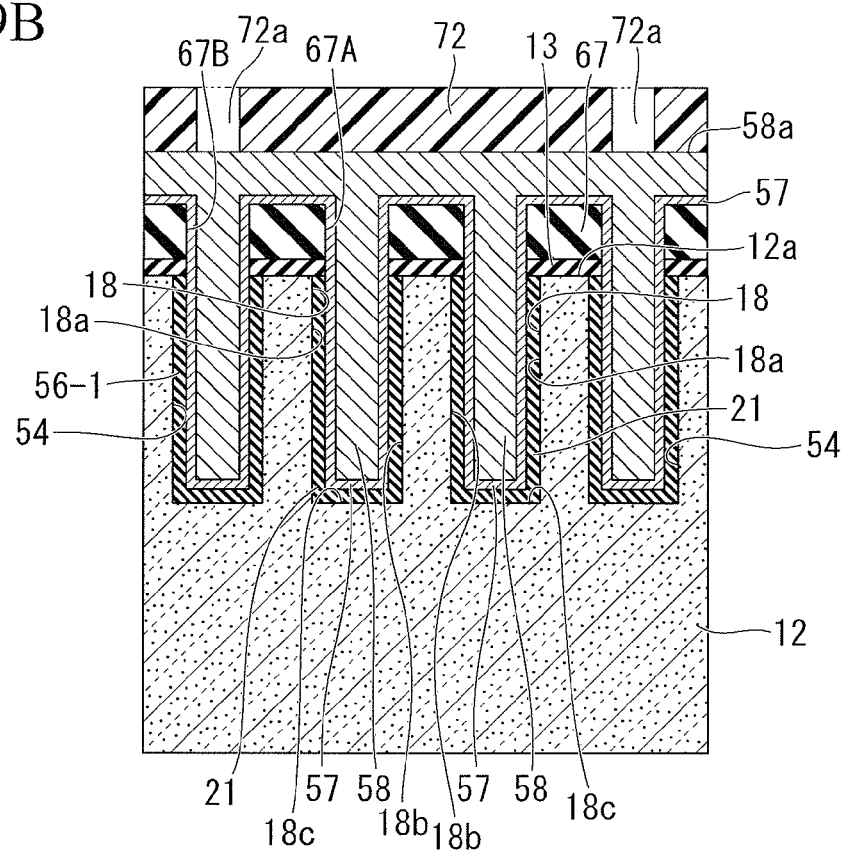
FIG. 9B is a fragmentary cross sectional elevation view, taken along an A-A line of FIG. 9A, illustrative of the same step as of FIG. 9A, subsequent to the step of FIGS. 8A through 8E, involved in the method of forming the memory cell area of the semiconductor device of FIGS. 1 and 2 in accordance with one or more embodiments of the present invention.
Figure 9C:
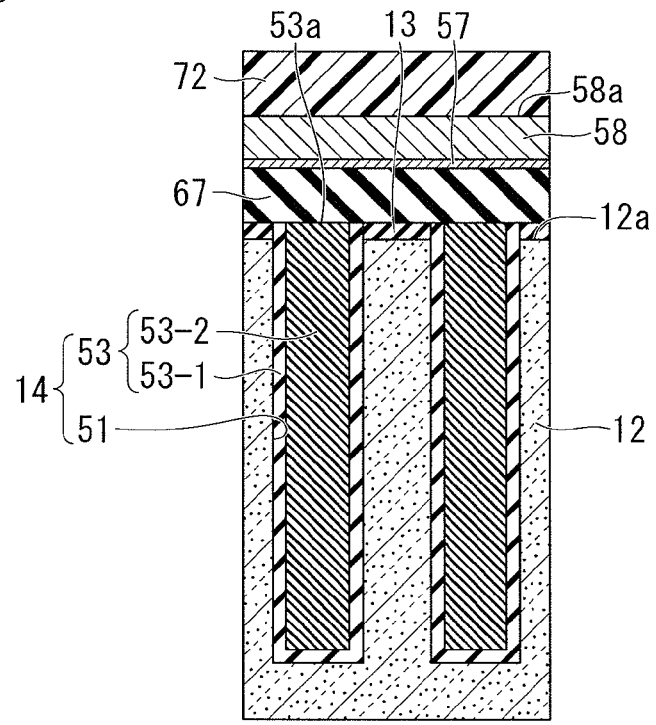
FIG. 9C is a fragmentary cross sectional elevation view, taken along a B-B line of FIG. 9A, illustrative of the same step as of FIG. 9A, subsequent to the step of FIGS. 8A through 8E, involved in the method of forming the memory cell area of the semiconductor device of FIGS. 1 and 2 in accordance with one or more embodiments of the present invention.
Figure 9D:
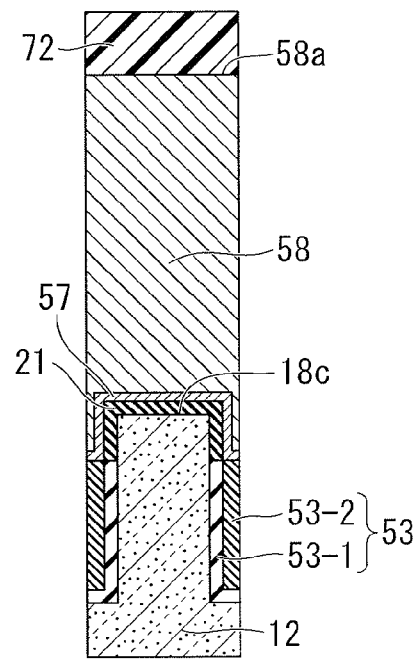
FIG. 9D is a fragmentary cross sectional elevation view, taken along a C-C line of FIG. 9A, illustrative of the same step as of FIG. 9A, subsequent to the step of FIGS. 8A through 8E, involved in the method of forming the memory cell area of the semiconductor device of FIGS. 1 and 2 in accordance with one or more embodiments of the present invention.
Figure 9E:
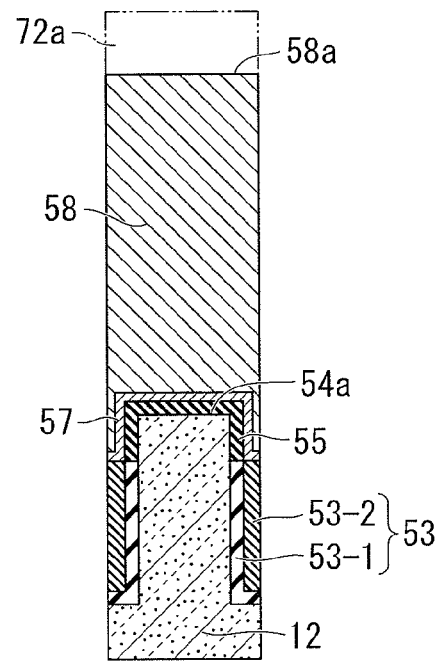
FIG. 9E is a fragmentary cross sectional elevation view, taken along a D-D line of FIG. 9A, illustrative of the same step as of FIG. 9A, subsequent to the step of FIGS. 8A through 8E, involved in the method of forming the memory cell area of the semiconductor device of FIGS. 1 and 2 in accordance with one or more embodiments of the present invention.

FIG. 9A is a plan view of a region in which the memory cell array is formed, FIG. 9B is a cross-sectional view taken along a line A-A of a structure shown in FIG. 9A, FIG. 9C is a cross-sectional view taken along a line B-B of the structure shown in FIG. 9A, FIG. 9D is a cross-sectional view taken along a line C-C of the structure shown in FIG. 9A, and FIG. 9E is a cross-sectional view taken along a line D-D of the structure shown in FIG. 9A.

Figure 10A:
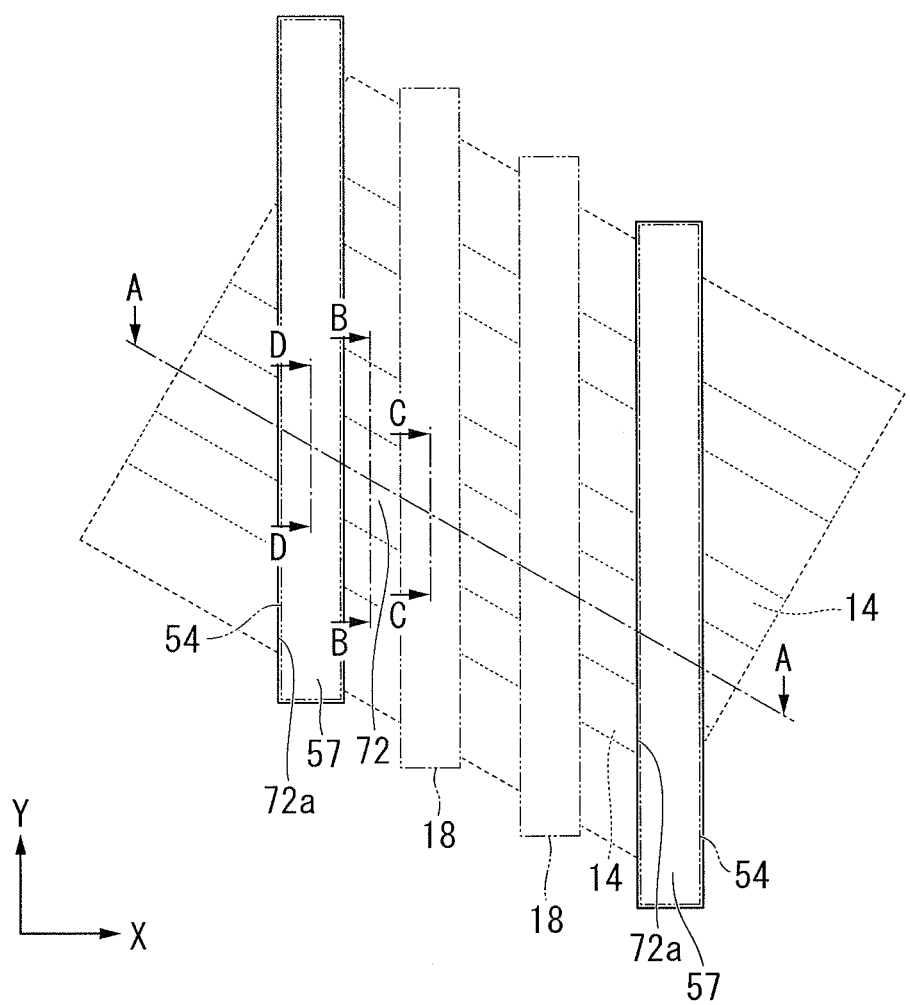
FIG. 10A is a fragmentary schematic plain view of a step, subsequent to the step of FIGS. 9A through 9E, involved in a method of forming the memory cell area of the semiconductor device of FIGS. 1 and 2 in accordance with one or more embodiments of the present invention.
Figure 10B:
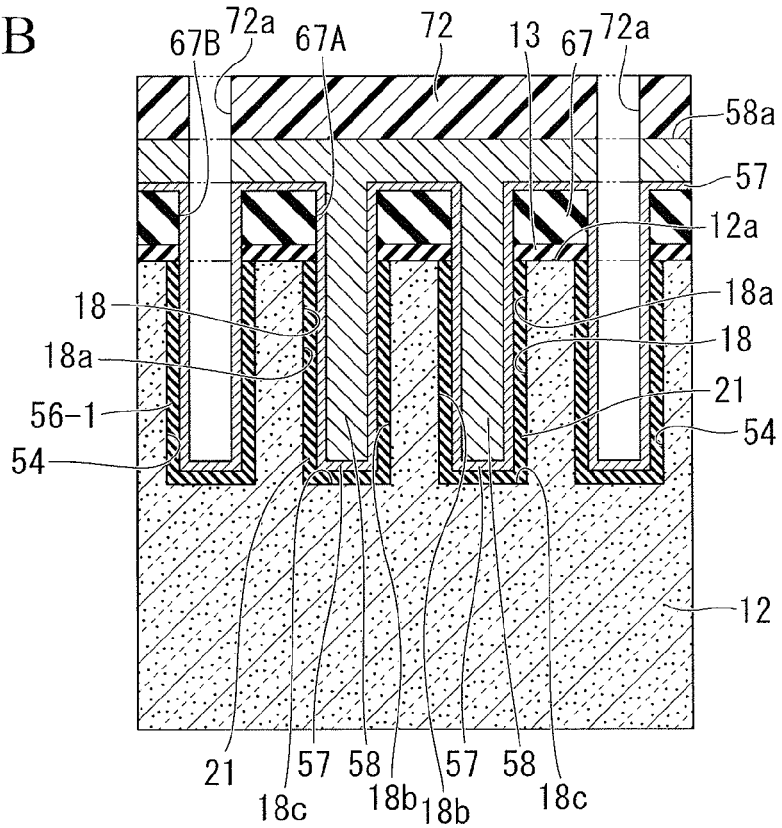
FIG. 10B is a fragmentary cross sectional elevation view, taken along an A-A line of FIG. 10A, illustrative of the same step as of FIG. 10A, subsequent to the step of FIGS. 9A through 9E, involved in the method of forming the memory cell area of the semiconductor device of FIGS. 1 and 2 in accordance with one or more embodiments of the present invention.
Figure 10C:
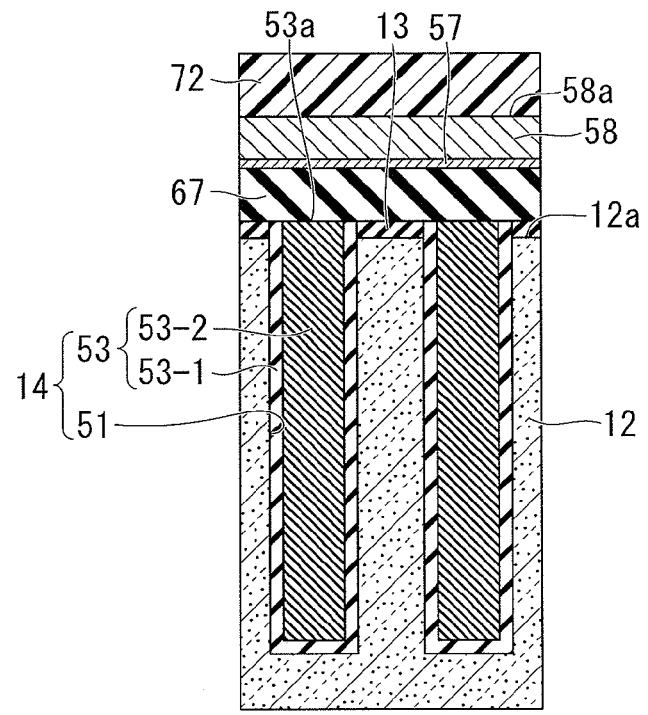
FIG. 10C is a fragmentary cross sectional elevation view, taken along a B-B line of FIG. 10A, illustrative of the same step as of FIG. 10A, subsequent to the step of FIGS. 9A through 9E, involved in the method of forming the memory cell area of the semiconductor device of FIGS. 1 and 2 in accordance with one or more embodiments of the present invention.
Figure 10D:
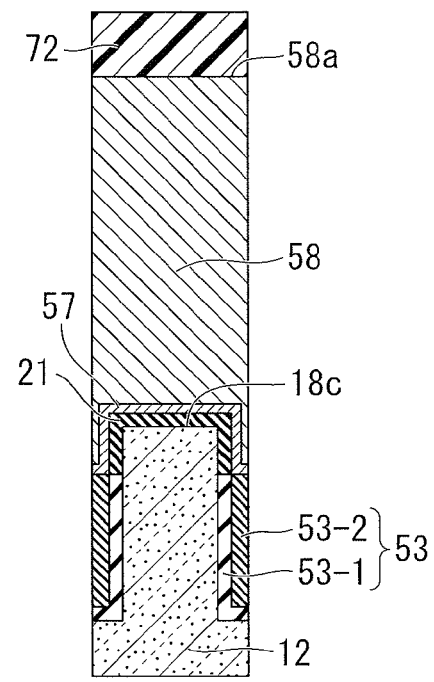
FIG. 10D is a fragmentary cross sectional elevation view, taken along a C-C line of FIG. 10A, illustrative of the same step as of FIG. 10A, subsequent to the step of FIGS. 9A through 9E, involved in the method of forming the memory cell area of the semiconductor device of FIGS. 1 and 2 in accordance with one or more embodiments of the present invention.
Figure 10E:
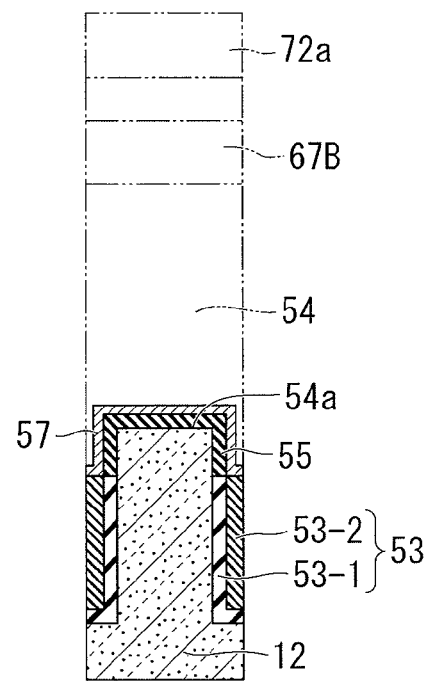
FIG. 10E is a fragmentary cross sectional elevation view, taken along a D-D line of FIG. 10A, illustrative of the same step as of FIG. 10A, subsequent to the step of FIGS. 9A through 9E, involved in the method of forming the memory cell area of the semiconductor device of FIGS. 1 and 2 in accordance with one or more embodiments of the present invention.

FIG. 10A is a plan view of a region in which the memory cell array is formed, FIG. 10B is a cross-sectional view taken along a line A-A of a structure shown in FIG. 10A, FIG. 10C is a cross-sectional view taken along a line B-B of the structure shown in FIG. 10A, FIG. 10D is a cross-sectional view taken along a line C-C of the structure shown in FIG. 10A, and FIG. 10E is a cross-sectional view taken along a line D-D of the structure shown in FIG. 10A.

Figure 11A:
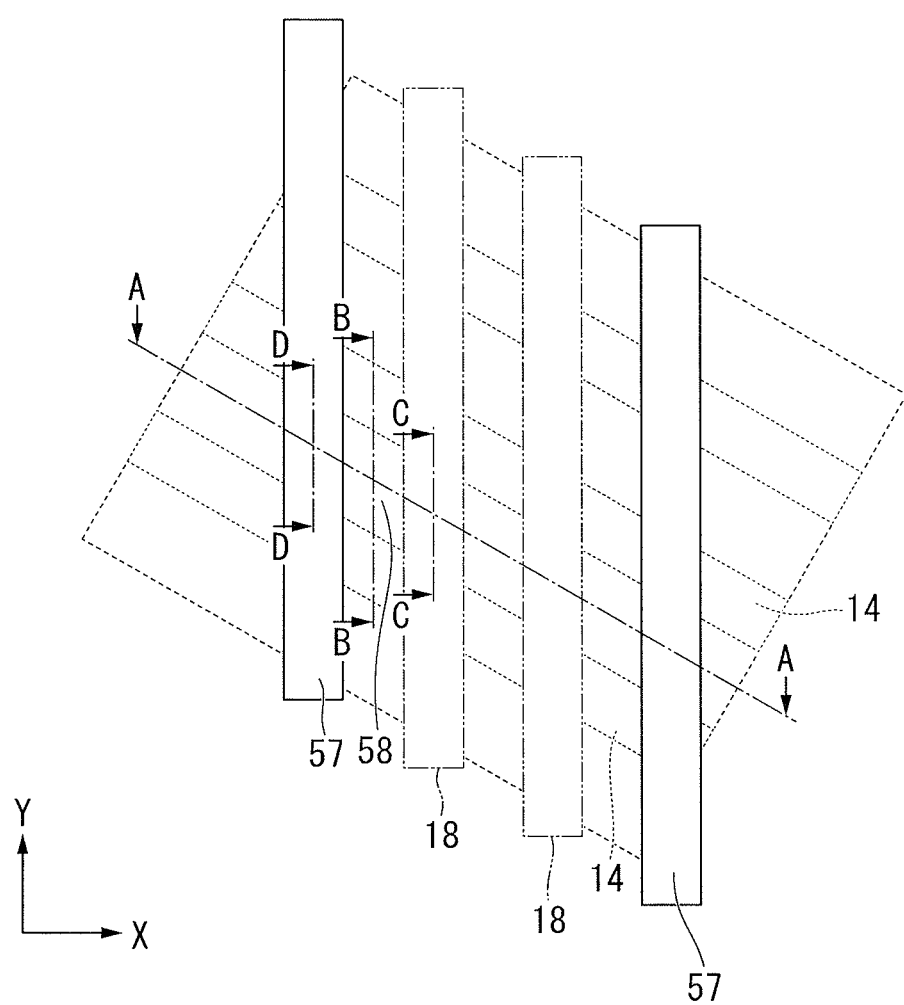
FIG. 11A is a fragmentary schematic plain view of a step, subsequent to the step of FIGS. 10A through 10E, involved in a method of forming the memory cell area of the semiconductor device of FIGS. 1 and 2 in accordance with one or more embodiments of the present invention.
Figure 11B:
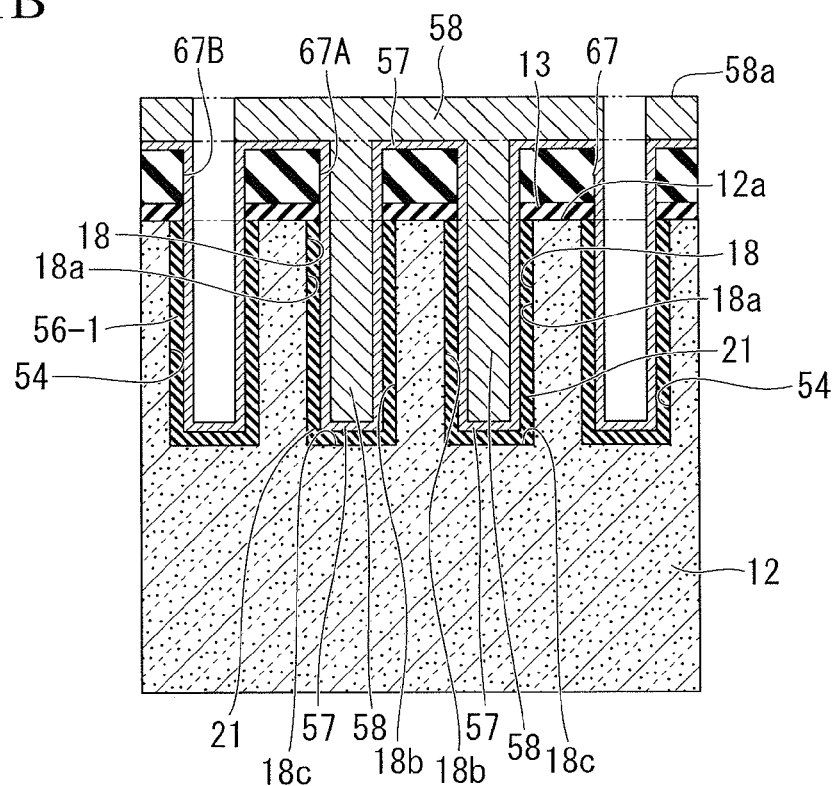
FIG. 11B is a fragmentary cross sectional elevation view, taken along an A-A line of FIG. 11A, illustrative of the same step as of FIG. 11A, subsequent to the step of FIGS. 10A through 10E, involved in the method of forming the memory cell area of the semiconductor device of FIGS. 1 and 2 in accordance with one or more embodiments of the present invention.
Figure 11C:
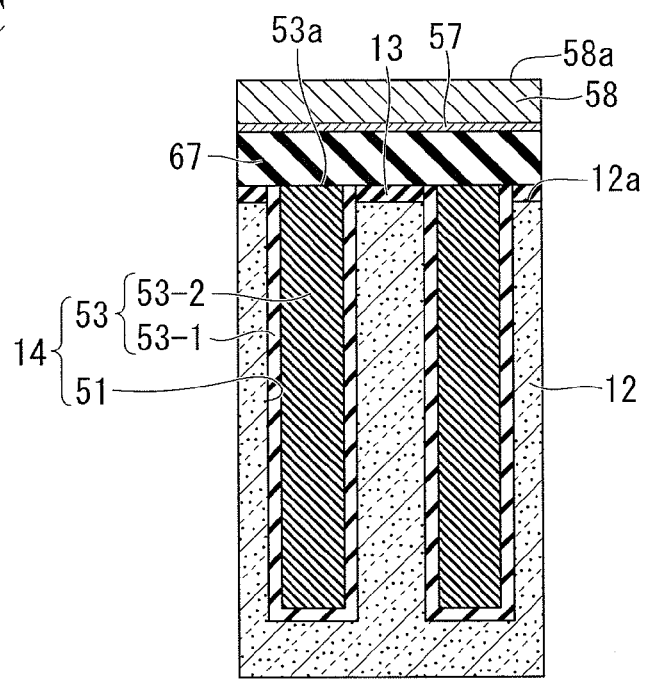
FIG. 11C is a fragmentary cross sectional elevation view, taken along a B-B line of FIG. 11A, illustrative of the same step as of FIG. 11A, subsequent to the step of FIGS. 10A through 10E, involved in the method of forming the memory cell area of the semiconductor device of FIGS. 1 and 2 in accordance with one or more embodiments of the present invention.
Figure 11D:
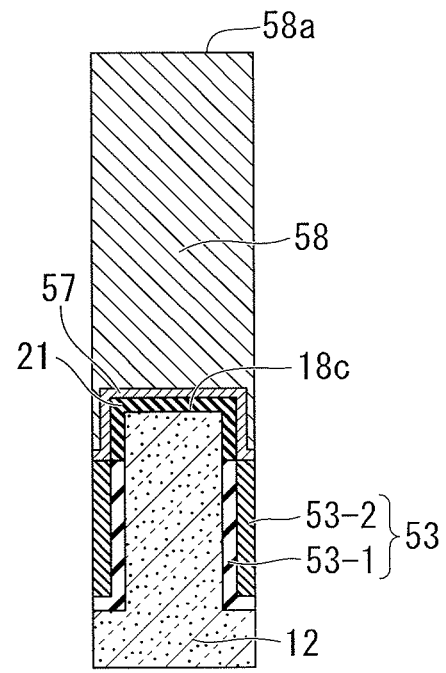
FIG. 11D is a fragmentary cross sectional elevation view, taken along a C-C line of FIG. 11A, illustrative of the same step as of FIG. 11A, subsequent to the step of FIGS. 10A through 10E, involved in the method of forming the memory cell area of the semiconductor device of FIGS. 1 and 2 in accordance with one or more embodiments of the present invention.
Figure 11E:
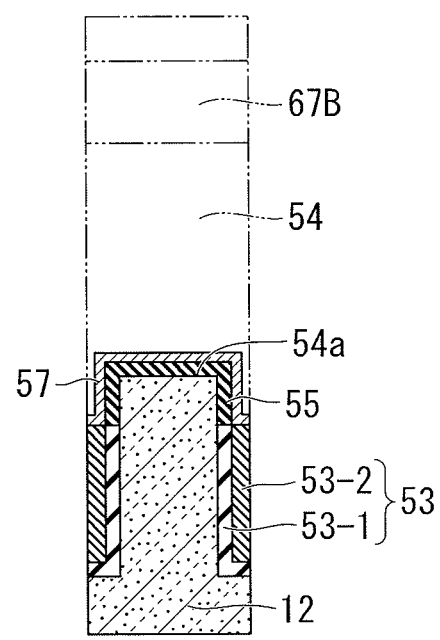
FIG. 11E is a fragmentary cross sectional elevation view, taken along a D-D line of FIG. 11A, illustrative of the same step as of FIG. 11A, subsequent to the step of FIGS. 10A through 10E, involved in the method of forming the memory cell area of the semiconductor device of FIGS. 1 and 2 in accordance with one or more embodiments of the present invention.

FIG. 11A is a plan view of a region in which the memory cell array is formed, FIG. 11B is a cross-sectional view taken along a line A-A of a structure shown in FIG. 11A, FIG. 11C is a cross-sectional view taken along a line B-B of the structure shown in FIG. 11A, FIG. 11D is a cross-sectional view taken along a line C-C of the structure shown in FIG. 11A, and FIG. 11E is a cross-sectional view taken along a line D-D of the structure shown in FIG. 11A.

Figure 12A:
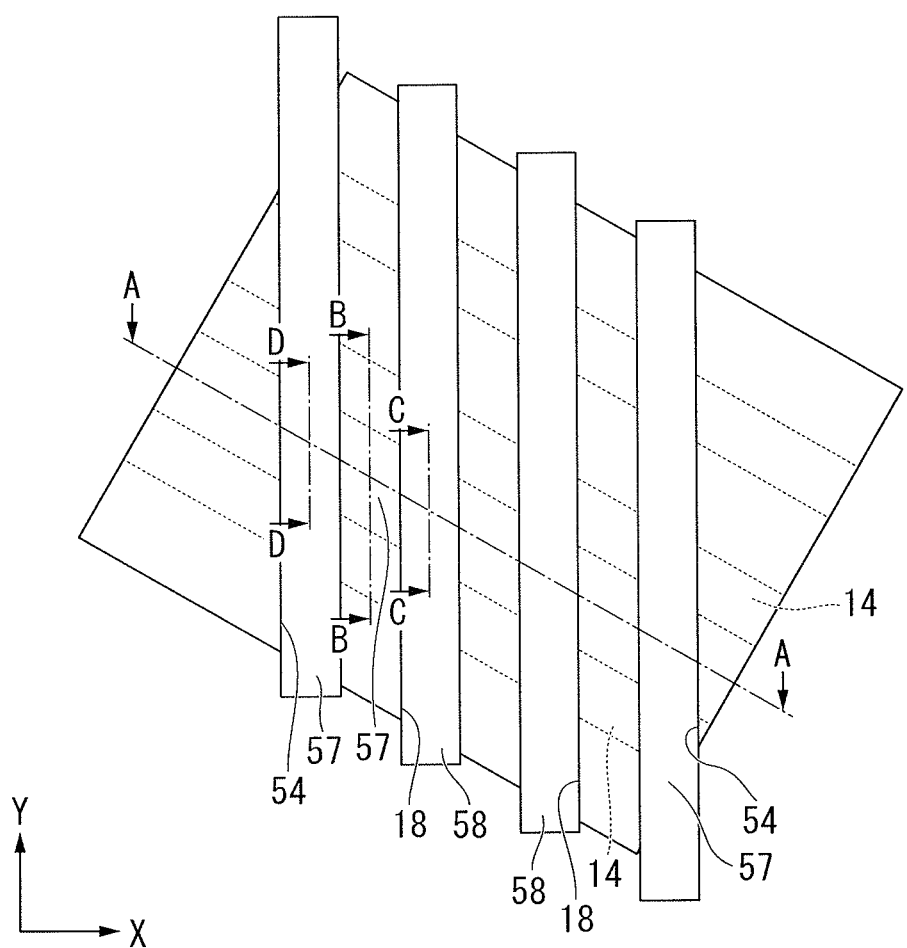
FIG. 12A is a fragmentary schematic plain view of a step, subsequent to the step of FIGS. 11A through 11E, involved in a method of forming the memory cell area of the semiconductor device of FIGS. 1 and 2 in accordance with one or more embodiments of the present invention.
Figure 12B:
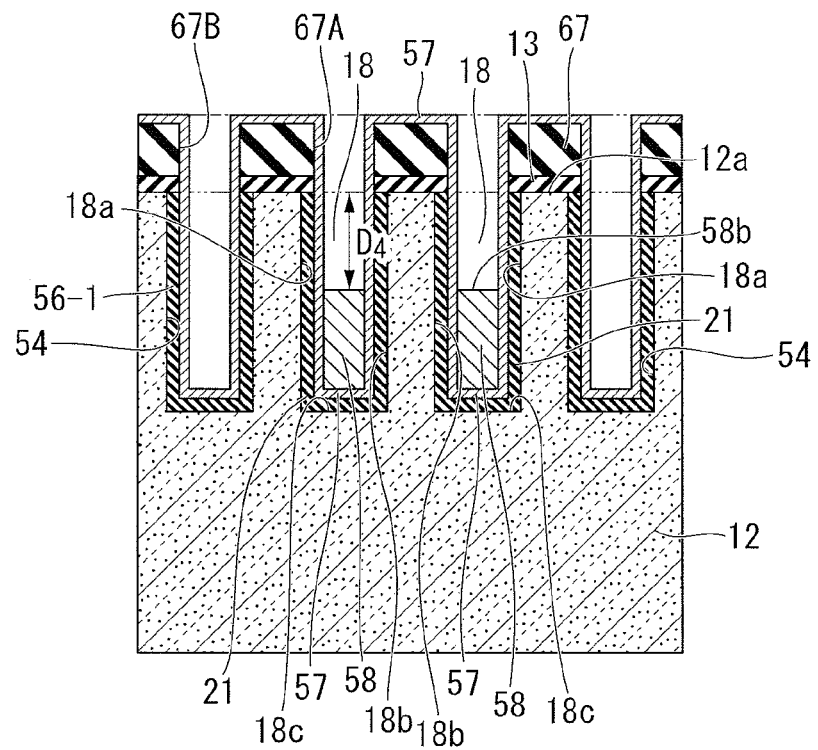
FIG. 12B is a fragmentary cross sectional elevation view, taken along an A-A line of FIG. 12A, illustrative of the same step as of FIG. 12A, subsequent to the step of FIGS. 11A through 11E, involved in the method of forming the memory cell area of the semiconductor device of FIGS. 1 and 2 in accordance with one or more embodiments of the present invention.
Figure 12C:
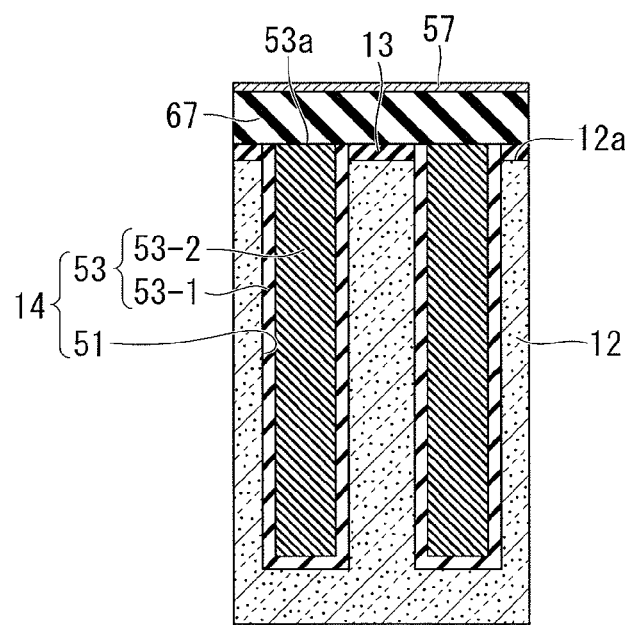
FIG. 12C is a fragmentary cross sectional elevation view, taken along a B-B line of FIG. 12A, illustrative of the same step as of FIG. 12A, subsequent to the step of FIGS. 11A through 11E, involved in the method of forming the memory cell area of the semiconductor device of FIGS. 1 and 2 in accordance with one or more embodiments of the present invention.
Figure 12D:
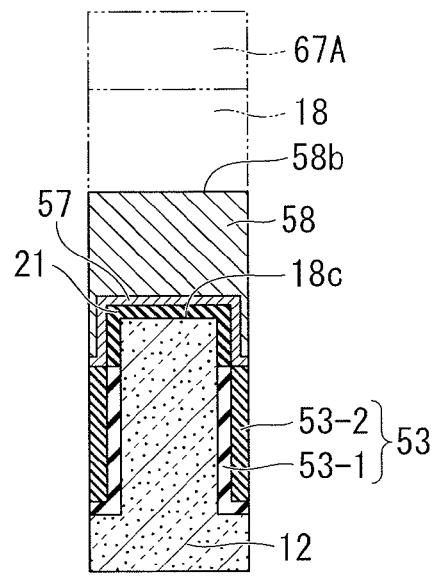
FIG. 12D is a fragmentary cross sectional elevation view, taken along a C-C line of FIG. 12A, illustrative of the same step as of FIG. 12A, subsequent to the step of FIGS. 11A through 11E, involved in the method of forming the memory cell area of the semiconductor device of FIGS. 1 and 2 in accordance with one or more embodiments of the present invention.
Figure 12E:
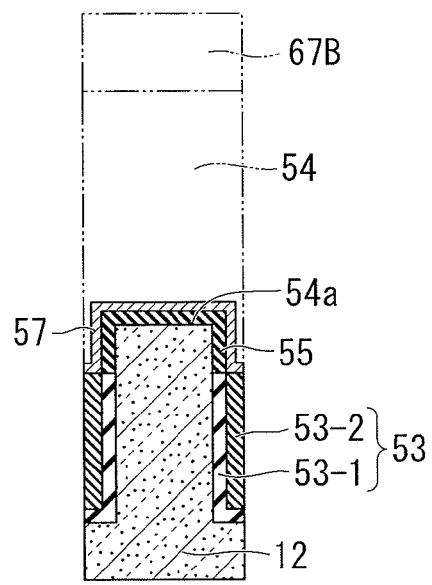
FIG. 12E is a fragmentary cross sectional elevation view, taken along a D-D line of FIG. 12A, illustrative of the same step as of FIG. 12A, subsequent to the step of FIGS. 11A through 11E, involved in the method of forming the memory cell area of the semiconductor device of FIGS. 1 and 2 in accordance with one or more embodiments of the present invention.

FIG. 12A is a plan view of a region in which the memory cell array is formed, FIG. 12B is a cross-sectional view taken along a line A-A of a structure shown in FIG. 12A, FIG. 12C is a cross-sectional view taken along a line B-B of the structure shown in FIG. 12A, FIG. 12D is a cross-sectional view taken along a line C-C of the structure shown in FIG. 12A, and FIG. 12E is a cross-sectional view taken along a line D-D of the structure shown in FIG. 12A.

Figure 13A:
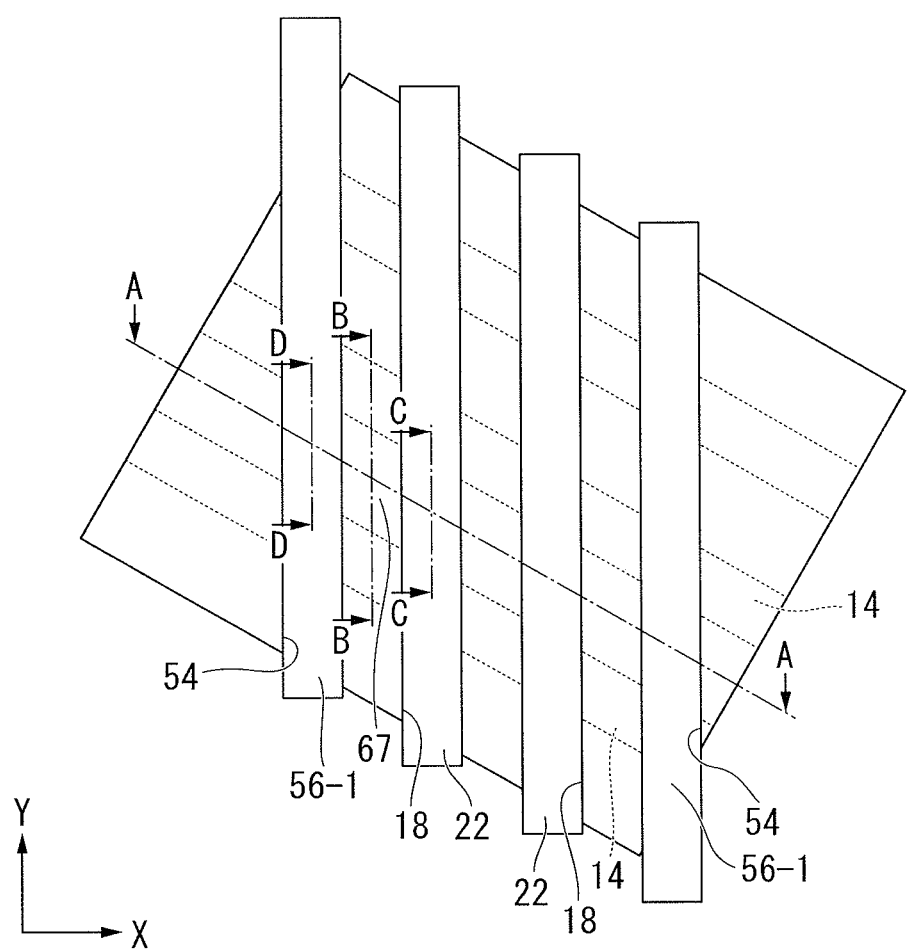
FIG. 13A is a fragmentary schematic plain view of a step, subsequent to the step of FIGS. 12A through 12E, involved in a method of forming the memory cell area of the semiconductor device of FIGS. 1 and 2 in accordance with one or more embodiments of the present invention.
Figure 13B:
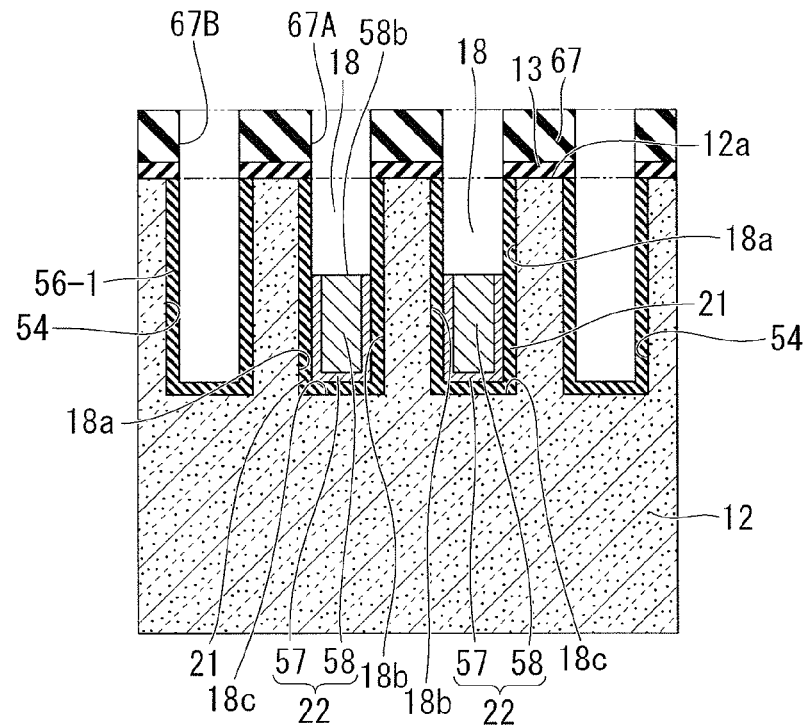
FIG. 13B is a fragmentary cross sectional elevation view, taken along an A-A line of FIG. 13A, illustrative of the same step as of FIG. 13A, subsequent to the step of FIGS. 12A through 12E, involved in the method of forming the memory cell area of the semiconductor device of FIGS. 1 and 2 in accordance with one or more embodiments of the present invention.
Figure 13C:
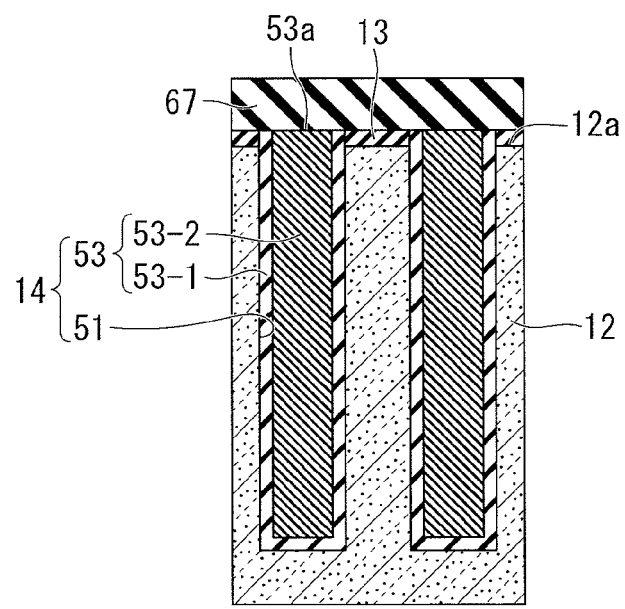
FIG. 13C is a fragmentary cross sectional elevation view, taken along a B-B line of FIG. 13A, illustrative of the same step as of FIG. 13A, subsequent to the step of FIGS. 12A through 12E, involved in the method of forming the memory cell area of the semiconductor device of FIGS. 1 and 2 in accordance with one or more embodiments of the present invention.
Figure 13D:
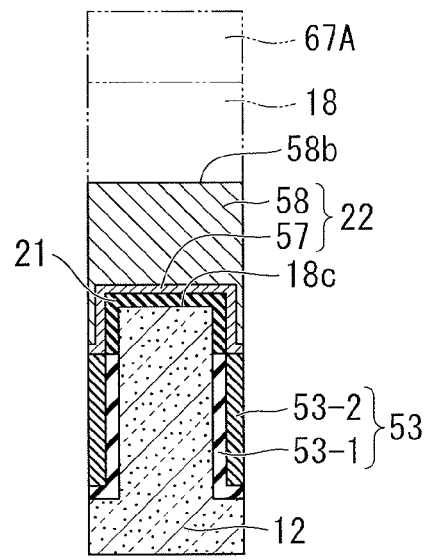
FIG. 13D is a fragmentary cross sectional elevation view, taken along a C-C line of FIG. 13A, illustrative of the same step as of FIG. 13A, subsequent to the step of FIGS. 12A through 12E, involved in the method of forming the memory cell area of the semiconductor device of FIGS. 1 and 2 in accordance with one or more embodiments of the present invention.
Figure 13E:
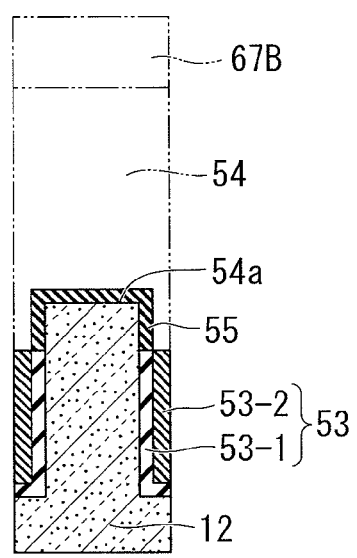
FIG. 13E is a fragmentary cross sectional elevation view, taken along a D-D line of FIG. 13A, illustrative of the same step as of FIG. 13A, subsequent to the step of FIGS. 12A through 12E, involved in the method of forming the memory cell area of the semiconductor device of FIGS. 1 and 2 in accordance with one or more embodiments of the present invention.

FIG. 13A is a plan view of a region in which the memory cell array is formed, FIG. 13B is a cross-sectional view taken along a line A-A of a structure shown in FIG. 13A, FIG. 13C is a cross-sectional view taken along a line B-B of the structure shown in FIG. 13A, FIG. 13D is a cross-sectional view taken along a line C-C of the structure shown in FIG. 13A, and FIG. 13E is a cross-sectional view taken along a line D-D of the structure shown in FIG. 13A.

Figure 14A:
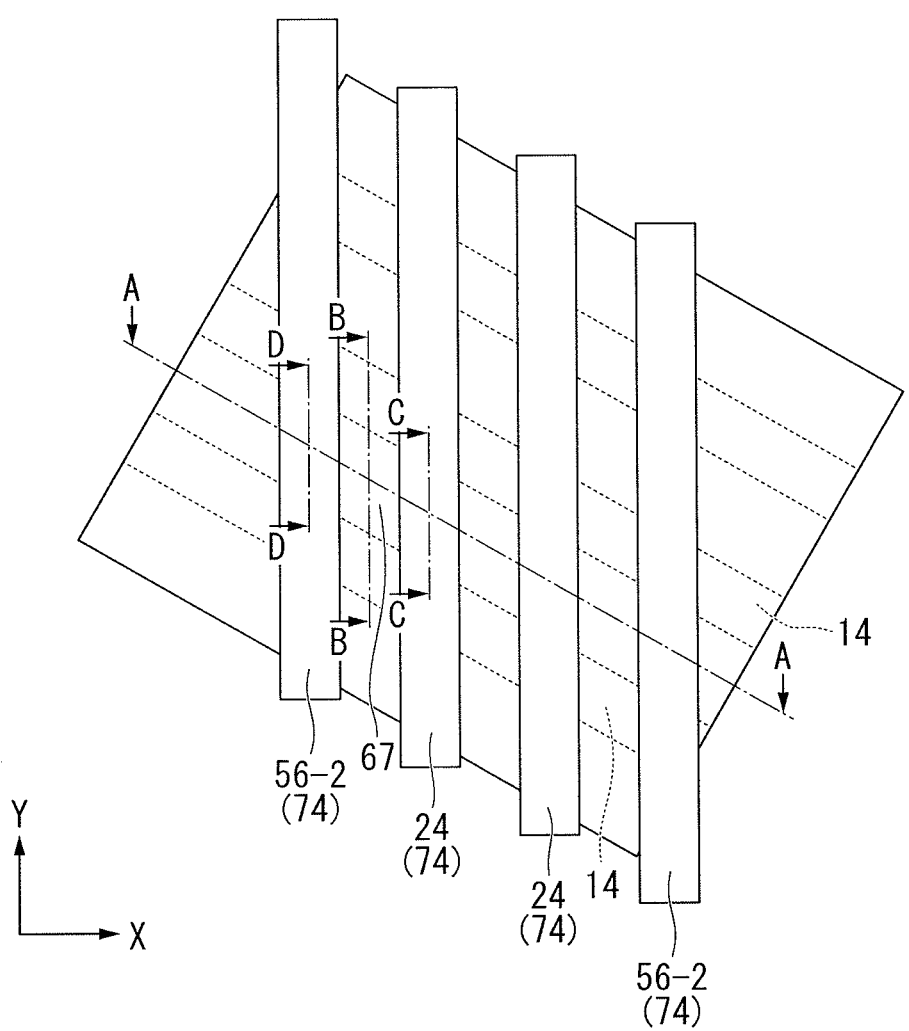
FIG. 14A is a fragmentary schematic plain view of a step, subsequent to the step of FIGS. 13A through 13E, involved in a method of forming the memory cell area of the semiconductor device of FIGS. 1 and 2 in accordance with one or more embodiments of the present invention.
Figure 14B:
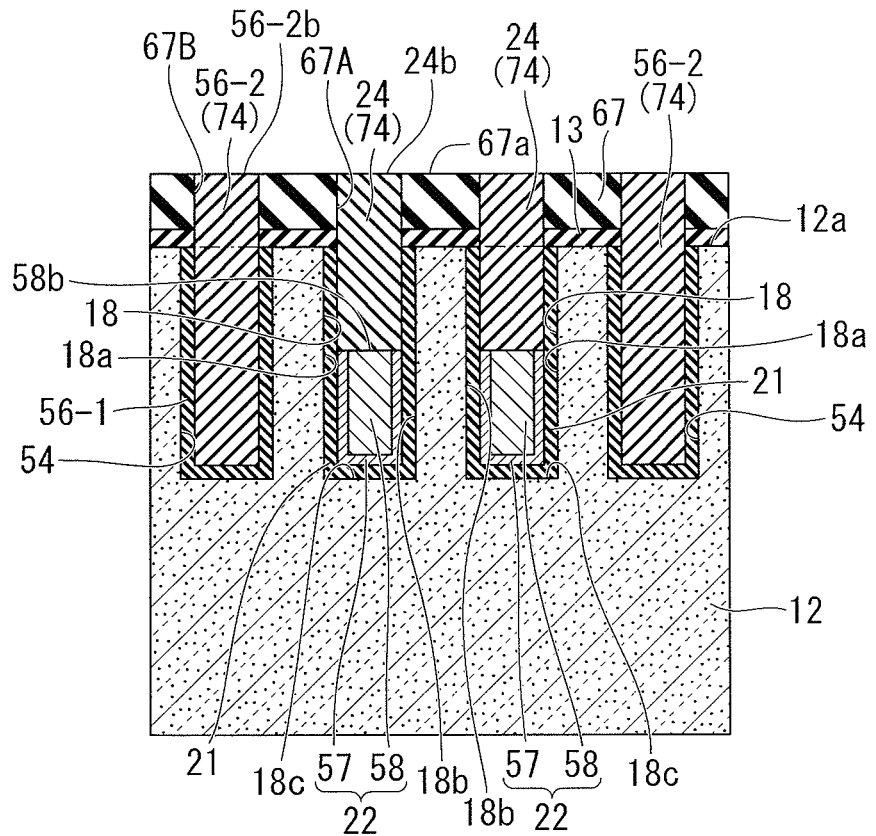
FIG. 14B is a fragmentary cross sectional elevation view, taken along an A-A line of FIG. 14A, illustrative of the same step as of FIG. 14A, subsequent to the step of FIGS. 13A through 13E, involved in the method of forming the memory cell area of the semiconductor device of FIGS. 1 and 2 in accordance with one or more embodiments of the present invention.
Figure 14C:
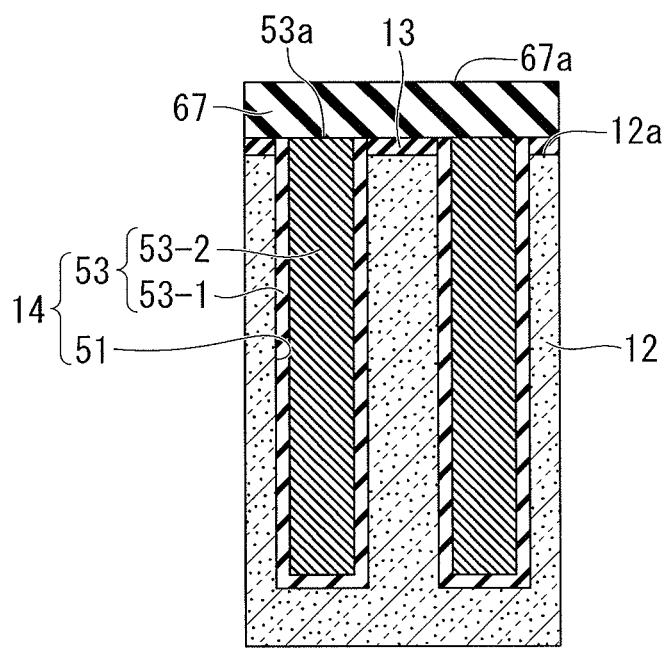
FIG. 14C is a fragmentary cross sectional elevation view, taken along a B-B line of FIG. 14A, illustrative of the same step as of FIG. 14A, subsequent to the step of FIGS. 13A through 13E, involved in the method of forming the memory cell area of the semiconductor device of FIGS. 1 and 2 in accordance with one or more embodiments of the present invention.
Figure 14D:
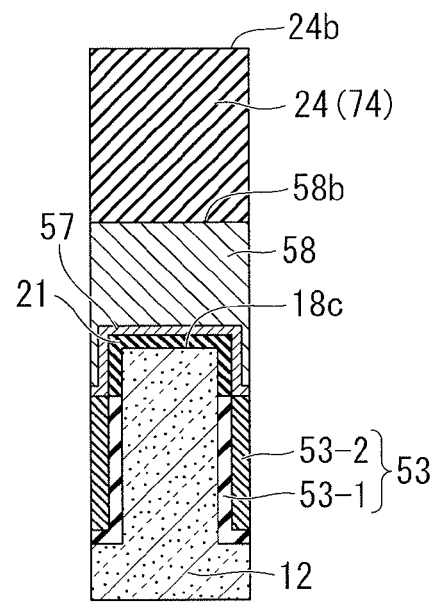
FIG. 14D is a fragmentary cross sectional elevation view, taken along a C-C line of FIG. 14A, illustrative of the same step as of FIG. 14A, subsequent to the step of FIGS. 13A through 13E, involved in the method of forming the memory cell area of the semiconductor device of FIGS. 1 and 2 in accordance with one or more embodiments of the present invention.
Figure 14E:
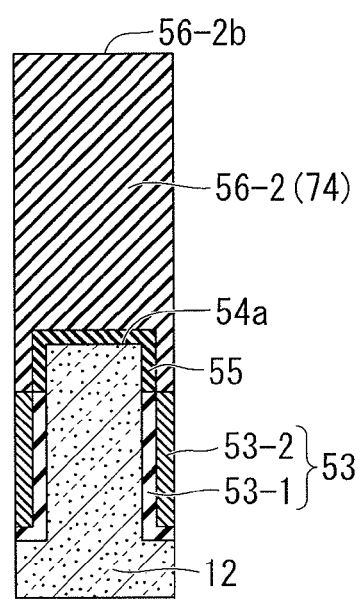
FIG. 14E is a fragmentary cross sectional elevation view, taken along a D-D line of FIG. 14A, illustrative of the same step as of FIG. 14A, subsequent to the step of FIGS. 13A through 13E, involved in the method of forming the memory cell area of the semiconductor device of FIGS. 1 and 2 in accordance with one or more embodiments of the present invention.

FIG. 14A is a plan view of a region in which the memory cell array is formed, FIG. 14B is a cross-sectional view taken along a line A-A of a structure shown in FIG. 14A, FIG. 14C is a cross-sectional view taken along a line B-B of the structure shown in FIG. 14A, FIG. 14D is a cross-sectional view taken along a line C-C of the structure shown in FIG. 14A, and FIG. 14E is a cross-sectional view taken along a line D-D of the structure shown in FIG. 14A.

Figure 15A:
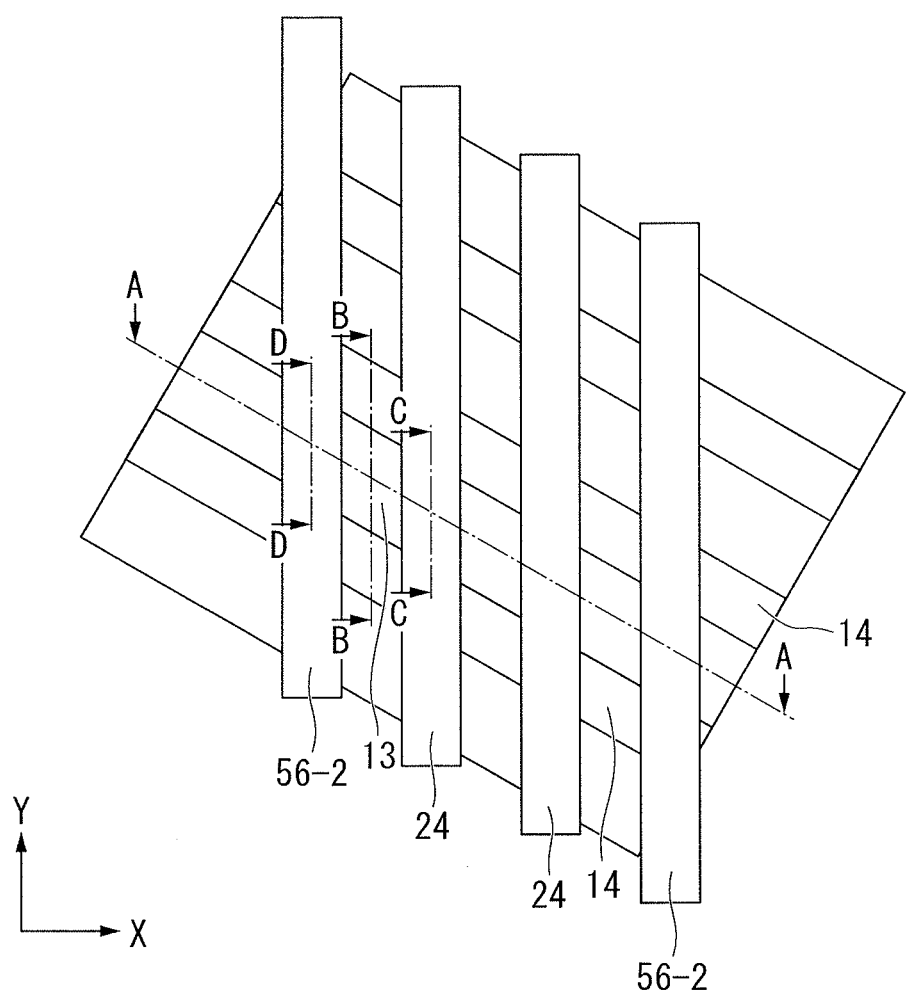
FIG. 15A is a fragmentary schematic plain view of a step, subsequent to the step of FIGS. 14A through 14E, involved in a method of forming the memory cell area of the semiconductor device of FIGS. 1 and 2 in accordance with one or more embodiments of the present invention.
Figure 15B:
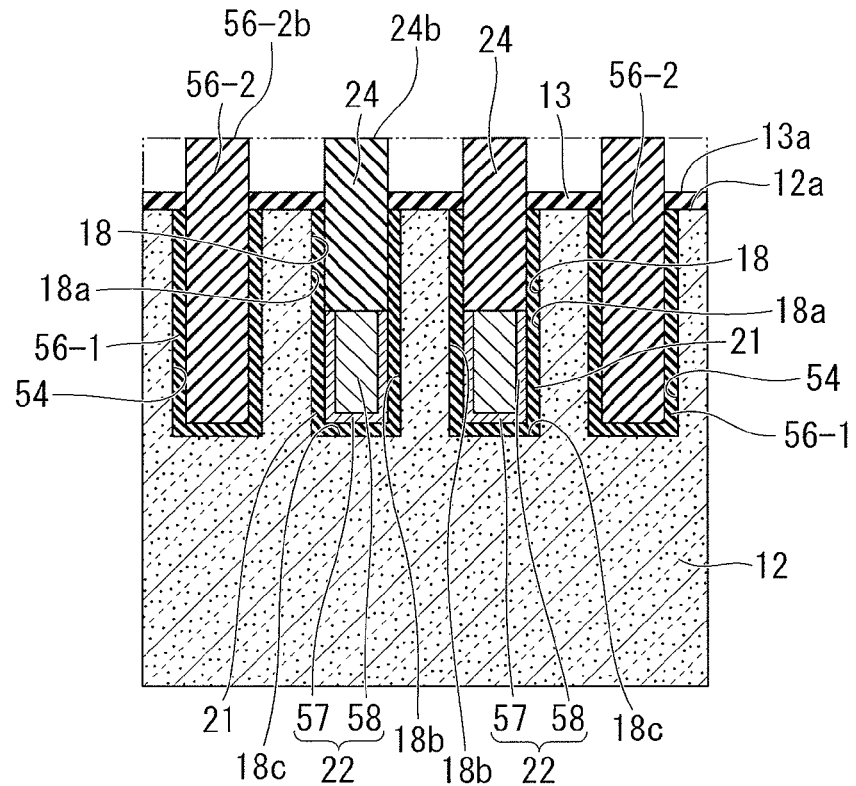
FIG. 15B is a fragmentary cross sectional elevation view, taken along an A-A line of FIG. 15A, illustrative of the same step as of FIG. 15A, subsequent to the step of FIGS. 14A through 14E, involved in the method of forming the memory cell area of the semiconductor device of FIGS. 1 and 2 in accordance with one or more embodiments of the present invention.
Figure 15C:
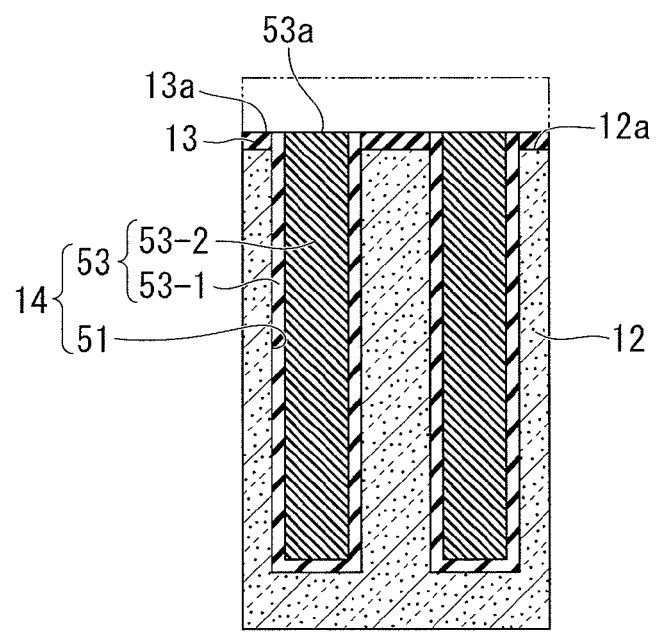
FIG. 15C is a fragmentary cross sectional elevation view, taken along a B-B line of FIG. 15A, illustrative of the same step as of FIG. 15A, subsequent to the step of FIGS. 14A through 14E, involved in the method of forming the memory cell area of the semiconductor device of FIGS. 1 and 2 in accordance with one or more embodiments of the present invention.
Figure 15D:
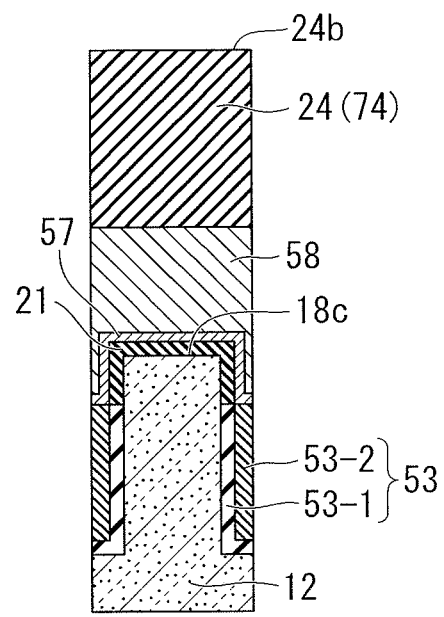
FIG. 15D is a fragmentary cross sectional elevation view, taken along a C-C line of FIG. 15A, illustrative of the same step as of FIG. 15A, subsequent to the step of FIGS. 14A through 14E, involved in the method of forming the memory cell area of the semiconductor device of FIGS. 1 and 2 in accordance with one or more embodiments of the present invention.
Figure 15E:
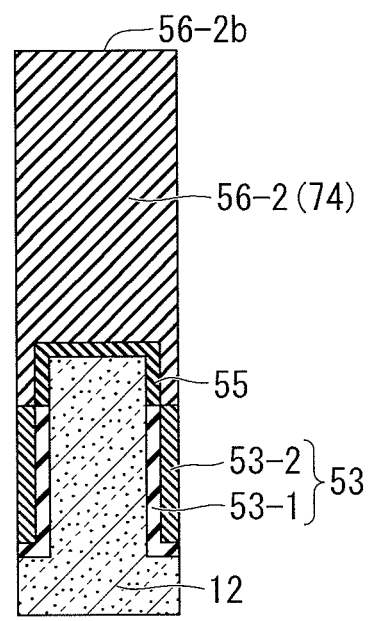
FIG. 15E is a fragmentary cross sectional elevation view, taken along a D-D line of FIG. 15A, illustrative of the same step as of FIG. 15A, subsequent to the step of FIGS. 14A through 14E, involved in the method of forming the memory cell area of the semiconductor device of FIGS. 1 and 2 in accordance with one or more embodiments of the present invention.

FIG. 15A is a plan view of a region in which the memory cell array is formed, FIG. 15B is a cross-sectional view taken along a line A-A of a structure shown in FIG. 15A, FIG. 15C is a cross-sectional view taken along a line B-B of the structure shown in FIG. 15A, FIG. 15D is a cross-sectional view taken along a line C-C of the structure shown in FIG. 15A, and FIG. 15E is a cross-sectional view taken along a line D-D of the structure shown in FIG. 15A.

Figure 16A:
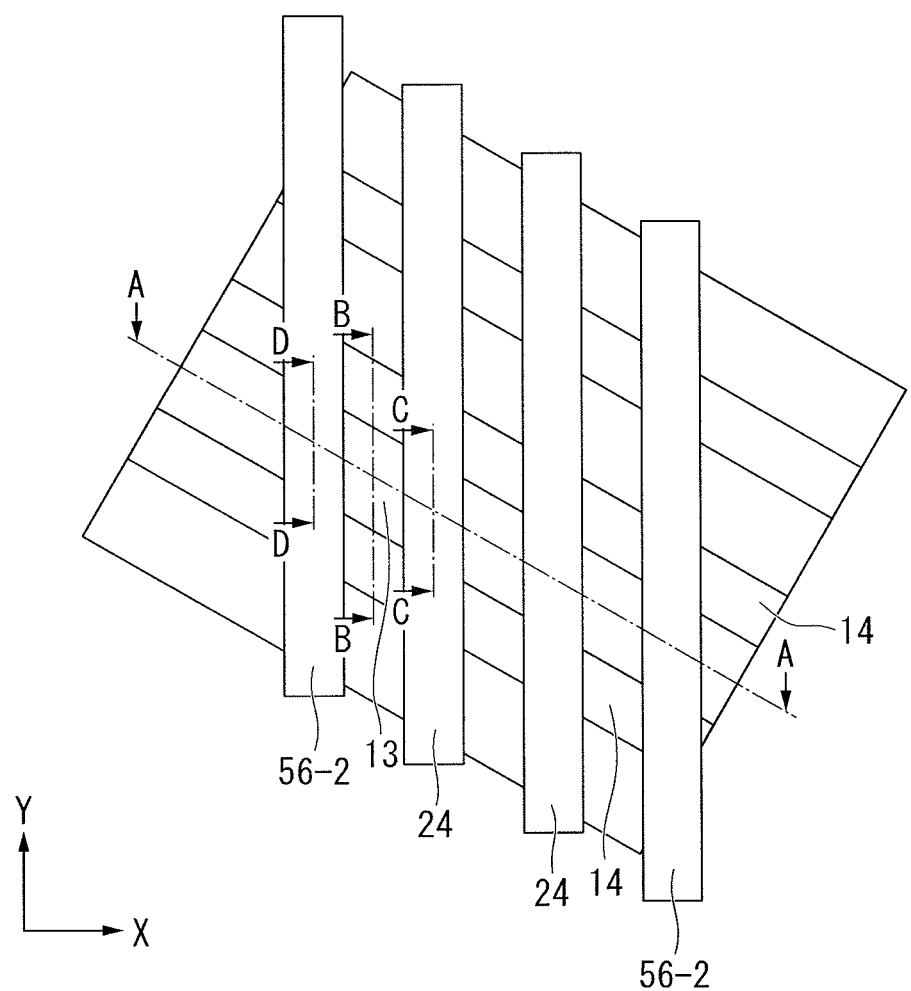
FIG. 16A is a fragmentary schematic plain view of a step, subsequent to the step of FIGS. 15A through 15E, involved in a method of forming the memory cell area of the semiconductor device of FIGS. 1 and 2 in accordance with one or more embodiments of the present invention.
Figure 16B:
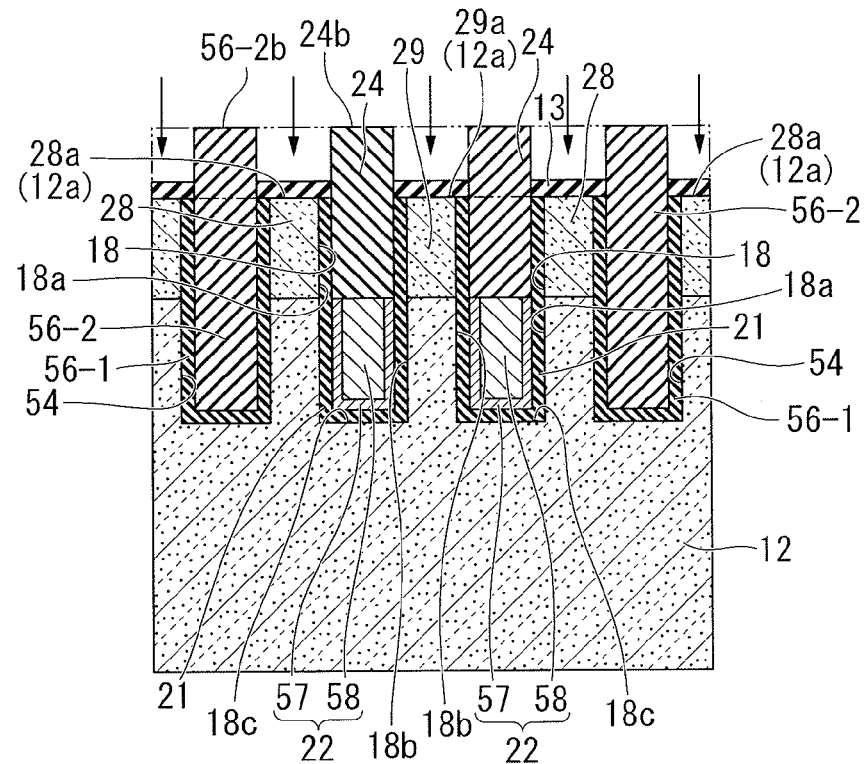
FIG. 16B is a fragmentary cross sectional elevation view, taken along an A-A line of FIG. 16A, illustrative of the same step as of FIG. 16A, subsequent to the step of FIGS. 15A through 15E, involved in the method of forming the memory cell area of the semiconductor device of FIGS. 1 and 2 in accordance with one or more embodiments of the present invention.
Figure 16C:
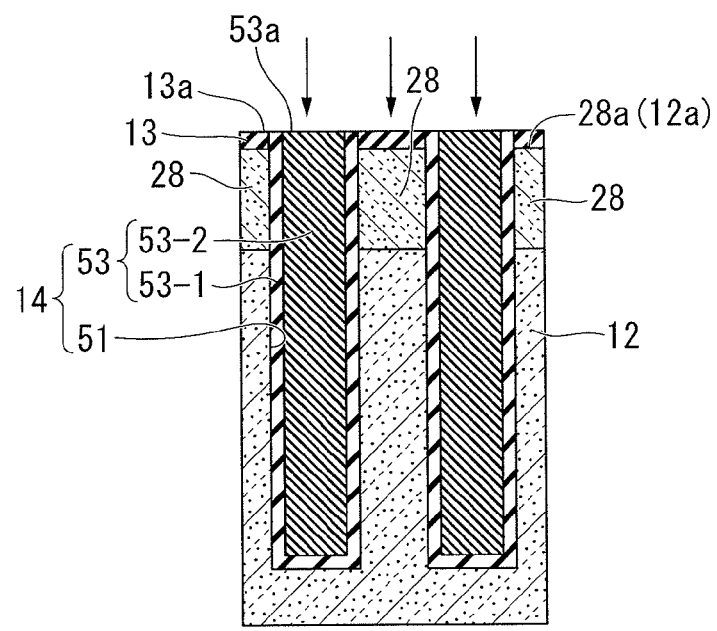
FIG. 16C is a fragmentary cross sectional elevation view, taken along a B-B line of FIG. 16A, illustrative of the same step as of FIG. 16A, subsequent to the step of FIGS. 15A through 15E, involved in the method of forming the memory cell area of the semiconductor device of FIGS. 1 and 2 in accordance with one or more embodiments of the present invention.
Figure 16D:
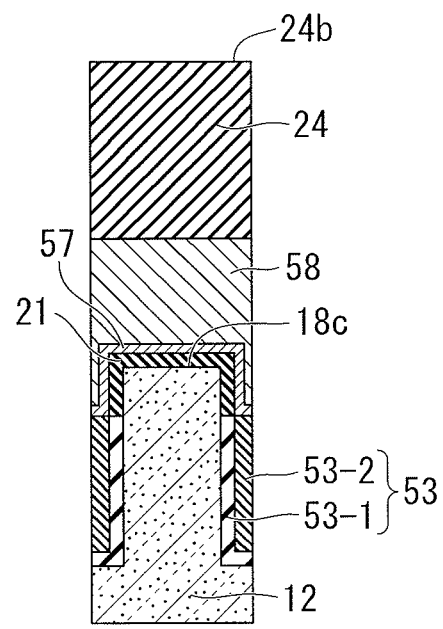
FIG. 16D is a fragmentary cross sectional elevation view, taken along a C-C line of FIG. 16A, illustrative of the same step as of FIG. 16A, subsequent to the step of FIGS. 15A through 15E, involved in the method of forming the memory cell area of the semiconductor device of FIGS. 1 and 2 in accordance with one or more embodiments of the present invention.
Figure 16E:
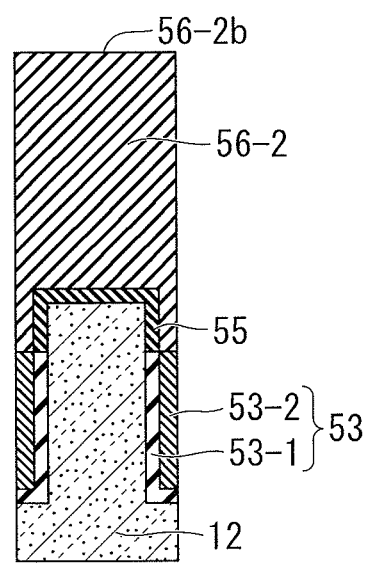
FIG. 16E is a fragmentary cross sectional elevation view, taken along a D-D line of FIG. 16A, illustrative of the same step as of FIG. 16A, subsequent to the step of FIGS. 15A through 15E, involved in the method of forming the memory cell area of the semiconductor device of FIGS. 1 and 2 in accordance with one or more embodiments of the present invention.

FIG. 16A is a plan view of a region in which the memory cell array is formed, FIG. 16B is a cross-sectional view taken along a line A-A of a structure shown in FIG. 16A, FIG. 16C is a cross-sectional view taken along a line B-B of the structure shown in FIG. 16A, FIG. 16D is a cross-sectional view taken along a line C-C of the structure shown in FIG. 16A, and FIG. 16E is a cross-sectional view taken along a line D-D of the structure shown in FIG. 16A.

Figure 17A:
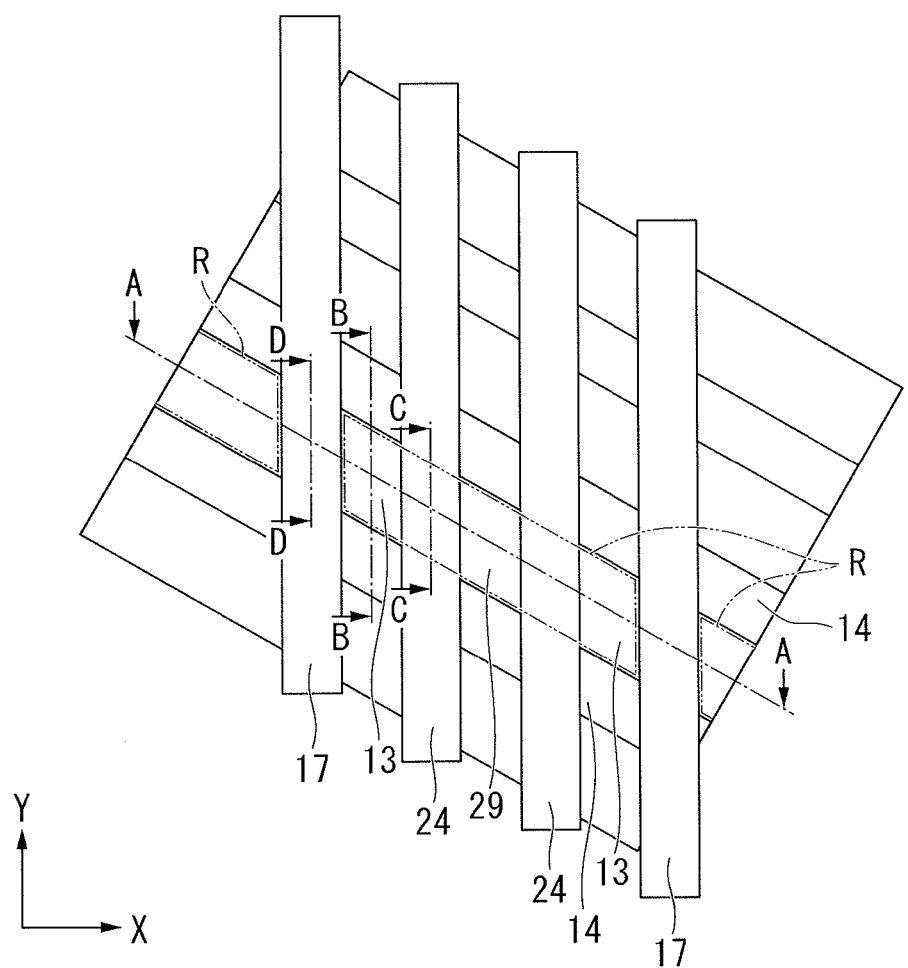
FIG. 17A is a fragmentary schematic plain view of a step, subsequent to the step of FIGS. 16A through 16E, involved in a method of forming the memory cell area of the semiconductor device of FIGS. 1 and 2 in accordance with one or more embodiments of the present invention.
Figure 17B:
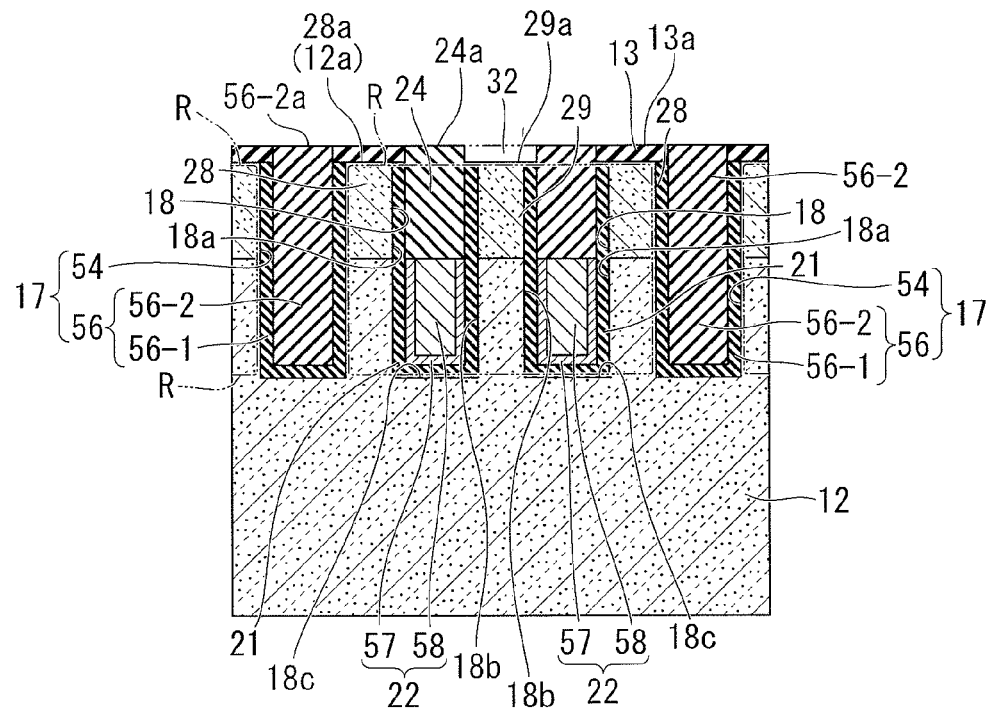
FIG. 17B is a fragmentary cross sectional elevation view, taken along an A-A line of FIG. 17A, illustrative of the same step as of FIG. 17A, subsequent to the step of FIGS. 16A through 16E, involved in the method of forming the memory cell area of the semiconductor device of FIGS. 1 and 2 in accordance with one or more embodiments of the present invention.
Figure 17C:
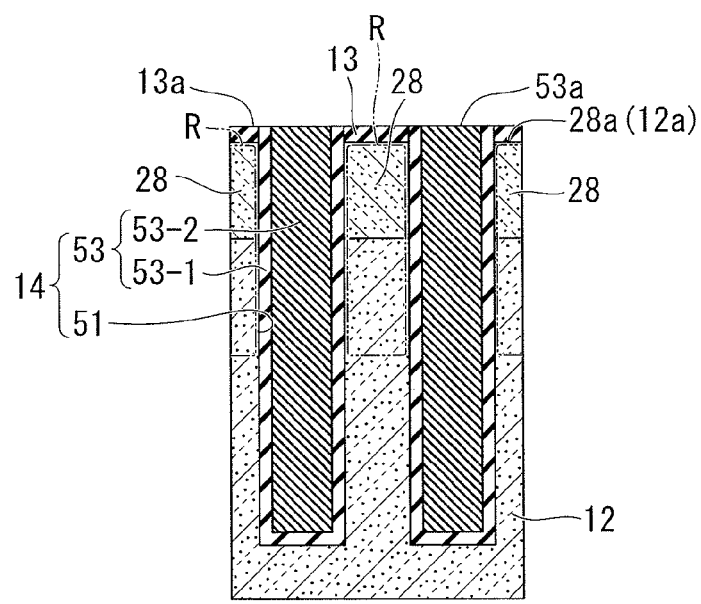
FIG. 17C is a fragmentary cross sectional elevation view, taken along a B-B line of FIG. 17A, illustrative of the same step as of FIG. 17A, subsequent to the step of FIGS. 16A through 16E, involved in the method of forming the memory cell area of the semiconductor device of FIGS. 1 and 2 in accordance with one or more embodiments of the present invention.
Figure 17D:
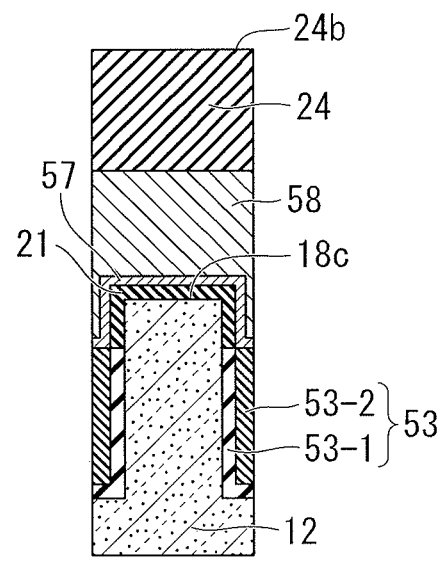
FIG. 17D is a fragmentary cross sectional elevation view, taken along a C-C line of FIG. 17A, illustrative of the same step as of FIG. 17A, subsequent to the step of FIGS. 16A through 16E, involved in the method of forming the memory cell area of the semiconductor device of FIGS. 1 and 2 in accordance with one or more embodiments of the present invention.
Figure 17E:
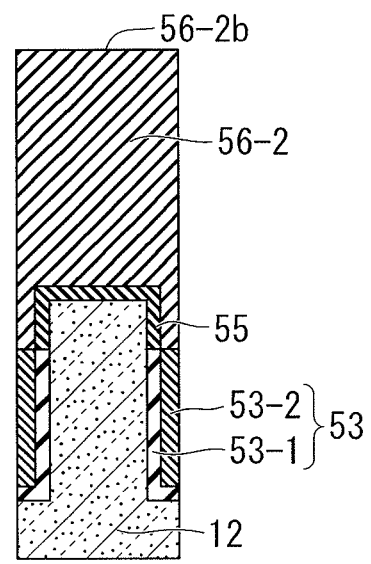
FIG. 17E is a fragmentary cross sectional elevation view, taken along a D-D line of FIG. 17A, illustrative of the same step as of FIG. 17A, subsequent to the step of FIGS. 16A through 16E, involved in the method of forming the memory cell area of the semiconductor device of FIGS. 1 and 2 in accordance with one or more embodiments of the present invention.

FIG. 17A is a plan view of a region in which the memory cell array is formed, FIG. 17B is a cross-sectional view taken along a line A-A of a structure shown in FIG. 17A, FIG. 17C is a cross-sectional view taken along a line B-B of the structure shown in FIG. 17A, FIG. 17D is a cross-sectional view taken along a line C-C of the structure shown in FIG. 17A, and FIG. 17E is a cross-sectional view taken along a line D-D of the structure shown in FIG. 17A.

FIGS. 18 through 21 are cross-sectional views corresponding to the cross-sectional view of the semiconductor device 10 of the first embodiment shown in FIG. 2.

Further, the lines A-A, B-B, C-C and D-D shown in FIGS. 3A through 3E, FIGS. 4A through 4E, FIGS. 5A through 5E, FIGS. 6A through 6E, FIGS. 7A through 7E, FIGS. 8A through 8E, FIGS. 9A through 9E, FIGS. 10A through 10E, FIGS. 11A through 11E, FIGS. 12A through 12E, FIGS. 13A through 13E, FIGS. 14A through 14E, FIGS. 15A through 15E, FIGS. 16A through 16E, and FIGS. 17A through 17E correspond to the lines A-A, B-B, C-C and D-D shown in FIG. 1, respectively.

A method of fabricating the semiconductor device 10 (specifically, memory cell array 11) according to the first embodiment will be described with reference to FIGS. 3A through 3E, FIGS. 4A through 4E, FIGS. 5A through 5E, FIGS. 6A through 6E, FIGS. 7A through 7E, FIGS. 8A through 8E, FIGS. 9A through 9E, FIGS. 10A through 10E, FIGS. 11A through 11E, FIGS. 12A through 12E, FIGS. 13A through 13E, FIGS. 14A through 14E, FIGS. 15A through 15E, FIGS. 16A through 16E, FIGS. 17A through 17E, FIG. 18, FIG. 19, FIG. 20, and FIG. 21.

First, in a process shown in FIGS. 3A through 3E, a p-type silicon substrate (of which a concentration of p-type impurities is, for example, $1E14$ cm$^{-3}$ to $1E15$ cm$^{-3}$) is prepared as the semiconductor substrate 12. Thereafter, a pad oxide film 13 is formed on the main surface 12a of the semiconductor substrate 12 and then a silicon nitride film 66 having trench-shaped openings 66a is formed on the pad oxide film 13.

In this case, a thickness of the pad oxide film 13 may be, for example, 5 nm. Further, a thickness of the silicon nitride film 66 may be, for example, 50 nm.

As shown in FIG. 3A, a plurality of openings 66a extend in a band shape in a direction (a first direction) tilted at a given angle in an X direction and are formed at given intervals in a Y direction.

Further, the opening 66a is formed to expose an upper surface of the pad oxide film 13 corresponding to a forming region of a first element isolation trench 51.

The opening 66a is formed by forming photoresist (not shown) patterned on the silicon nitride film 66 and etching the silicon nitride film 66 through anisotropic etching using the photoresist as a mask. The photoresist is removed after the opening 66a is formed.

Next, the semiconductor substrate 12 is etched by anisotropic etching (specifically, dry etching) using the silicon nitride film 66 having the openings 66a as a mask to thereby form the first element isolation trench 51 extending in the first direction.

A depth $D_1$ of the first element isolation trench 51 (a depth from a main surface 12a of the semiconductor substrate 12) may be, for example, 250 nm.

Next, in a process shown in FIGS. 4A through 4E, a thermal oxide film (silicon oxide film ($SiO_2$ film)) is formed as a first insulating film 53-1 covering an inner surface of the first element isolation trench 51, using a thermal oxidation method. In this case, the first insulating film 53-1 is formed to cover a side surface of the pad oxide film 13 and an upper surface and a side surface of the silicon nitride film 66. A thickness of the pad oxide film 13 may be, for example, 5 nm.

Thus, since the first insulating film 53-1 covering the inner surface of the first element isolation trench 51 is formed using the thermal oxidation method, a damaged layer formed on the inner surface of the first element isolation trench 51 can be taken in the first insulating film (i.e., the damaged layer on the inner surface of the first element isolation trench 51 can be removed) using dry etching when the first element isolation trench 51 is formed. Thus, a leak source can be reduced.

Next, in a process shown in FIGS. 5A through 5E, a first buried insulating film 53-2 is formed so that the first element isolation trench 51 is buried through the first insulating film 53-1 and an upper surface 53-2a of the first buried insulating film 53-2 is substantially flush with an upper surface 13a of the pad oxide film 13.

Specifically, the first element isolation trench 51 is buried with a silicon oxide film ($SiO_2$ film)) formed using a CVD method or an HDP (High Density Plasma) method or a coated silicon oxide film ($SiO_2$ film) formed using an SOG method through the first insulating film 53-1 to thereby form the first buried insulating film 53-2.

Next, the silicon oxide film ($SiO_2$ film) formed upward from the upper surface of the silicon nitride film 66 is removed using a CMP (Chemical Mechanical Polishing) method.

Then, an upper portion of the silicon oxide film ($SiO_2$ film) and an upper portion of the first insulating film 53-1 are etched using hydrogen fluoride (HF) to thereby form the first buried insulating film 53-2 having the upper surface 53-2a substantially flush with the upper surface 13a of the pad oxide film 13 in the first element isolation trench 51.

Thereby, a first element isolation region 14 consisting of the first element isolation trench 51, the first insulating film 53-1, and the first buried insulating film 53-2, having an upper surface 53a flush with the upper surface 13a of the pad insulating film 13, and partitioning a band-shaped active region 16 extending in the first direction is formed.

Then, the silicon nitride film 66 is removed by thermal phosphoric acid. Accordingly, the upper surface 13a of the pad oxide film 13 is exposed.

Next, in a process shown in FIGS. 6A through 6E, a mask insulating film 67 having trench-shaped openings 67A and 67B is formed on the upper surface 13a of the pad oxide film 13 and the upper surface 53a of the first element isolation insulating film 53 provided in a structure shown in FIGS. 5A through 5E.

Specifically, the mask insulating film 67 is formed by forming a silicon nitride film (a base material of the mask insulating film 67) covering the upper surface 13a of the pad oxide film 13 and the upper surface 53a of the first element isolation insulating film 53, forming photoresist (not shown) patterned on the silicon nitride film, and then processing the openings 67A and 67B through anisotropic etching using the photoresist as a mask.

In this case, a plurality of openings 67B are formed to extend in the Y direction (a second direction) and to be sandwiched between two openings 67A extending in the Y direction (see FIG. 6A).

Further, the opening 67A is formed to expose the upper surface 13a of the pad oxide film 13 corresponding to the forming region of the gate electrode trench 18, and the opening 67B is formed to expose the upper surface 13a of the pad oxide film 13 corresponding to the forming region of the second element isolation trench 54. Further, the photoresist (not shown) is removed after the openings 67A and 67B are formed.

Next, the semiconductor substrate 12 is etched by anisotropic etching (specifically, dry etching) using the mask insulating film 67 having the openings 67A and 67B as a mask to thereby form the gate electrode trench 18 and the second element isolation trench 54 extending in the Y direction and partitioning a part of the first element isolation region 14.

In this case, the two gate electrode trenches 18 are formed so that second side surfaces 18b face each other between the second element isolation trenches 54.

A depth $D_2$ of the gate electrode trench 18 (a depth from the main surface 12a of the semiconductor substrate 12 to a bottom 18c of the gate electrode trench 18) is smaller than that of the first element isolation trench 51 and is substantially the same as a depth $D_3$ of the second element isolation trench 54 (a depth from the main surface 12a of the semiconductor substrate 12 to a bottom 54a of the second element isolation trench 54).

If the depth of the first element isolation trench 51 is 250 nm, the depth $D_2$ of the gate electrode trench 18 and the depth $D_3$ of the second element isolation trench 54 may be, for example, 150 nm.

Further, when the semiconductor substrate 12 is subjected to dry etching, the first element isolation insulating film 53 (silicon oxide film ($SiO_2$ film)) is etched faster than silicon that is the semiconductor substrate 12. Thereby, as shown in FIGS. 6D and 6E, a portion in which the first element isolation insulating film 53 is formed in the gate electrode trench 18 and the second element isolation trench 54 is deeper than the depths $D_2$ and $D_3$ (specifically, deeper by about 50 nm)

Next, in a process shown in FIGS. 7A through 7E, a gate insulating film 21 covering inner surfaces of the gate electrode trench 18 (specifically, the bottom 18c and the side surfaces 18a and 18b), and a second insulating film 56-1 covering the inner surface of the second element isolation trench 54 are simultaneously formed using a thermal oxidation method.

For example, a silicon oxide film ($SiO_2$ film) of a single layer may be used as the gate insulating film 21 and the second insulating film 56-1. In this case, thicknesses of the gate insulating film 21 and the second insulating film 56-1 may be, for example, 5 nm.

Thus, since the second insulating film 56-1 covering the inner surface of the second element isolation trench 54 is formed using a thermal oxidation method, a damaged layer formed on the inner surface of the second element isolation trench 54 can be taken in the second insulating film 56-1 by dry etching when the second element isolation trench 54 is formed (i.e., the damaged layer on the inner surface of the second element isolation trench 54 can be removed). Thus, leak sources can be reduced.

Further, since the gate insulating film 21 and the second insulating film 56-1 are simultaneously formed, the number of fabrication processes is reduced in comparison with a case in which the gate insulating film 21 and the second insulating film 56-1 are formed in separate processes. Thus, it is possible to simplify the fabrication process of the semiconductor device 10.

Furthermore, a film (SiON film) formed by nitriding a silicon oxide film, a stacked silicon oxide film ($SiO_2$ film), a stacked film formed by stacking a silicon nitride film (SiN film) on a silicon oxide film ($SiO_2$ film), or the like may be used as the gate insulating film 21 and the second insulating film 56-1.

Next, in a process shown in FIGS. 8A through 8E, a first conductive film 57 and a second conductive film 58 are sequentially formed to bury the gate electrode trench 18 in which the gate insulating film 21 is formed and the second element isolation trench 54 in which the second insulating film 56-1 is formed. In this case, an upper surface of a structure shown in FIG. 8A is covered with the second conductive film 58.

Specifically, using a CVD method, a titanium nitride film (e.g., having a thickness of 5 nm) is formed as the first conductive film 57, and then a tungsten film (e.g., having a thickness of 100 nm) is formed as the second conductive film 58.

Next, in a process shown in FIGS. 9A through 9E, photoresist 72 having a trench-shaped opening 72a is formed on the second conductive film 58. In this case, the opening 72a is formed to expose an upper surface 58a of the second conductive film 58 located upward from the second element isolation trench 54.

Next, in a process shown in FIGS. 10A through 10E, the second conductive film 58 located below the opening 72a is etched by anisotropic etching (specifically, dry etching) using the photoresist 72 as a mask to thereby remove the second conductive film 58 formed in the second element isolation trench 54. Accordingly, the first conductive film 57 is left in the second element isolation trench 54.

Next, in a process shown in FIGS. 11A through 11E, the photoresist 72 is removed. Accordingly, the upper surface 58a of the second conductive film 58 is exposed.

Next, in a process shown in FIGS. 12A through 12E, the second conductive film 58 shown in FIGS. 11A through 11D is etched back over its entire surface to thereby leave the second conductive film 58 that is a component of the gate electrode 22 shown in FIG. 2 in a lower portion of the gate electrode trench 18.

In this case, the etch back is performed, for example, so that a depth $D_4$ from the main surface 12a of the semiconductor substrate 12 to the upper surface 58b of the second conductive film 58, which has been etched back, is 60 nm.

Next, in the process shown in FIGS. 13A through 13E, the first conductive film 57 shown in FIGS. 12A through 12C and FIG. 12E is etched back over its entire surface using the second conductive film 58 left in the gate electrode trench 18 as a mask to thereby leave the first conductive film 57 in a lower portion of the gate electrode trench 18 and remove the first conductive film 57 formed in a region other than the lower portion of the gate electrode trench 18.

Accordingly, the gate electrode 22 consisting of the first and second conductive films 57 and 58 is formed in the lower portion of the gate electrode trench 18 through the gate insulating film 21, and the first conductive film 57 formed in the second element isolation trench 54 is removed.

Next, in a process shown in FIGS. 14A through 14E, a buried insulating film 24 burying the gate electrode trench 18 and the opening 67A and having an upper surface 24b substantially flush with the upper surface 67a of the mask insulating film 67, and a second buried insulating film 56-2 burying the second element isolation trench 54 and the opening 67B and having an upper surface 56-2b substantially flush with the upper surface 67a of the mask insulating film 67 are simultaneously formed.

Specifically, first, a silicon oxide film 74 ($SiO_2$ film) burying the gate electrode trench 18, the second element isolation trench 54 and the openings 67A and 67B is formed using a CVD method, an HDP method or an SOG method. In this case, although not shown, the silicon oxide film 74 is also formed on the upper surface 67a of the mask insulating film 67.

Then, the silicon oxide film 74 formed upward from the upper surface 67a of the mask insulating film 67 is removed by a CMP method to thereby form the buried insulating film 24 and the second buried insulating film 56-2.

Next, in a process shown in FIGS. 15A through 15E, the mask insulating film 67 consisting of the silicon nitride film shown in FIGS. 14A through 14C is removed by thermal phosphoric acid. Accordingly, the upper surface 13a of the pad oxide film 13 is exposed.

Next, in a process shown in FIGS. 16A through 16E, impurities (in this case, n-type impurities) having a different conductivity type from those of the semiconductor substrate 12 are ion-implanted into the main surface 12a of the semiconductor substrate 12 from an upper surface of a structure shown in FIGS. 15B and 15C through the pad oxide film 13, to thereby simultaneously form first and second impurity diffusion regions 28 and 29 having upper surfaces 28a and 29a flush with the main surface 12a of the semiconductor substrate 12.

Specifically, the main surface 12a of the semiconductor substrate 12 is ion-implanted under conditions in which the n-type impurity is phosphorus (P), energy is 50 KeV, and a dose amount is $1E12$ cm$^{-2}$ to $1E14$ cm$^{-2}$, to thereby simultaneously form the first and second impurity diffusion regions 28 and 29.

In this case, the first impurity diffusion region 28 is formed in the semiconductor substrate 12 located between the second element isolation trench 54 and the gate electrode trench 18, and the second impurity diffusion region 29 is formed in the semiconductor substrate 12 located between the two gate electrode trenches 18.

Next, in a process shown in FIGS. 17A through 17E, the buried insulating film 24 and the second buried insulating film 56-2 protruding from the upper surface 13a of the pad oxide film 13 are removed to thereby bring the upper surface 24a of the buried insulating film 24 and the upper surface 56-2a of the second buried insulating film 56-2 substantially flush with the upper surface 13a of the pad oxide film 13.

Specifically, the buried insulating film 24 and the second buried insulating film 56-2 protruding from the upper surface 13a of the pad oxide film 13 are removed using a CMP method or a wet etching method to thereby planarize an upper surface of the structure shown in FIGS. 17A through 17E.

Accordingly, the second element isolation region 17 consisting of the second element isolation trench 54, the second insulating film 56-1 and the second buried insulating film 56-2 and partitioning the band-shaped active region 16 shown in FIGS. 5A through 5E into a plurality of element forming regions R by extending in the Y direction is formed.

Thus, the first element isolation trench 51 extending in the first direction is buried with the first element isolation insulating film 53 to form the first element isolation region 14 that partitions the band-shaped active region 16 having a plurality of element forming regions R (see FIGS. 5A through 5E). Then, the second element isolation trench 54 extending in the Y direction intersecting the first direction and partitioning a part of the first element isolation region 14 is formed and buried with the second element isolation insulating film 56 to thereby form the second element isolation region 17 that partitions the band-shaped active region 16 into a plurality of element forming regions R. Accordingly, the transistors 19-1 and 19-2 can be easily turned on and junction leak current can be suppressed in comparison with a case in which a dummy gate electrode (not shown) to which a reverse bias is applied through the gate insulating film 21 is formed in the second element isolation trench 54 to partition a plurality of element forming regions R. Thus, a data retention characteristic of the semiconductor device 10 can be improved.

Further, since it is unnecessary to form a wiring for applying a reverse bias (not shown) to a dummy gate electrode (not shown), which is required when the dummy gate electrode is formed, it is possible to achieve miniaturization of the semiconductor device 10.

Next, the pad oxide film 13 formed between the buried insulating films 24 is selectively removed to thereby form an opening 32 exposing an upper surface 29a of the second impurity diffusion region 29.

Specifically, photoresist (not shown) having a trench-shaped opening (not shown) that exposes the pad oxide film 13 formed between the buried insulating films 24 is formed on the pad oxide film 13 and then the pad oxide film 13 exposed from the trench-shaped opening is selectively etched (e.g., wet etched) to fault an opening 32 that exposes the upper surface 29a of the second impurity diffusion region 29. After the etching, the photoresist (not shown) is removed.

Alternatively, the pad oxide film 13 may be removed, a silicon oxide film (not shown) may be separately formed as an alternative to the pad oxide film 13, and then the silicon oxide film formed between the buried insulating films 24 may be removed to thereby form the opening 32 that exposes the upper surface 29a of the second impurity diffusion region 29.

Figure 18:
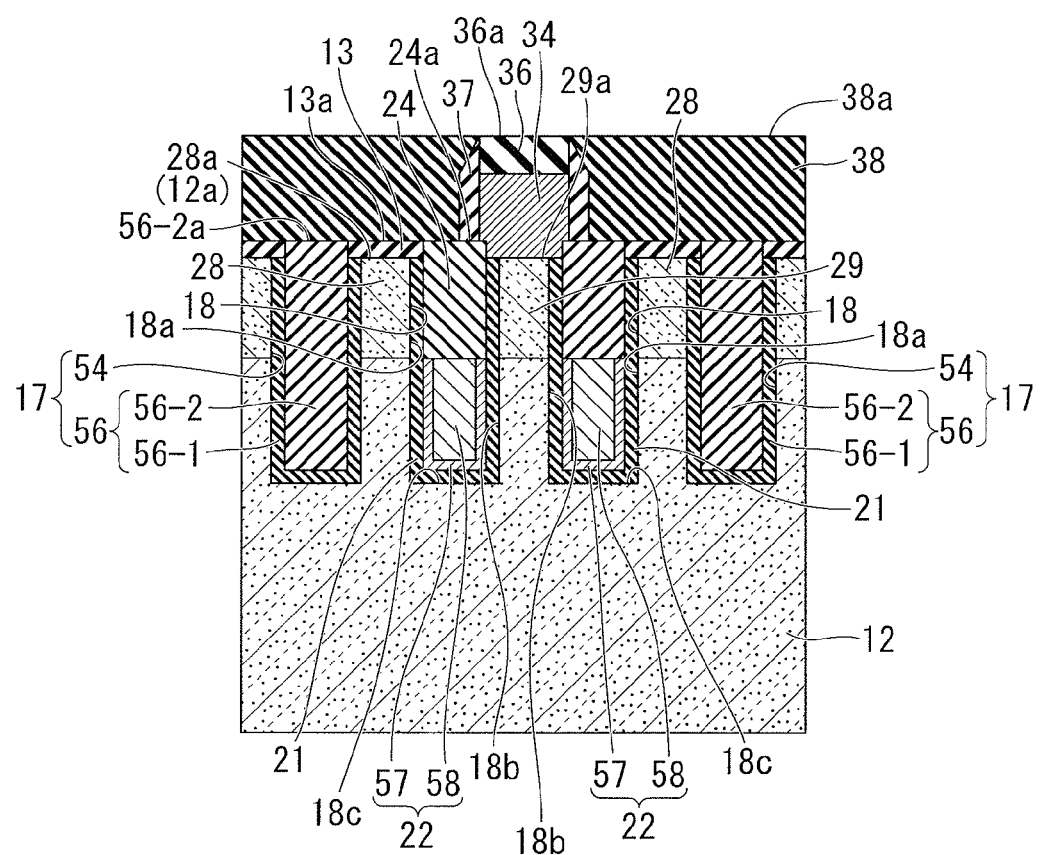
FIG. 18 is a fragmentary cross sectional elevation view, taken along an A-A line of FIG. 17A, subsequent to the step of FIGS. 17A through 17E, involved in the method of forming the memory cell area of the semiconductor device of FIGS. 1 and 2 in accordance with one or more embodiments of the present invention.

Next, in a process shown in FIG. 18, a bit line 34 that buries the opening 32 is formed on the upper surface 24a of the buried insulating film 24. Accordingly, the bit line 34 contacts the upper surface 29a of the second impurity diffusion region 29.

Specifically, a polysilicon film, a titanium nitride film, and a tungsten film that are not shown are sequentially formed on the upper surface 24a of the buried insulating film 24 to bury the opening 32.

Next, a silicon nitride film (SiN film) that is not shown and is a base material of the cap insulating film 36 is formed on the tungsten film that is not shown. Photoresist (not shown) covering the forming region of the bit line 34 is then formed on the silicon nitride film (SiN film) using photolithography technology.

Next, the silicon nitride.film (SiN film), the tungsten film, the titanium nitride film, and the polysilicon film are patterned by anisotropic etching (specifically, dry etching) using the photoresist as a mask to thereby simultaneously form the cap insulating film 36 consisting of the silicon nitride film (SiN film) and the bit line 34 consisting of the polysilicon film, the titanium nitride film and the tungsten film.

Next, a silicon nitride film (SiN film) and a silicon oxide film (SiO$_2$ film) that are not shown are sequentially formed to cover a side surface of the bit line 34, and the cap insulating film 36, and then the silicon oxide film (SiO$_2$ film) and the silicon nitride film (SiN film) are etched back over their entire surfaces to thereby form a sidewall film 37 that covers the side surface of the cap insulating film 36 and the side surface of the bit line 34

Thus, since the silicon nitride film (SiN film) and the silicon oxide film (SiO$_2$ film) are sequentially stacked to thereby form the sidewall film 37, wettability of the silicon oxide film (coated insulating film) is enhanced when a coated insulating film (specifically, silicon oxide film (SiO$_2$ film)) formed as the interlayer insulating film 38 using an SOG method is formed. Thus, generation of voids in the silicon oxide film (coated insulating film) can be suppressed.

Next, the upper surface 13a of the pad oxide film 13, the upper surface 24a of the buried insulating film 24, and the upper surface 56-2a of the second buried insulating film 56-2 are covered with the sidewall film 37, and an interlayer insulating film 38 having an upper surface 38a flush with the upper surface 36a of the cap insulating film 36 is formed. Accordingly, the upper surface 36a of the cap insulating film 36 is exposed from the interlayer insulating film 38.

Specifically, the upper surface 13a of the pad oxide film 13, the upper surface 24a of the buried insulating film 24, and the upper surface 56-2a of the second buried insulating film 56-2 are coated with a coated insulating film (silicon oxide film (SiO$_2$ film)) using an SOG method so that the sidewall film 37 is covered, and then, heat treatment is performed to thereby make film quality of the silicon oxide film (coated insulating film) dense.

Further, when the silicon oxide film (coated insulating film) is formed using the SOG method, coating liquid containing polysilazane is used. Further, the heat treatment may be performed in a steam atmosphere.

Next, polishing of the heat-treated silicon oxide film (coated insulating film) is performed using a CMP method until the upper surface 36a of the cap insulating film 36 is exposed. Accordingly, the interlayer insulating film 38 having the upper surface 38a substantially flush with the upper surface 36a of the cap insulating film 36 is formed.

Further, in a structure shown in FIG. 13, although not shown, a silicon oxide film (SiO$_2$ film) covering the upper surface 36a of the cap insulating film 36 and the upper surface 38a of the interlayer insulating film 38 may be formed using the CVD method after the silicon oxide film (coated insulating film) is polished.

Figure 19:
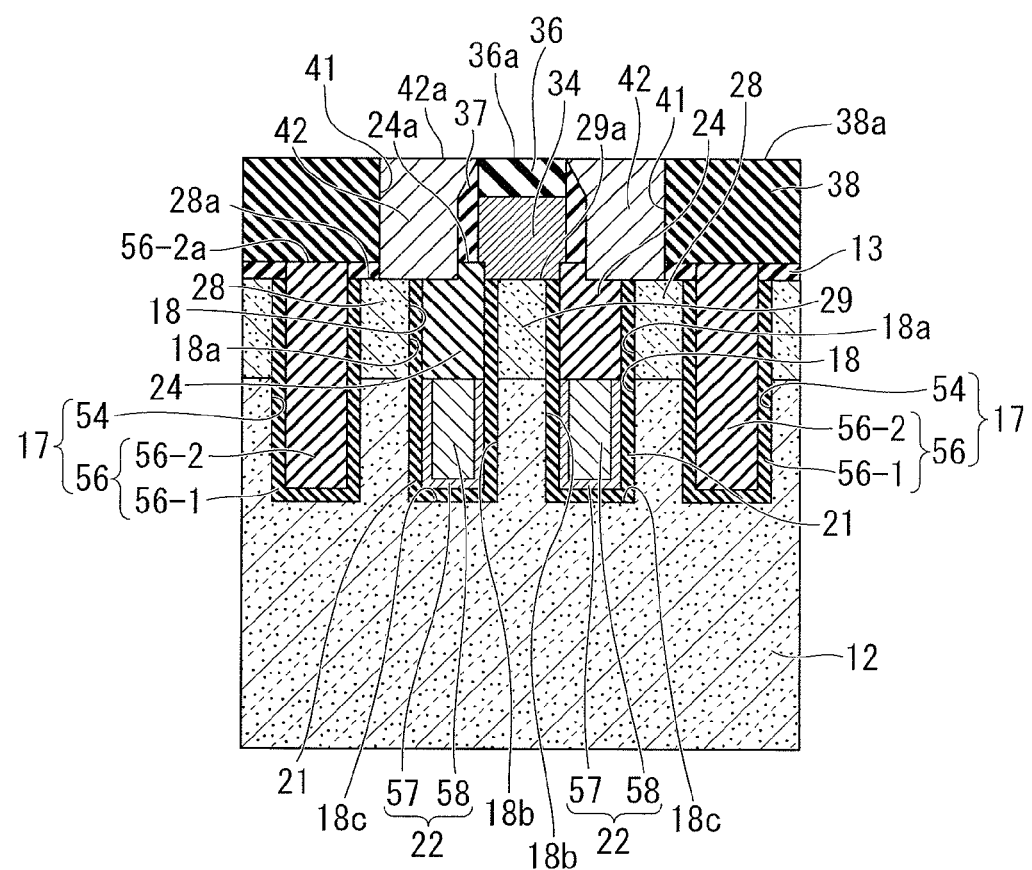
FIG. 19 is a fragmentary cross sectional elevation view, taken along an A-A line of FIG. 17A, subsequent to the step of FIG. 18, involved in the method of forming the memory cell area of the semiconductor device of FIGS. 1 and 2 in accordance with one or more embodiments of the present invention.

Next, in a process shown in FIG. 19, the interlayer insulating film 38, the buried insulating film 24, and the pad oxide film 13 are anisotropically etched (specifically, dry etched) using a SAC (Self Aligned Contact) method to thereby form a contact hole 41, which exposes a part of the upper surface 28a of the first impurity diffusion region 28. Next, a contact plug 42 having an upper surface 42a substantially flush with the upper surface 38a of the interlayer insulating film 38 and a lower end contacting the upper surface 28a of the first impurity diffusion region 28 is formed in the contact hole 41.

Specifically, a titanium nitride film (not shown) and a tungsten film (not shown) are sequentially stacked using a CVD method to bury the contact hole 41, and then an unnecessary titanium nitride film and tungsten film formed on the upper surface 38a of the interlayer insulating film 38 are removed through polishing using a CMP method to thereby form the contact plug 42 consisting of the titanium nitride film and the tungsten film in the contact hole 41.

Figure 20:
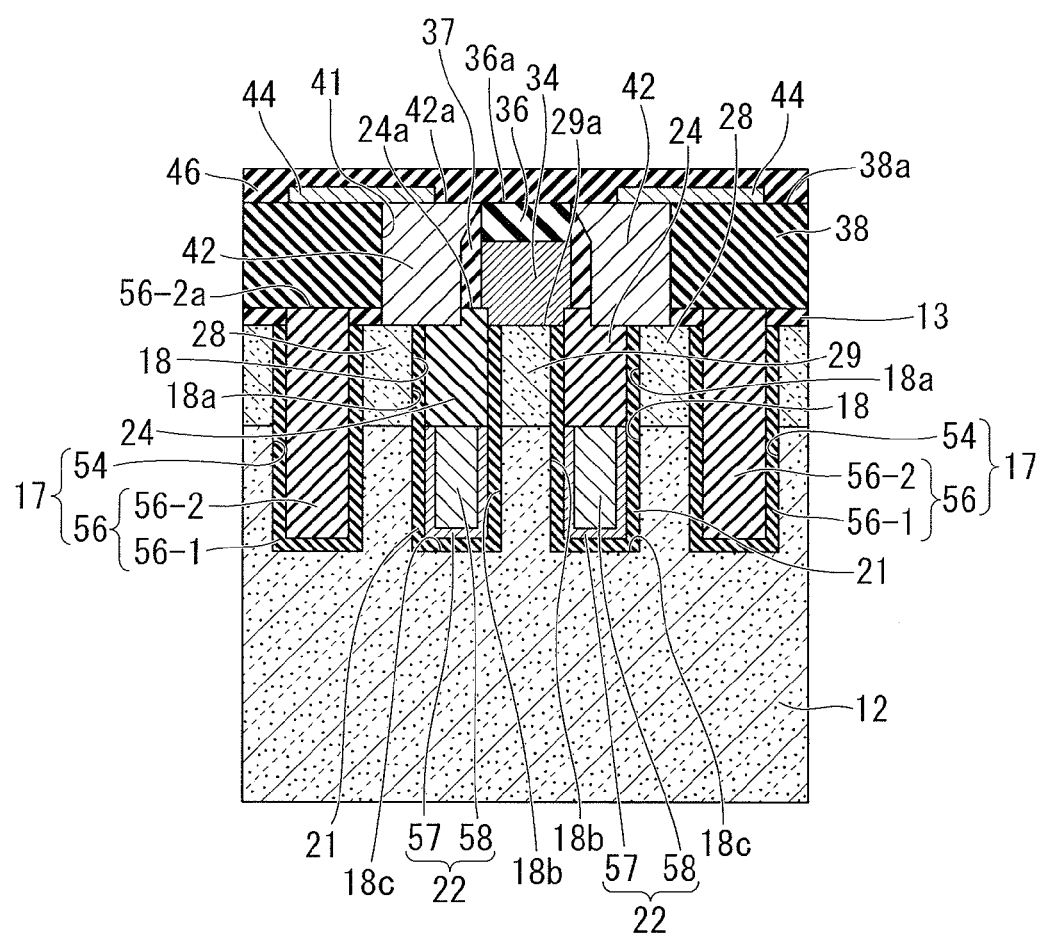
FIG. 20 is a fragmentary cross sectional elevation view, taken along an A-A line of FIG. 17A, subsequent to the step of FIG. 19, involved in the method of forming the memory cell area of the semiconductor device of FIGS. 1 and 2 in accordance with one or more embodiments of the present invention.

Next, in a process shown in FIG. 20, a capacitive contact pad 44 contacting a part of the upper surface 42a of the contact plug 42 is formed on the upper surface 38a of the interlayer insulating film 38.

Specifically, a metal film (not shown) that is a base material of the capacitive contact pad 44 is formed to cover the upper surface 36a of the cap insulating film 36, the upper surface 42a of the contact plug 42, and the upper surface 38a of the interlayer insulating film 38.

Next, photoresist (not shown) covering a surface corresponding to the forming region of the capacitive contact pad 44 of an upper surface of the metal film is formed using photolithography technology. An unnecessary metal film exposed from the photoresist is then removed by dry etching using the photoresist as a mask to thereby form the capacitive contact pad 44 consisting of the metal film. After the capacitive contact pad 44 is formed, the photoresist (not shown) is removed.

Next, a silicon nitride film 46 covering the capacitive contact pad 44 is formed on the upper surface 36a of the cap insulating film 36, the upper surface 42a of the contact plug 42, and the upper surface 38a of the interlayer insulating film 38.

Figure 21:
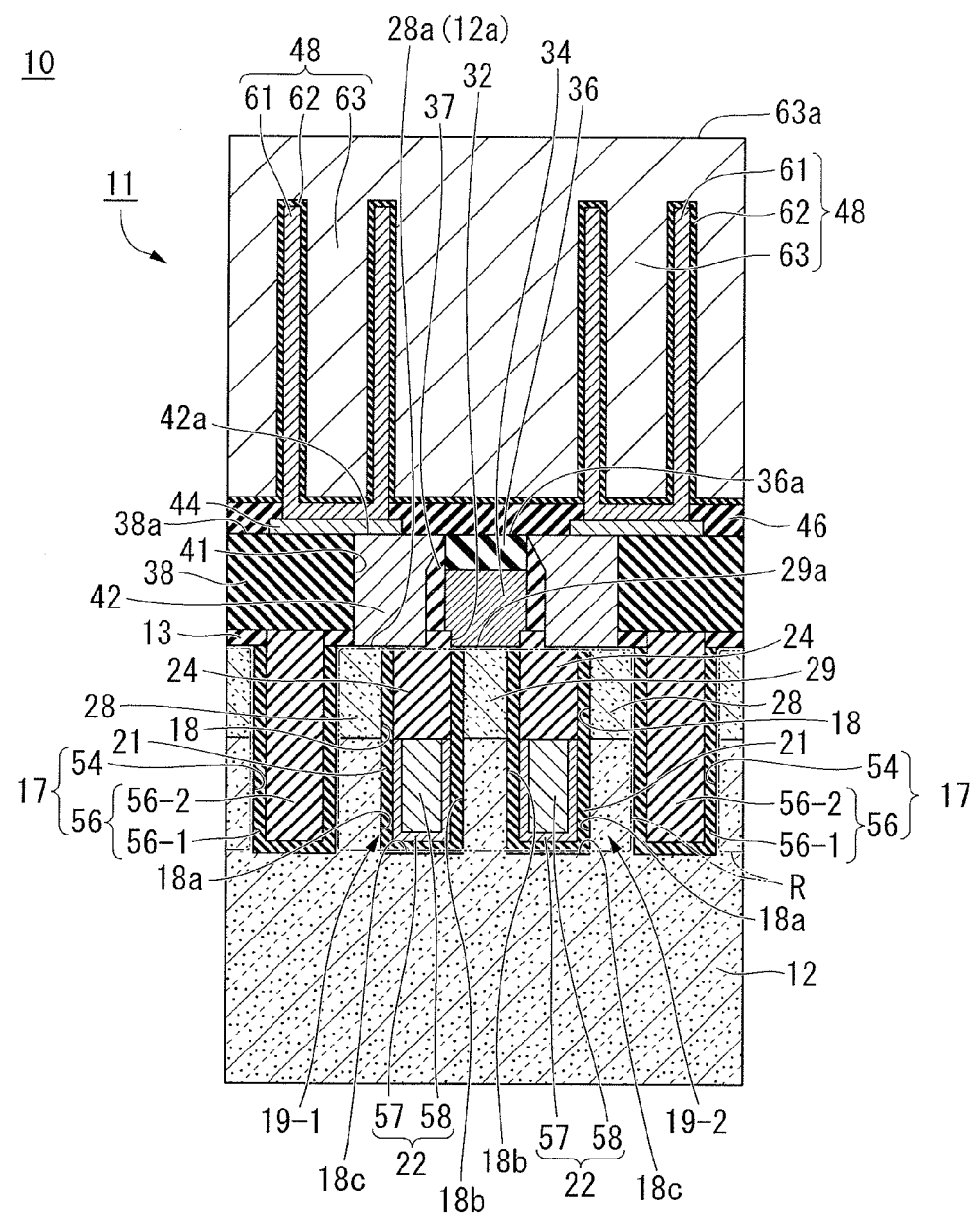
FIG. 21 is a fragmentary cross sectional elevation view, taken along an A-A line of FIG. 17A, subsequent to the step of FIG. 20, involved in the method of forming the memory cell area of the semiconductor device of FIGS. 1 and 2 in accordance with one or more embodiments of the present invention.

Next, in a process shown in FIG. 21, a silicon oxide film (SiO$_2$ film) that is not shown and has a great thickness is formed on the silicon nitride film 46. The thickness of the silicon oxide film (SiO$_2$ film) may be, for example, 1500 nm.

Next, photoresist (not shown) patterned on the silicon oxide film (SiO$_2$ film) is formed using photolithography technology. A silicon oxide film (not shown) and the silicon nitride film 46 formed on the capacitive contact pad 44 are then etched by dry etching using the photoresist as a mask to thereby form a cylindrical hole (not shown) exposing the capacitive contact pad 44. The photoresist (not shown) is then removed.

Next, a conductive film (e.g., titanium nitride film) is formed on an inner surface of the cylindrical hole (not shown) and an upper surface of the capacitive contact pad 44 to thereby form a lower electrode 61 that consists of the conductive film and is crown-shaped.

Next, the silicon oxide film (not shown) is removed using wet etching to thereby expose the upper surface of the silicon nitride film 46. A capacitive insulating film 62 covering the upper surface of the silicon nitride film 46 and the lower electrode 61 is then formed.

Next, an upper electrode 63 is formed to cover the surface of the capacitive insulating film 62. In this case, the upper electrode 63 is formed so that an upper surface 63a of the upper electrode 63 is arranged upward from the capacitive insulating film 62. Accordingly, a capacitor 48 consisting of the lower electrode 61, the capacitive insulating film 62, and the upper electrode 63 is formed on each capacitive contact pad 44. Thus, the semiconductor device 10 of the first embodiment is fabricated.

Further, in fact, an interlayer insulating film, a via, and a wiring that are not shown are formed on the upper surface 63a of the upper electrode 63.

According to the method of fabricating the semiconductor device of the first embodiment, as described above, the first element isolation trench 51 extending in the first direction is buried with the first element isolation insulating film 53 to thereby form the first element isolation region 14, which partitions the band-shaped active region 16 having the plurality of element forming regions R (see FIGS. 5A through 5E). Thereafter, the second element isolation trench 54 extending in the Y direction intersecting the first direction and partitioning a part of the first element isolation region 14 is formed and buried with the second element isolation insulating film 56 to thereby form the second element isolation region 17 partitioning the band-shaped active region 16 into the plurality of element forming regions R. Accordingly, the transistors 19-1 and 19-2 can be easily turned on and junction leak current can be suppressed in comparison with a case in which a dummy gate electrode (not shown) to which a reverse bias is applied through the gate insulating film 21 is formed in the second element isolation trench 54 to partition a plurality of element forming regions R. Thus, it is possible to improve a data retention characteristic of the semiconductor device 10.

Further, since it is unnecessary to form a wiring for applying a reverse bias (not shown) to a dummy gate electrode (not shown), which is required when a dummy gate electrode is formed, it is possible to achieve miniaturization of the semiconductor device 10.

While the case in which silicon oxide film (SiO$_2$ film) is used as the buried insulating film 24 and the silicon nitride film (SiN film) is used as the mask insulating film 67 has been described by way of example in the first embodiment, a silicon nitride film (SiN film) may be used as the buried insulating film 24 and a silicon oxide film (SiO$_2$ film) may be used as the mask insulating film 67.

Accordingly, in the process shown in FIG. 19, which has been previously described, when the contact hole 41 is formed, the silicon nitride film (SiN film), which is the buried insulating film 24, functions as an etching stopper. Thereby, since the contact hole 41 does not reach the gate electrode 22, the capacitive contact pad 44 and the gate electrode 22 can be prevented from being conducted via the contact plug 42 formed in the contact hole 41.

FIGS. 22A through 22E and FIGS. 23A through 23E are diagrams showing a process of fabricating a first variant of the memory cell array provided in the semiconductor device according to the first embodiment of the present invention.

Figure 22A:
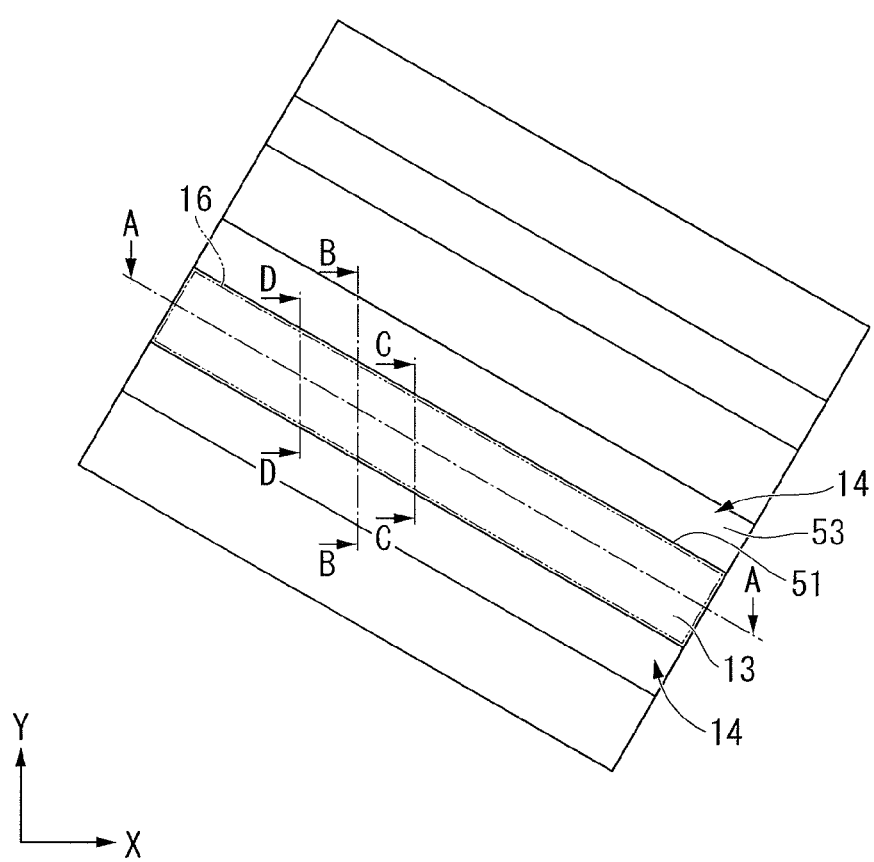
FIG. 22A is a fragmentary schematic plain view of a step involved in a method of forming the memory cell area of the semiconductor device of FIGS. 1 and 2 in accordance with one or more modified embodiments of the present invention.
Figure 22B:
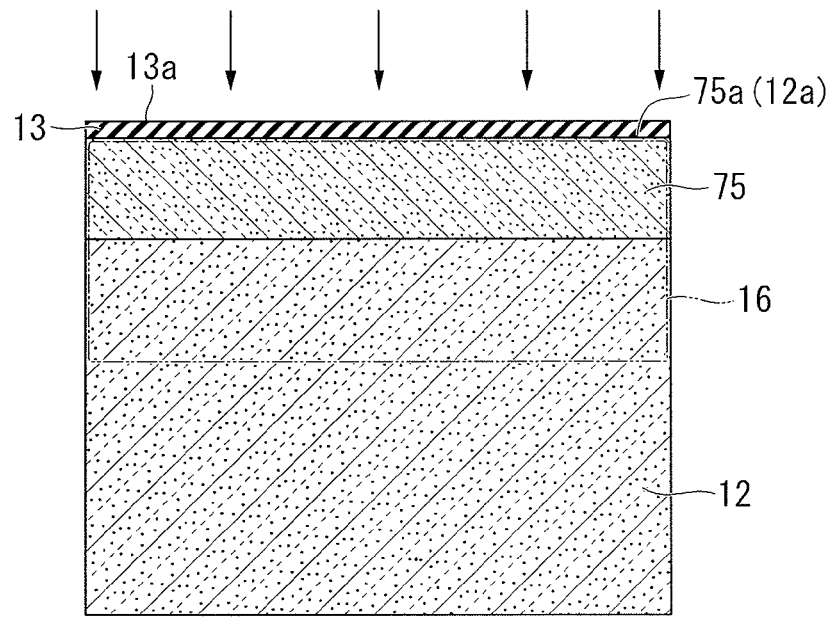
FIG. 22B is a fragmentary cross sectional elevation view, taken along an A-A line of FIG. 22A, illustrative of the same step as of FIG. 22A, involved in the method of forming the memory cell area of the semiconductor device of FIGS. 1 and 2 in accordance with one or more embodiments of the present invention.
Figure 22C:
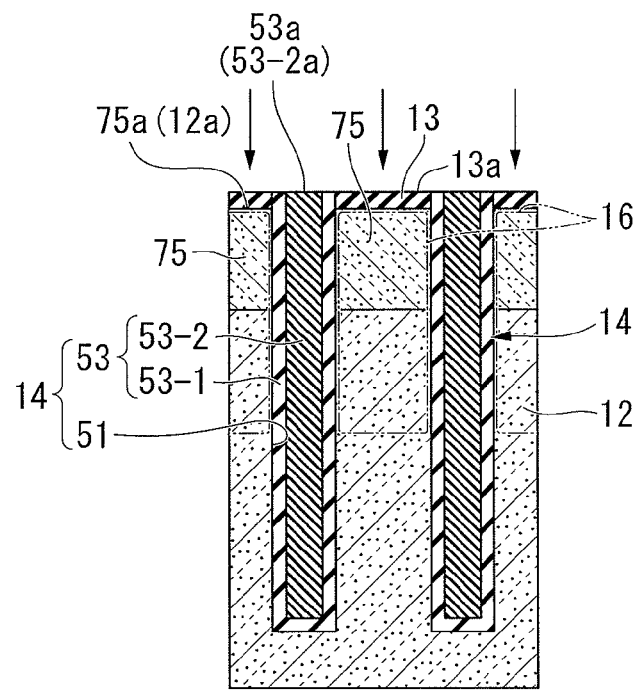
FIG. 22C is a fragmentary cross sectional elevation view, taken along a B-B line of FIG. 22A, illustrative of the same step as of FIG. 22A, involved in the method of forming the memory cell area of the semiconductor device of FIGS. 1 and 2 in accordance with one or more embodiments of the present invention.
Figure 22D:
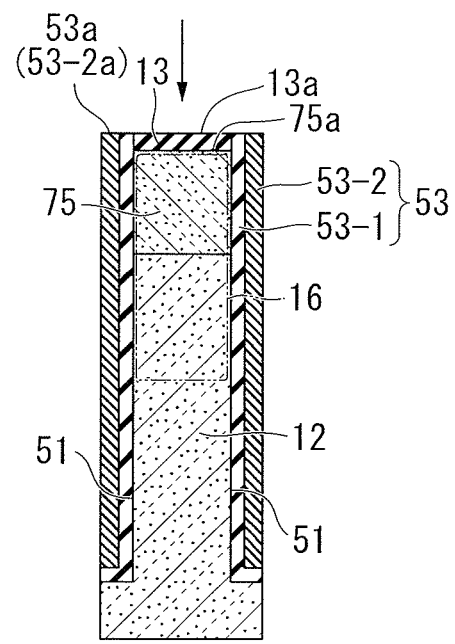
FIG. 22D is a fragmentary cross sectional elevation view, taken along a C-C line of FIG. 22A, illustrative of the same step as of FIG. 22A, involved in the method of forming the memory cell area of the semiconductor device of FIGS. 1 and 2 in accordance with one or more embodiments of the present invention.
Figure 22E:
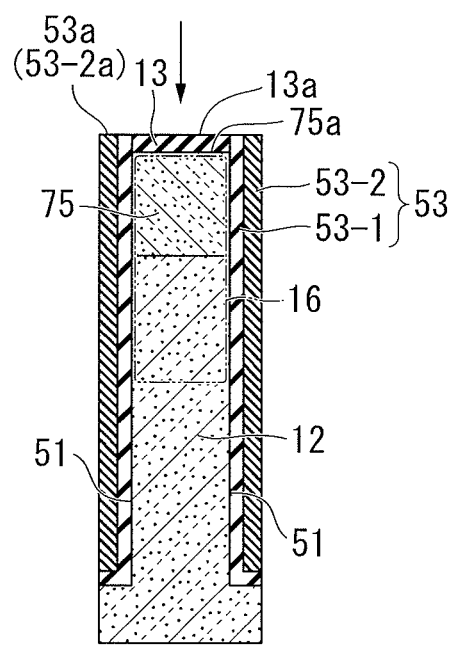
FIG. 22E is a fragmentary cross sectional elevation view, taken along a D-D line of FIG. 22A, illustrative of the same step as of FIG. 22A, involved in the method of forming the memory cell area of the semiconductor device of FIGS. 1 and 2 in accordance with one or more embodiments of the present invention.

FIG. 22A is a plan view of a region in which the memory cell array is formed, FIG. 22B is a cross-sectional view taken along a line A-A of a structure shown in FIG. 22A, FIG. 22C is a cross-sectional view taken along a line B-B of the structure shown in FIG. 22A, FIG. 22D is a cross-sectional view taken along a line C-C of the structure shown in FIG. 22A, and FIG. 22E is a cross-sectional view taken along a line D-D of the structure shown in FIG. 22A.

Figure 23A:
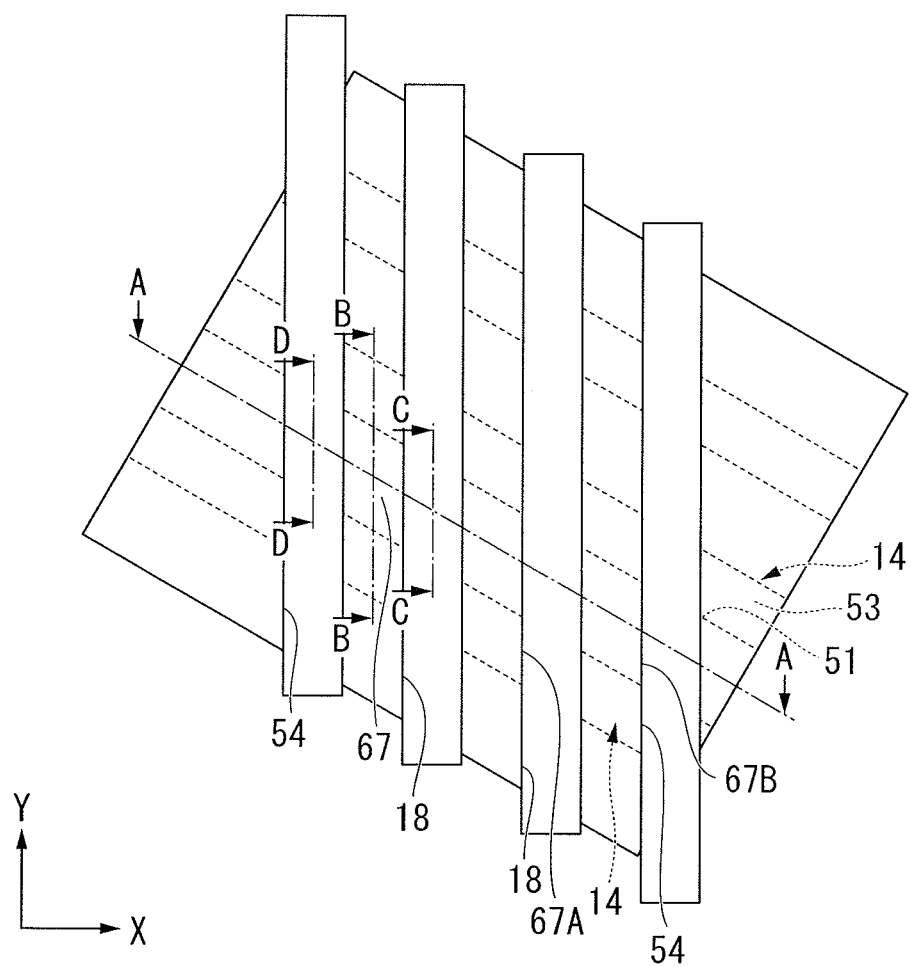
FIG. 23A is a fragmentary schematic plain view of a step, subsequent to the step of FIGS. 22A through 22E, involved in a method of forming the memory cell area of the semiconductor device of FIGS. 1 and 2 in accordance with one or more embodiments of the present invention.
Figure 23B:
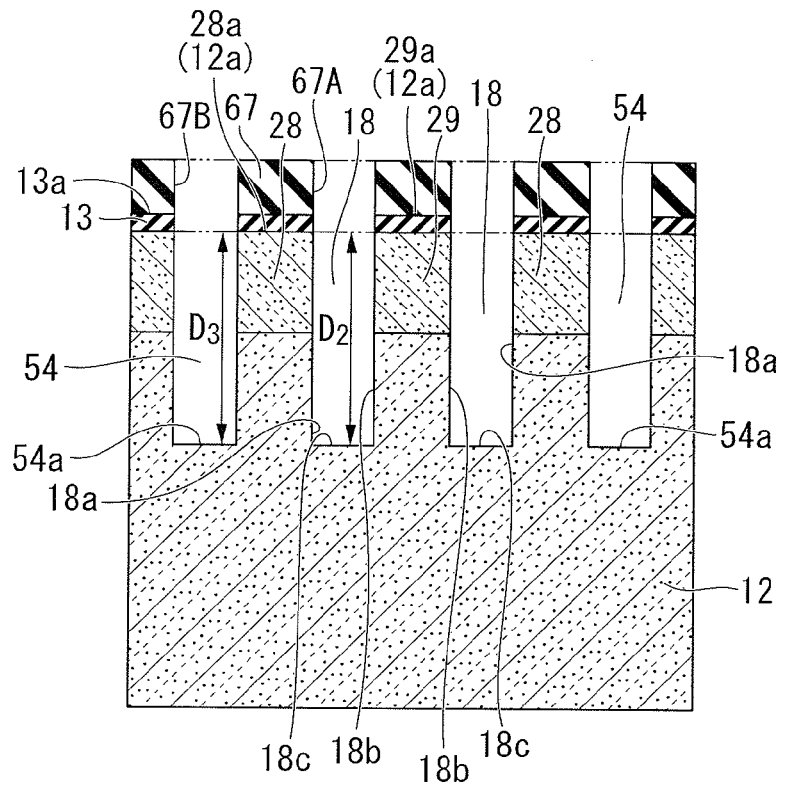
FIG. 23B is a fragmentary cross sectional elevation view, taken along an A-A line of FIG. 23A, illustrative of the same step as of FIG. 23A, subsequent to the step of FIGS. 22A through 22E, involved in the method of forming the memory cell area of the semiconductor device of FIGS. 1 and 2 in accordance with one or more modified embodiments of the present invention.
Figure 23C:
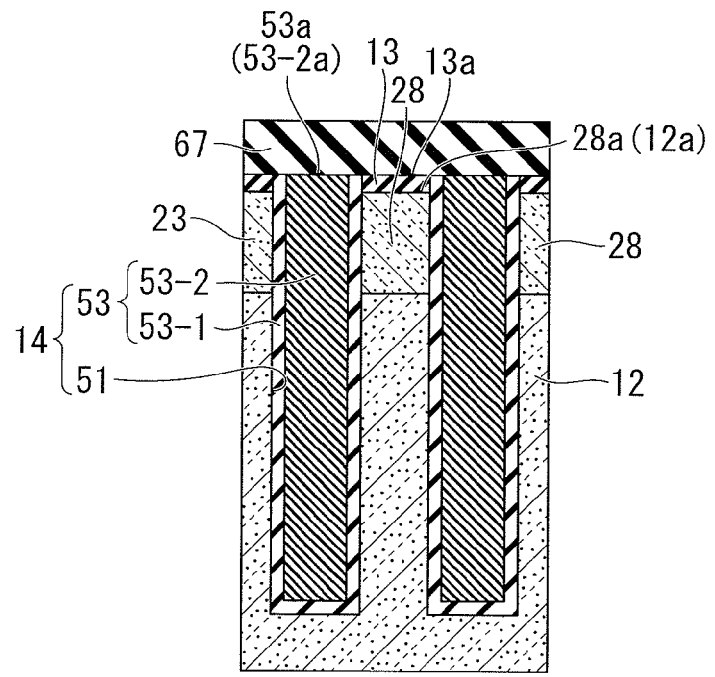
FIG. 23C is a fragmentary cross sectional elevation view, taken along a B-B line of FIG. 23A, illustrative of the same step as of FIG. 23A, subsequent to the step of FIGS. 22A through 22E, involved in the method of forming the memory cell area of the semiconductor device of FIGS. 1 and 2 in accordance with one or more modified embodiments of the present invention.
Figure 23D:
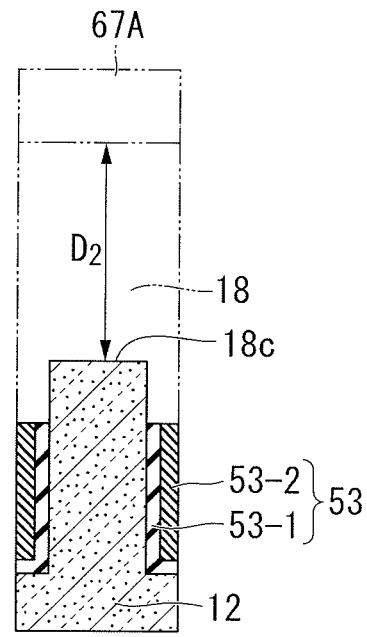
FIG. 23D is a fragmentary cross sectional elevation view, taken along a C-C line of FIG. 23A, illustrative of the same step as of FIG. 23A, subsequent to the step of FIGS. 22A through 22E, involved in the method of forming the memory cell area of the semiconductor device of FIGS. 1 and 2 in accordance with one or more modified embodiments of the present invention.
Figure 23E:
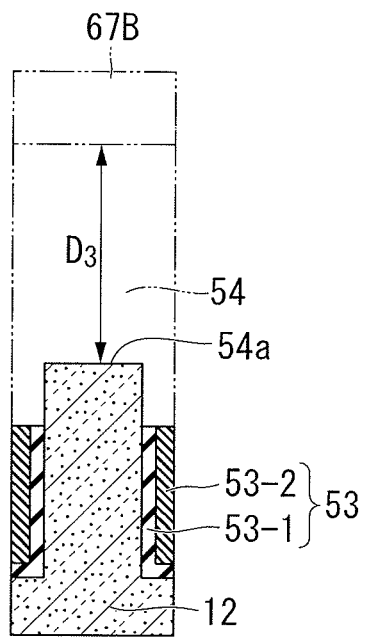
FIG. 23E is a fragmentary cross sectional elevation view, taken along a D-D line of FIG. 23A, illustrative of the same step as of FIG. 23A, subsequent to the step of FIGS. 22A through 22E, involved in the method of forming the memory cell area of the semiconductor device of FIGS. 1 and 2 in accordance with one or more modified embodiments of the present invention.

FIG. 23A is a plan view of a region in which the memory cell array is formed, FIG. 23B is a cross-sectional view taken along a line A-A of a structure shown in FIG. 23A, FIG. 23C is a cross-sectional view taken along a line B-B of the structure shown in FIG. 23A, FIG. 23D is a cross-sectional view taken along a line C-C of the structure shown in FIG. 23A, and FIG. 23E is a cross-sectional view taken along a line D-D of the structure shown in FIG. 23A.

Further, positions of the lines A-A, B-B, C-C and D-D shown in FIGS. 22A through 22E and FIGS. 23A through 23E correspond to those of the lines A-A, B-B, C-C and D-D shown in FIG. 1, respectively.

Next, a method of fabricating the first variant of the semiconductor device 10 (specifically, memory cell array 11) according to the first embodiment will be described with main reference to FIGS. 22A through 22E and FIGS. 23A through 23E.

First, the processes from the process shown in FIGS. 3A through 3E to the process shown in FIGS. 5A through 5E, which have been previously described, are performed to form the structure shown in FIGS. 5A through 5E.

Next, in a process shown in FIGS. 22A through 22E, impurities having a different conductivity type from those of the semiconductor substrate 12 (in this case, n-type impurities) are ion-implanted into the main surface 12a of the semiconductor substrate 12 through the pad oxide film 13 to thereby form an impurity diffusion region 75 having an upper surface 75a flush with the main surface 12a of the semiconductor substrate 12.

Specifically, phosphorus (P) is ion-implanted as the n-type impurities into the main surface 12a of the semiconductor substrate 12 under conditions that energy is 50 KeV and a dose amount is 1E12 cm$^{-2}$ to 1E14 cm$^{-2}$ to thereby form the impurity diffusion region 75. The impurity diffusion region 75 is a region that is a base material of the first and second impurity diffusion regions 28 and 29.

Next, in a process shown in FIGS. 23A through 23E, the same process as the process shown in FIGS. 6A through 6E, which has been previously described, is performed to thereby form the gate electrode trench 18 and the second element isolation trench 54 so that the impurity diffusion region 75 shown in FIGS. 26B through 26E is partitioned. Thereby, the gate electrode trench 18, the second element isolation trench 54, and the first and second impurity diffusion regions 28 and 29 are formed.

Then, the processes from the process shown in FIGS. 7A through 7E to the process shown in FIG. 21 (here, except for the process of forming the first and second impurity diffusion regions 28 and 29), which have been previously described, are sequentially performed to thereby fabricate the semiconductor device 10 of the first embodiment shown in FIG. 2.

Thus, after the first element isolation region 14 is formed, the impurity diffusion region 75 that is a base material of the first and second impurity diffusion regions 28 and 29 may be formed in the semiconductor substrate 12, and then, the gate electrode trench 18 and the second element isolation trench 54 may be formed so that the impurity diffusion region 75 is partitioned, to thereby form the first and second impurity diffusion regions 28 and 29.

In this case, the same effects as those of the method of fabricating the semiconductor device 10 of the first embodiment can be obtained.

FIGS. 24A through 24E, FIGS. 25A through 25E, FIGS. 26A through 26E, and FIGS. 27A through 27E are diagrams showing a process of fabricating a second variant of the memory cell array provided in the semiconductor device according to the first embodiment of the present invention.

Figure 24A:
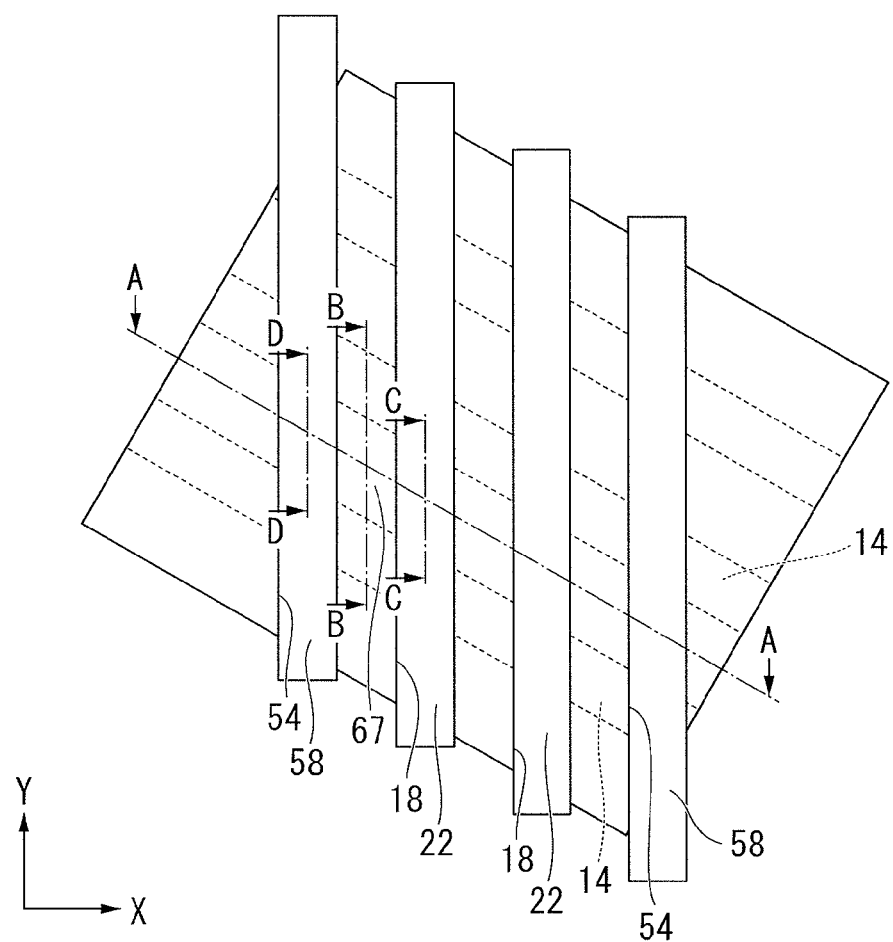
FIG. 24A is a fragmentary schematic plain view of a step involved in a method of forming the memory cell area of the semiconductor device of FIGS. 1 and 2 in accordance with one or more other modified embodiments of the present invention.
Figure 24B:
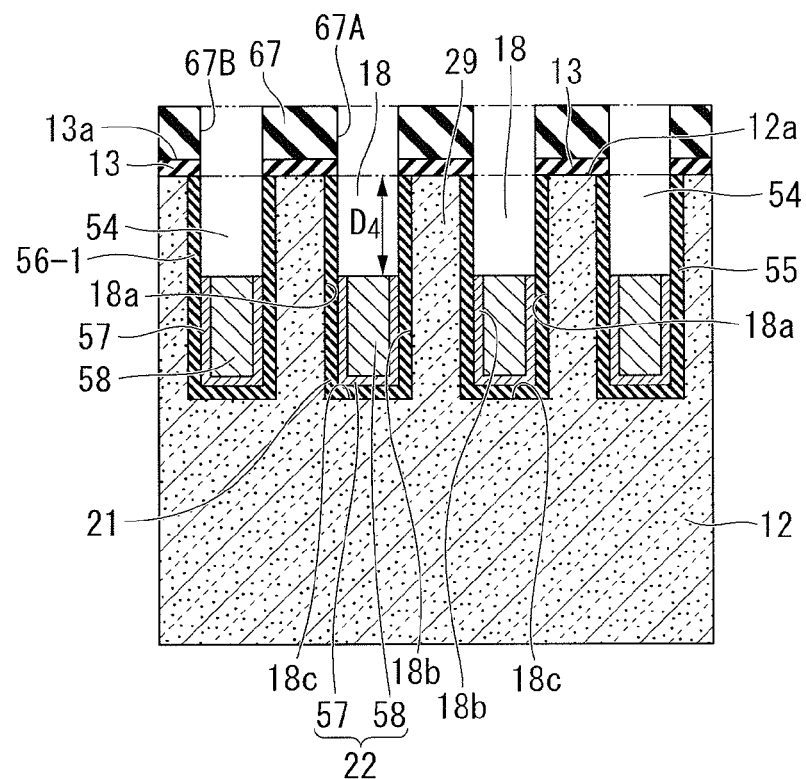
FIG. 24B is a fragmentary cross sectional elevation view, taken along an A-A line of FIG. 22A, illustrative of the same step as of FIG. 22A, involved in the method of forming the memory cell area of the semiconductor device of FIGS. 1 and 2 in accordance with one or more other modified embodiments of the present invention.
Figure 24C:
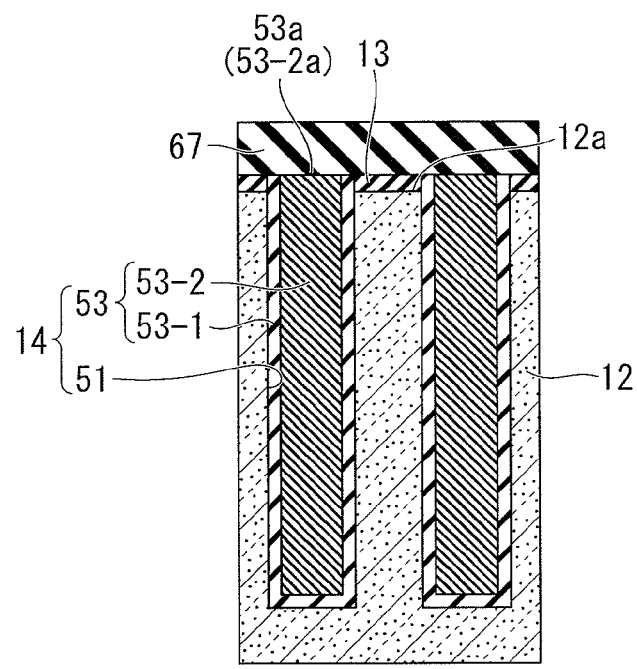
FIG. 24C is a fragmentary cross sectional elevation view, taken along a B-B line of FIG. 22A, illustrative of the same step as of FIG. 22A, involved in the method of forming the memory cell area of the semiconductor device of FIGS. 1 and 2 in accordance with one or more other modified embodiments of the present invention.
Figure 24D:
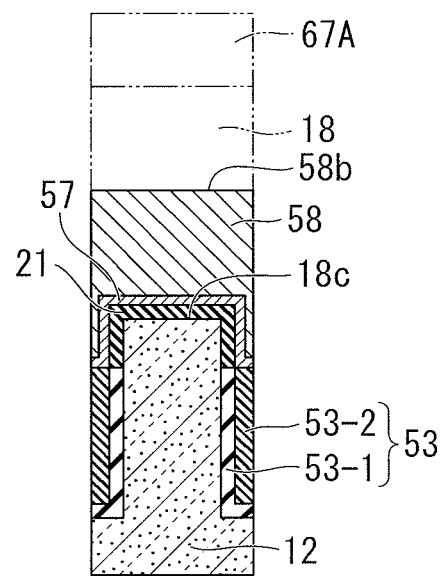
FIG. 24D is a fragmentary cross sectional elevation view, taken along a C-C line of FIG. 22A, illustrative of the same step as of FIG. 22A, involved in the method of forming the memory cell area of the semiconductor device of FIGS. 1 and 2 in accordance with one or more other modified embodiments of the present invention.
Figure 24E:
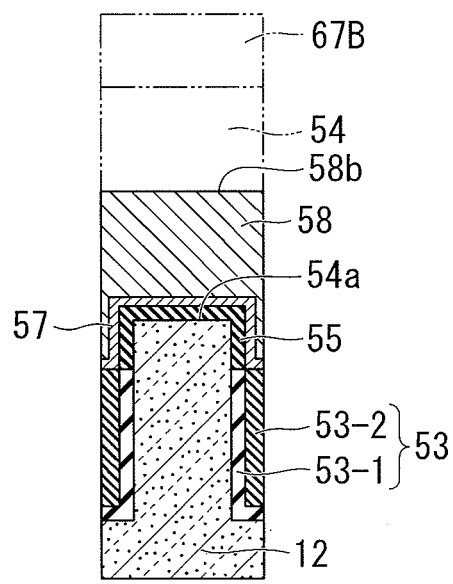
FIG. 24E is a fragmentary cross sectional elevation view, taken along a D-D line of FIG. 22A, illustrative of the same step as of FIG. 22A, involved in the method of forming the memory cell area of the semiconductor device of FIGS. 1 and 2 in accordance with one or more other modified embodiments of the present invention.

FIG. 24A is a plan view of a region in which the memory cell array is formed, FIG. 24B is a cross-sectional view taken along a line A-A of a structure shown in FIG. 24A, FIG. 24C is a cross-sectional view taken along a line B-B of the structure shown in FIG. 24A, FIG. 24D is a cross-sectional view taken along a line C-C of the structure shown in FIG. 24A, and FIG. 24E is a cross-sectional view taken along a line D-D of the structure shown in FIG. 24A.

Figure 25A:
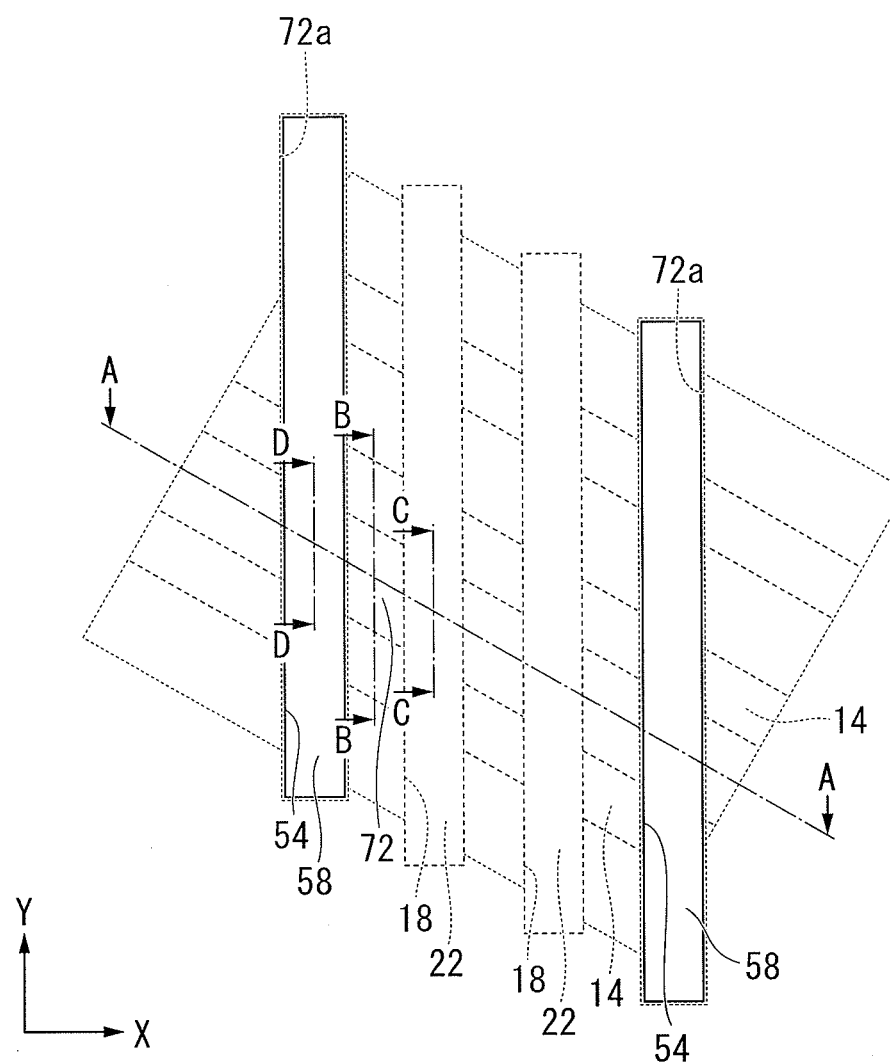
FIG. 25A is a fragmentary schematic plain view of a step, subsequent to the step of FIGS. 24A through 24E, involved in a method of forming the memory cell area of the semiconductor device of FIGS. 1 and 2 in accordance with one or more other modified embodiments of the present invention.
Figure 25B:
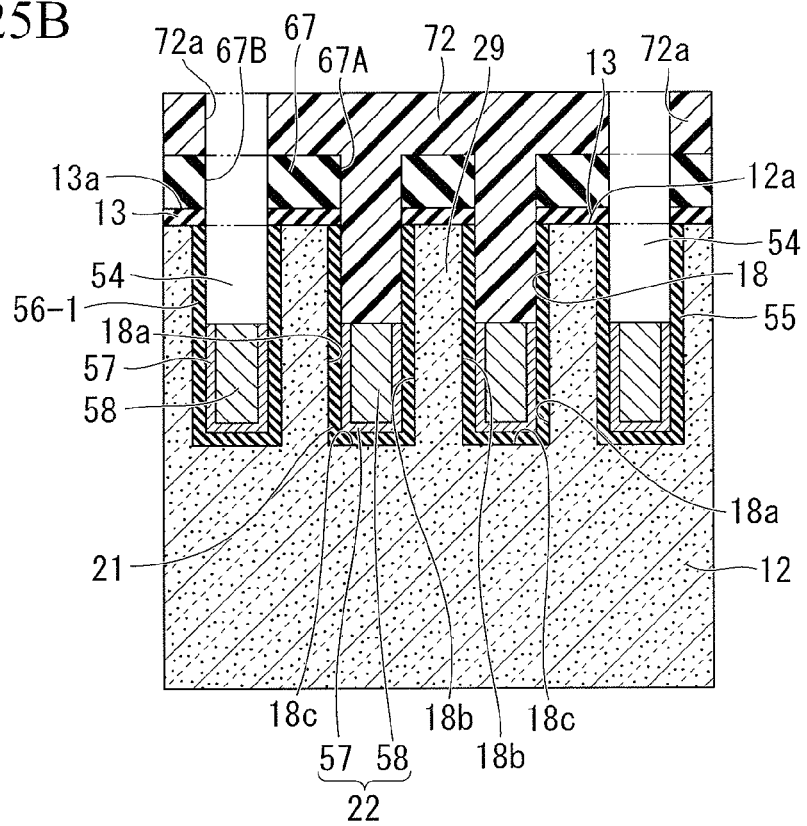
FIG. 25B is a fragmentary cross sectional elevation view, taken along an A-A line of FIG. 25A, illustrative of the same step as of FIG. 25A, subsequent to the step of FIGS. 24A through 24E, involved in the method of forming the memory cell area of the semiconductor device of FIGS. 1 and 2 in accordance with one or more other modified embodiments of the present invention.
Figure 25C:
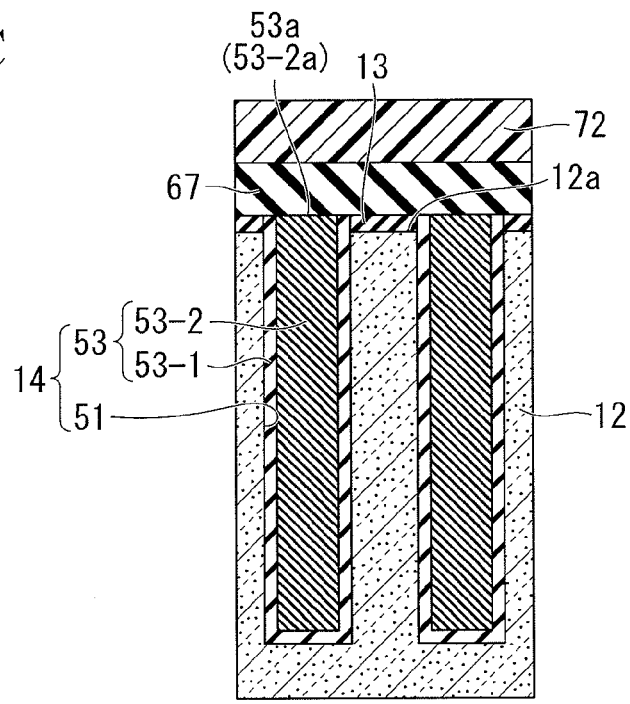
FIG. 25C is a fragmentary cross sectional elevation view, taken along a B-B line of FIG. 25A, illustrative of the same step as of FIG. 25A, subsequent to the step of FIGS. 24A through 24E, involved in the method of forming the memory cell area of the semiconductor device of FIGS. 1 and 2 in accordance with one or more other modified embodiments of the present invention.
Figure 25D:
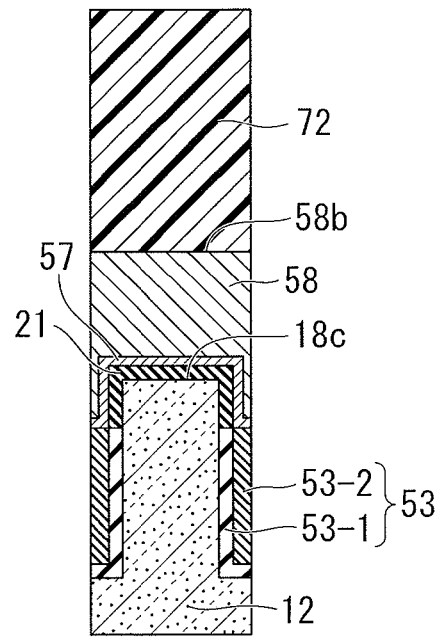
FIG. 25D is a fragmentary cross sectional elevation view, taken along a C-C line of FIG. 25A, illustrative of the same step as of FIG. 25A, subsequent to the step of FIGS. 24A through 24E, involved in the method of forming the memory cell area of the semiconductor device of FIGS. 1 and 2 in accordance with one or more other modified embodiments of the present invention.
Figure 25E:
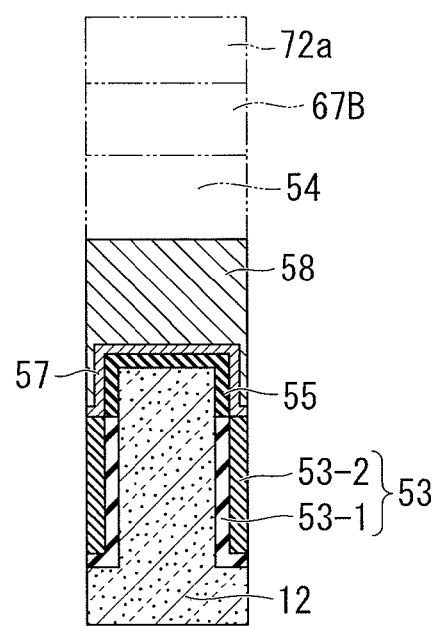
FIG. 25E is a fragmentary cross sectional elevation view, taken along a D-D line of FIG. 25A, illustrative of the same step as of FIG. 25A, subsequent to the step of FIGS. 24A through 24E, involved in the method of forming the memory cell area of the semiconductor device of FIGS. 1 and 2 in accordance with one or more other modified embodiments of the present invention.

FIG. 25A is a plan view of a region in which the memory cell array is formed, FIG. 25B is a cross-sectional view taken along a line A-A of a structure shown in FIG. 25A, FIG. 25C is a cross-sectional view taken along a line B-B of the structure shown in FIG. 25A, FIG. 25D is a cross-sectional view taken along a line C-C of the structure shown in FIG. 25A, and FIG. 25E is a cross-sectional view taken along a line D-D of the structure shown in FIG. 25A.

Figure 26A:
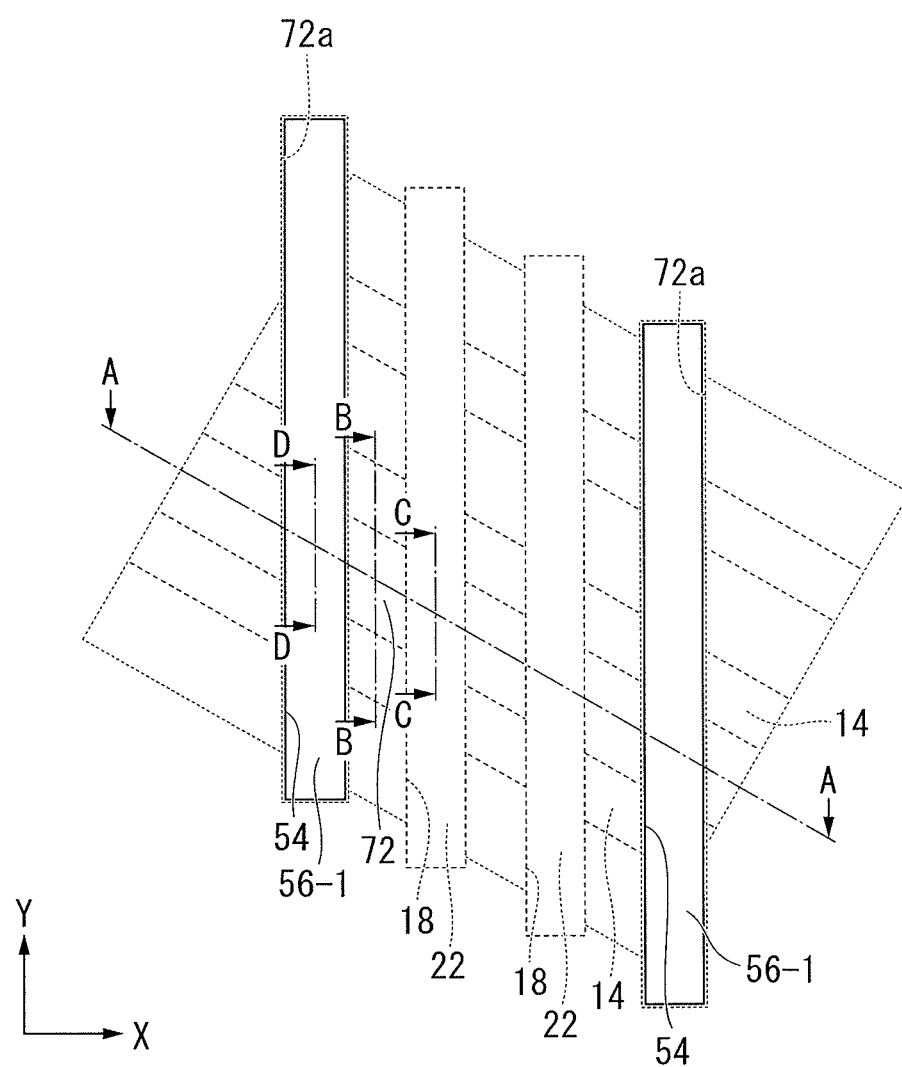
FIG. 26A is a fragmentary schematic plain view of a step, subsequent to the step of FIGS. 25A through 25E, involved in a method of forming the memory cell area of the semiconductor device of FIGS. 1 and 2 in accordance with one or more other modified embodiments of the present invention.
Figure 26B:
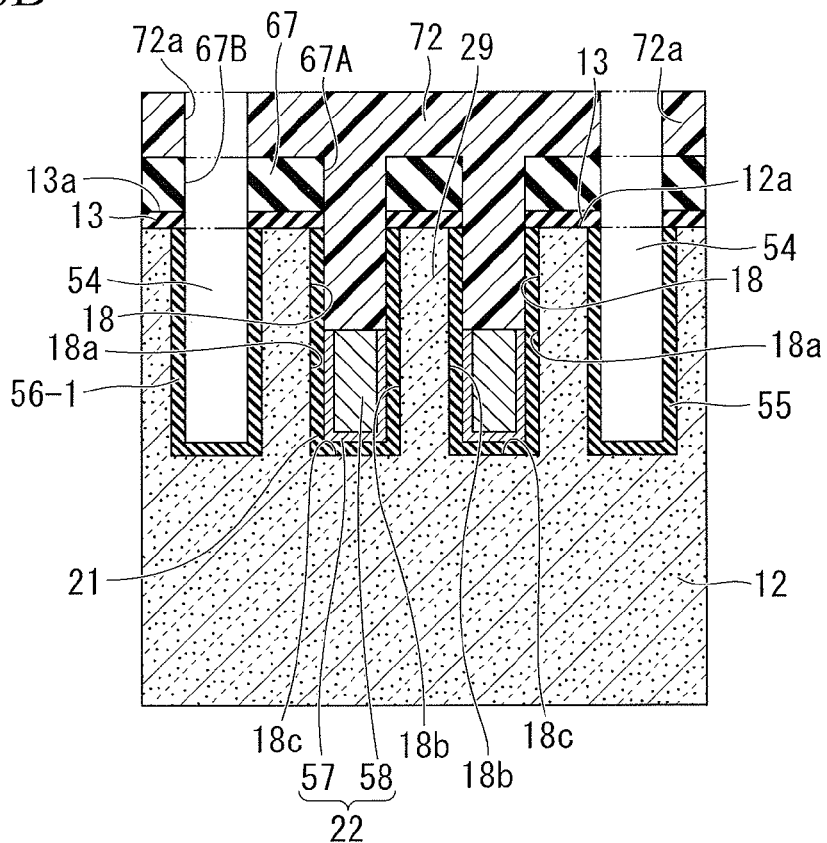
FIG. 26B is a fragmentary cross sectional elevation view, taken along an A-A line of FIG. 26A, illustrative of the same step as of FIG. 26A, subsequent to the step of FIGS. 25A through 25E, involved in the method of forming the memory cell area of the semiconductor device of FIGS. 1 and 2 in accordance with one or more other modified embodiments of the present invention.
Figure 26C:
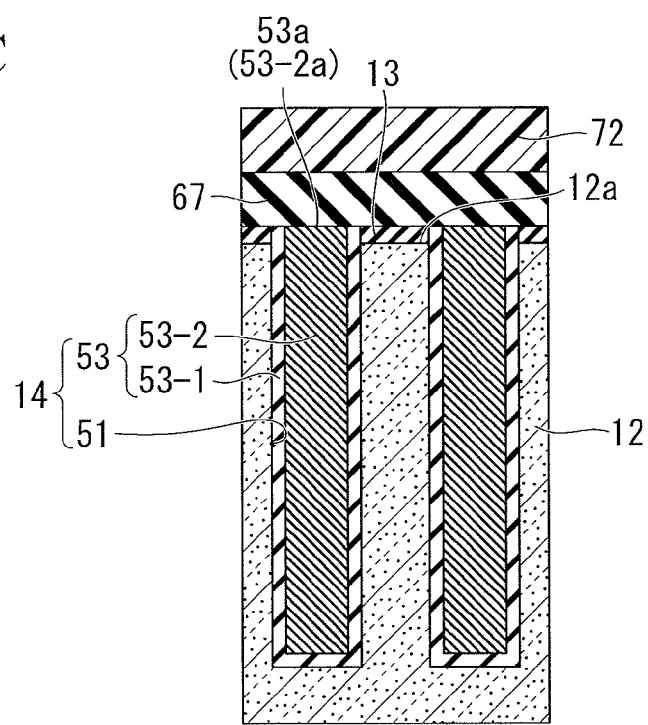
FIG. 26C is a fragmentary cross sectional elevation view, taken along a B-B line of FIG. 26A, illustrative of the same step as of FIG. 26A, subsequent to the step of FIGS. 25A through 25E, involved in the method of forming the memory cell area of the semiconductor device of FIGS. 1 and 2 in accordance with one or more other modified embodiments of the present invention.
Figure 26D:
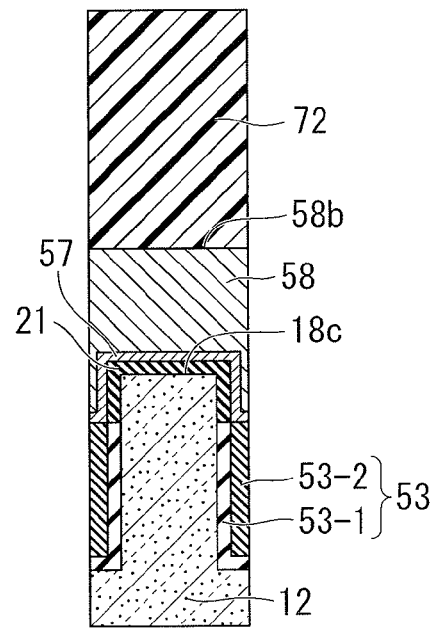
FIG. 26D is a fragmentary cross sectional elevation view, taken along a C-C line of FIG. 26A, illustrative of the same step as of FIG. 26A, subsequent to the step of FIGS. 25A through 25E, involved in the method of forming the memory cell area of the semiconductor device of FIGS. 1 and 2 in accordance with one or more other modified embodiments of the present invention.
Figure 26E:
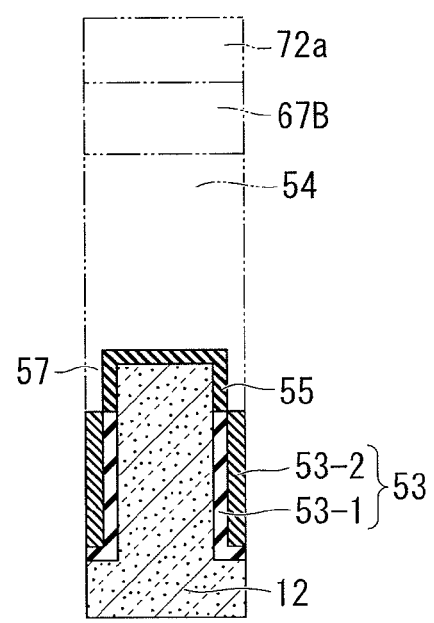
FIG. 26E is a fragmentary cross sectional elevation view, taken along a D-D line of FIG. 26A, illustrative of the same step as of FIG. 26A, subsequent to the step of FIGS. 25A through 25E, involved in the method of forming the memory cell area of the semiconductor device of FIGS. 1 and 2 in accordance with one or more other modified embodiments of the present invention.

FIG. 26A is a plan view of a region in which the memory cell array is formed, FIG. 26B is a cross-sectional view taken along a line A-A of a structure shown in FIG. 26A, FIG. 26C is a cross-sectional view taken along a line B-B of the structure shown in FIG. 26A, FIG. 26D is a cross-sectional view taken along a line C-C of the structure shown in FIG. 26A, and FIG. 26E is a cross-sectional view taken along a line D-D of the structure shown in FIG. 26A.

Figure 27A:
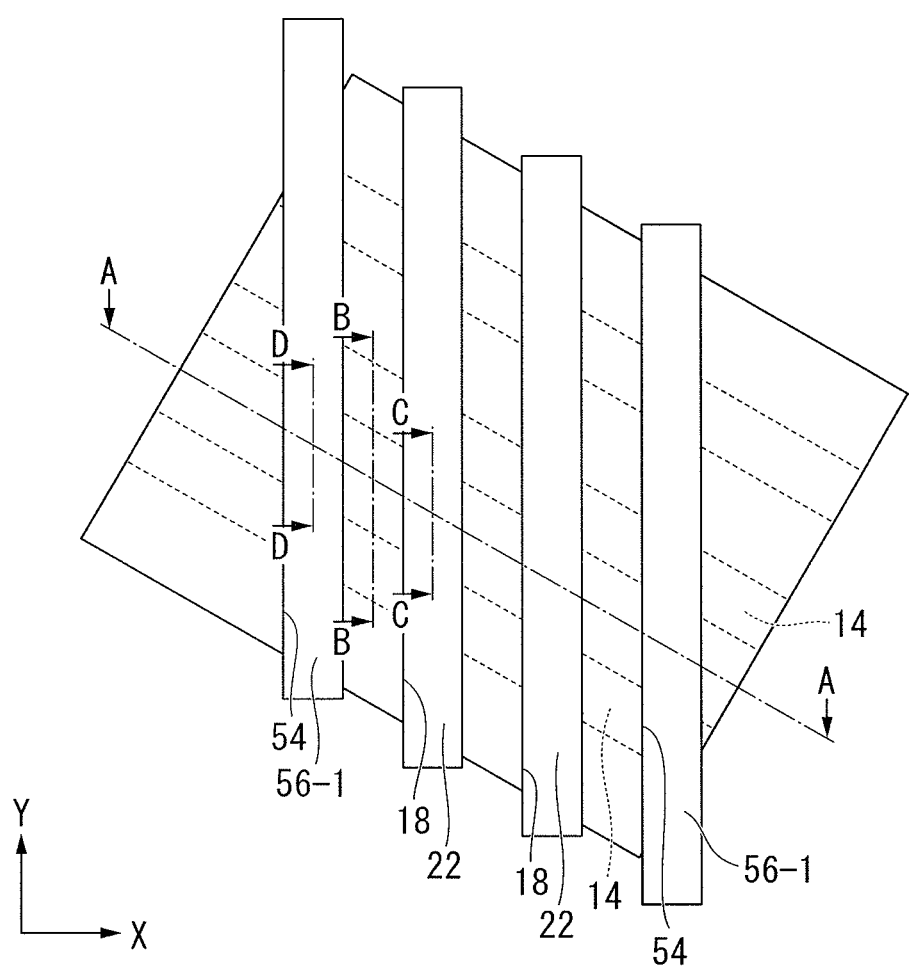
FIG. 27A is a fragmentary schematic plain view of a step, subsequent to the step of FIGS. 26A through 26E, involved in a method of forming the memory cell area of the semiconductor device of FIGS. 1 and 2 in accordance with one or more other modified embodiments of the present invention.
Figure 27B:
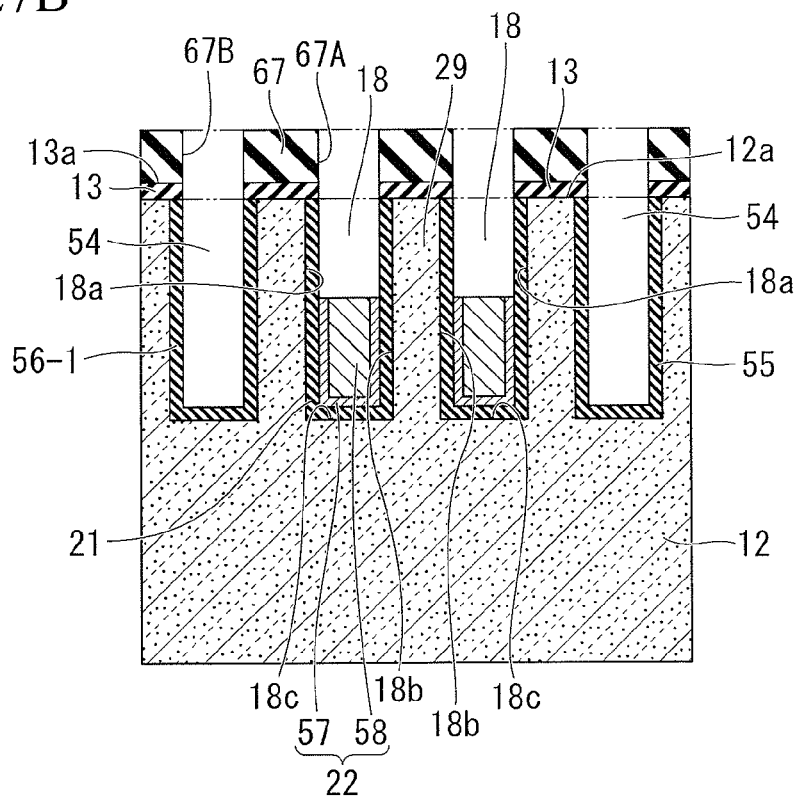
FIG. 27B is a fragmentary cross sectional elevation view, taken along an A-A line of FIG. 27A, illustrative of the same step as of FIG. 27A, subsequent to the step of FIGS. 26A through 26E, involved in the method of forming the memory cell area of the semiconductor device of FIGS. 1 and 2 in accordance with one or more other modified embodiments of the present invention.
Figure 27C:
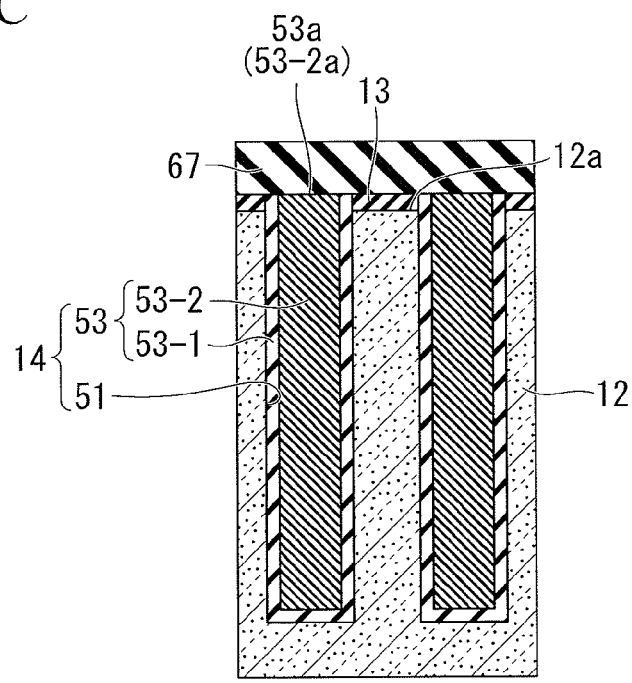
FIG. 27C is a fragmentary cross sectional elevation view, taken along a B-B line of FIG. 27A, illustrative of the same step as of FIG. 27A, subsequent to the step of FIGS. 26A through 26E, involved in the method of forming the memory cell area of the semiconductor device of FIGS. 1 and 2 in accordance with one or more other modified embodiments of the present invention.
Figure 27D:
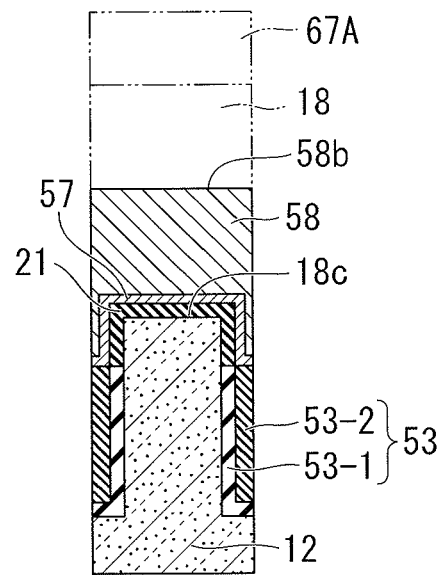
FIG. 27D is a fragmentary cross sectional elevation view, taken along a C-C line of FIG. 27A, illustrative of the same step as of FIG. 27A, subsequent to the step of FIGS. 26A through 26E, involved in the method of forming the memory cell area of the semiconductor device of FIGS. 1 and 2 in accordance with one or more other modified embodiments of the present invention.
Figure 27E:
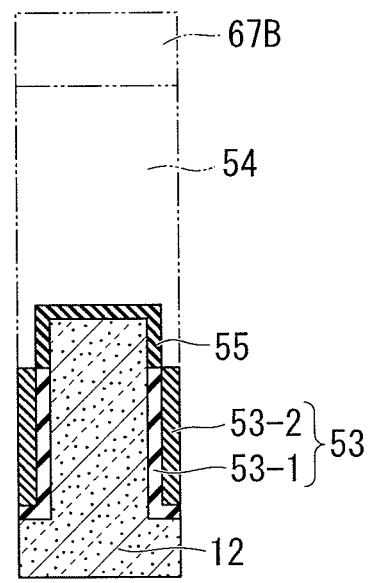
FIG. 27E is a fragmentary cross sectional elevation view, taken along a D-D line of FIG. 27A, illustrative of the same step as of FIG. 27A, subsequent to the step of FIGS. 26A through 26E, involved in the method of forming the memory cell area of the semiconductor device of FIGS. 1 and 2 in accordance with one or more other modified embodiments of the present invention.

FIG. 27A is a plan view of a region in which the memory cell array is formed, FIG. 27B is a cross-sectional view taken along a line A-A of a structure shown in FIG. 27A, FIG. 27C is a cross-sectional view taken along a line B-B of the structure shown in FIG. 27A, FIG. 27D is a cross-sectional view taken along a line C-C of the structure shown in FIG. 27A, and FIG. 27E is a cross-sectional view taken along a line D-D of the structure shown in FIG. 27A.

Further, positions of the lines A-A, B-B, C-C and D-D shown in FIGS. 24A through 24E, FIGS. 25A through 25E, FIGS. 26A through 26E, and FIGS. 27A through 27E correspond to those of the lines A-A, B-B, C-C, and D-D shown in FIG. 1, respectively.

Next, a method of fabricating the second variant of the semiconductor device 10 (specifically, memory cell array 11) according to the first embodiment will be described with main reference to FIGS. 24A through 24E, FIGS. 25A through 25E, FIGS. 26A through 26E, and FIGS. 27A through 27E.

First, the processes from the process shown in FIGS. 3A through 3E to the process shown in FIGS. 8A through 8E, which have been previously described, are sequentially performed to thereby form the structure shown in FIGS. 8A through 8E.

Next, in a process shown in FIGS. 24A through 24E, the second conductive film 58 shown in FIGS. 8A through 8E is etched back over its entire surface by dry etching to thereby leave the second conductive film 58 only in lower portions of the gate electrode trench 18 and the second element isolation trench 54. In this case, a condition for selectively etching the second conductive film 58 is used as an etch back condition.

The etch back is performed so that a depth $D_4$ from the main surface 12a of the semiconductor substrate 12 to the upper surface 58b of the second etched-back conductive film 58 is 60 nm. The second conductive film 58 left in the gate electrode trench 18 is a film that is a component of the gate electrode 22 shown in FIG. 2.

Next, the first conductive film 57 shown in FIGS. 8A through 8E is etched back over its entire surface by dry etching using the second left conductive film 58 as a mask to thereby leave the first conductive film 57 only in lower portions of the gate electrode trench 18 and the second element isolation trench 54. In this case, a condition for selectively etching the first conductive film 57 is used as an etch back condition.

Accordingly, the gate electrode 22 consisting of the first and second conductive films 57 and 58 is formed in the lower portion of the gate electrode trench 18, and the first and second conductive films 57 and 58 are left in the lower portion of the second element isolation trench 54.

Next, in a process shown in FIGS. 25A through 25E, photoresist 72 having a trench-shaped opening 72a is formed on a structure shown in FIG. 24A using the same technique as the process shown in FIGS. 9A through 9E, which has been previously described. Accordingly, the gate electrode 22 formed in the lower portion of the gate electrode trench 18 is covered with the photoresist 72, and the first and second conductive films 57 and 58 left in the lower portion of the second element isolation trench 54 are exposed by the opening 72a.

Next, in a process shown in FIGS. 26A through 26E, the first and second conductive films 57 and 58 left in the second element isolation trench 54 shown in FIGS. 25B and 25E are removed.

Specifically, the second conductive film 58 left in the lower portion of the second element isolation trench 54 is removed by dry etching using the photoresist 72 as a mask, and then the first conductive film 57 is removed by dry etching. Accordingly, the second insulating film 56-1 formed in the lower portion of the second element isolation trench 54 is exposed.

Next, in a process shown in FIGS. 27A through 27E, the photoresist 72 shown in FIGS. 26A through 26D is removed. Then, the processes from the process shown in FIGS. 14A through 14E to the process shown in FIG. 21, which have been previously described, are sequentially performed to thereby fabricate the semiconductor device 10 of the first embodiment shown in FIG. 21.

If the semiconductor device 10 of the first embodiment is fabricated using such a method, the same effects as those of the method of fabricating the semiconductor device 10 of the first embodiment, which have been previously described, can be obtained.

Second Embodiment

FIG. 28 is a cross-sectional view showing a schematic configuration of a memory cell array provided in a semiconductor device according to a second embodiment of the present invention. FIG. 28 corresponds to a cross-sectional view taken along a line A-A of the memory cell array shown in FIG. 1.

In FIG. 28, a DRAM is described as an example of a semiconductor device 80 of the second embodiment.

In FIG. 28, the same components as the semiconductor device 10 of the first embodiment shown in FIG. 2 are assigned the same reference numerals.

Referring to FIG. 28, the semiconductor device 80 of the second embodiment has the same configuration as the semiconductor device 10 except that the semiconductor device 80 has a memory cell array 81 including a third impurity diffusion region 83, in addition to the configuration of the memory cell array 11 of the semiconductor device of the first embodiment.

The third impurity diffusion region 83 is provided in the semiconductor substrate 12 located below the second element isolation region 17 to cover a lower end 17A of the second element isolation region 17. The third impurity diffusion region 83 is a region containing p-type impurities having the same conductivity type as the p-type silicon substrate that is the semiconductor substrate 12, with a higher concentration than the semiconductor substrate 12.

According to the semiconductor device of the second embodiment, since the third impurity diffusion region 83, which covers the lower end 17A of the second element isolation region 17 and contains the p-type impurities having the same conductivity type as the p-type silicon substrate that is the semiconductor substrate 12, with a higher concentration than the semiconductor substrate 12, is provided in the semiconductor substrate 12 located below the second element isolation region 17, the element forming regions R can be securely electrically isolated from each other.

FIGS. 29A through 29E are diagrams showing a process of fabricating the memory cell array provided in the semiconductor device according to the second embodiment of the present invention.

Figure 29A:
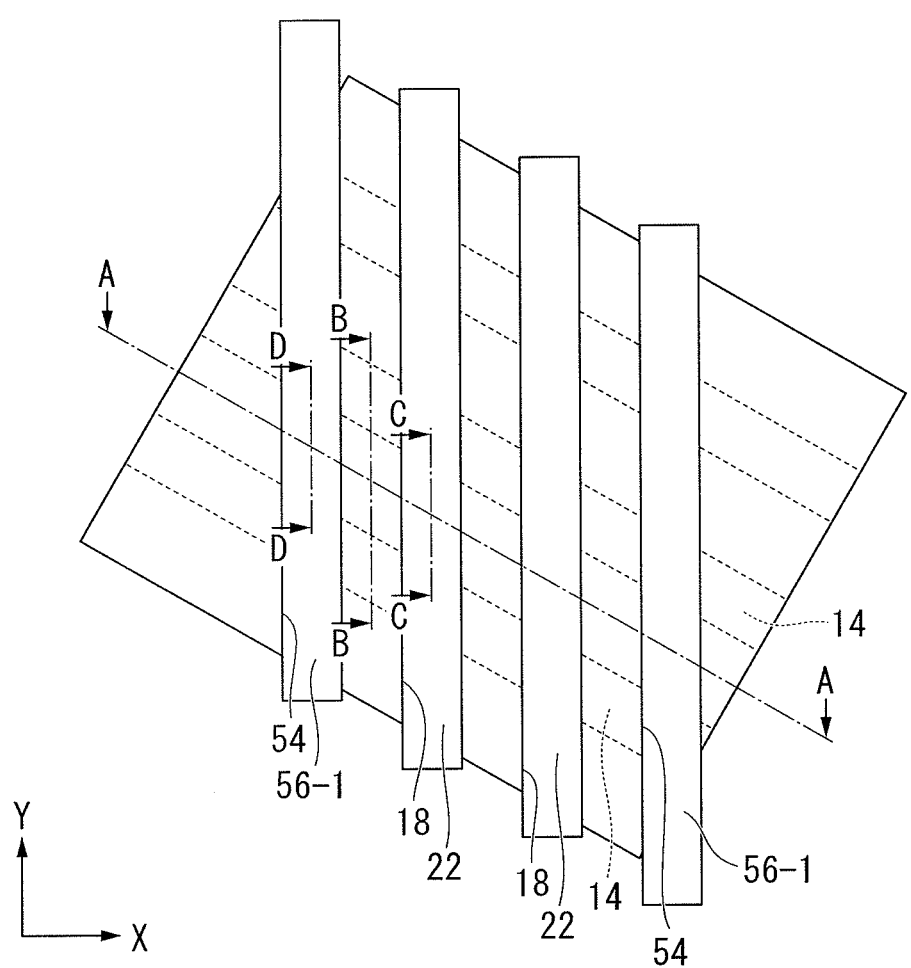
FIG. 29A is a fragmentary schematic plain view of a step involved in a method of forming the memory cell area of the semiconductor device of FIG. 28 in accordance with a second embodiment of the present invention.
Figure 29B:
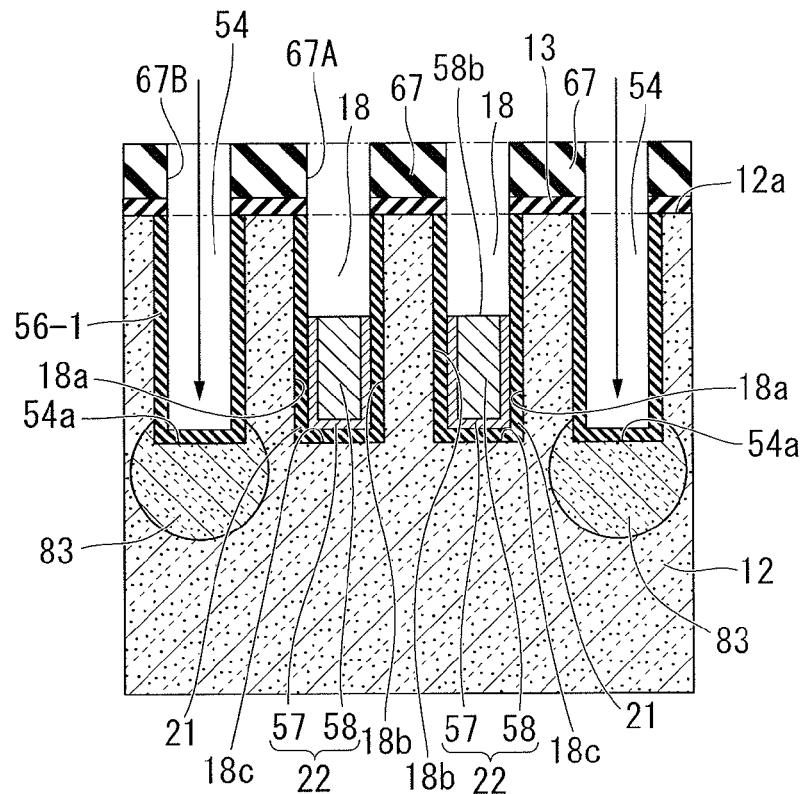
FIG. 29B is a fragmentary cross sectional elevation view, taken along an A-A line of FIG. 29A, illustrative of the same step as of FIG. 29A, involved in the method of forming the memory cell area of the semiconductor device of FIG. 28 in accordance with a second embodiment of the present invention.
Figure 29C:
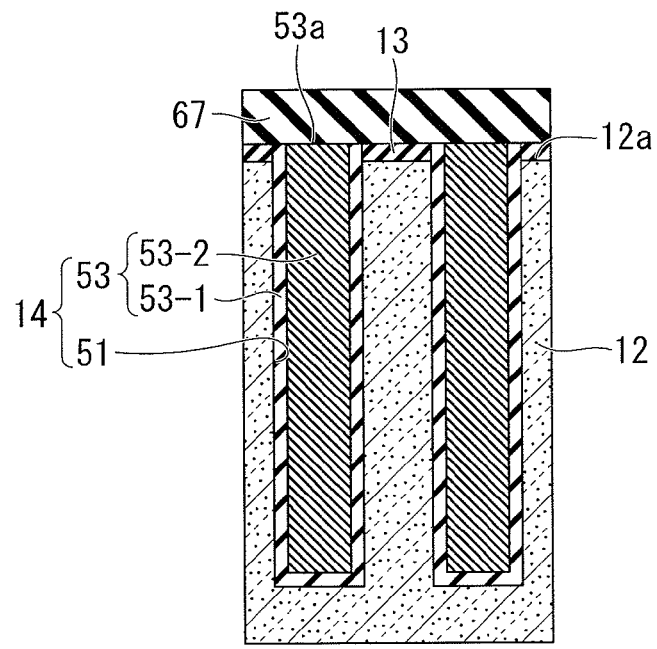
FIG. 29C is a fragmentary cross sectional elevation view, taken along a B-B line of FIG. 29A, illustrative of the same step as of FIG. 29A, involved in the method of forming the memory cell area of the semiconductor device of FIG. 28 in accordance with a second embodiment of the present invention.
Figure 29D:
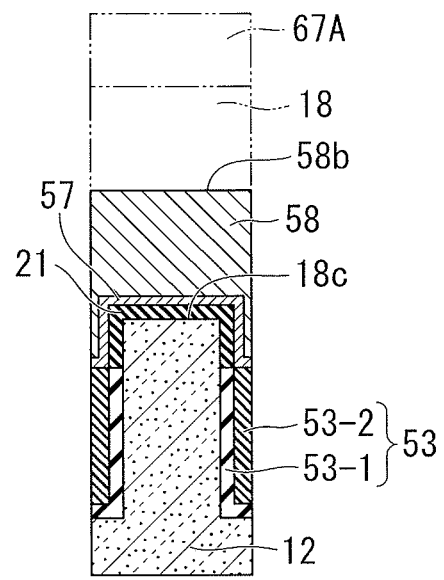
FIG. 29D is a fragmentary cross sectional elevation view, taken along a C-C line of FIG. 29A, illustrative of the same step as of FIG. 29A, involved in the method of forming the memory cell area of the semiconductor device of FIG. 28 in accordance with a second embodiment of the present invention.
Figure 29E:
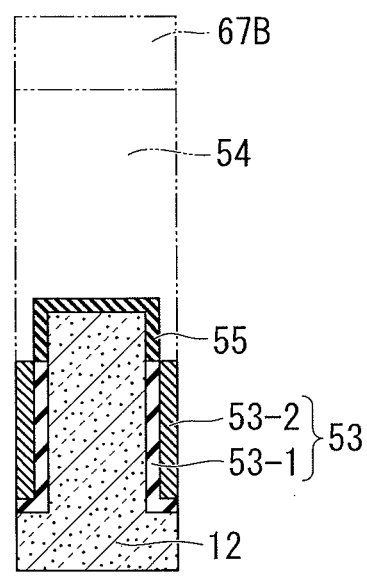
FIG. 29E is a fragmentary cross sectional elevation view, taken along a D-D line of FIG. 29A, illustrative of the same step as of FIG. 29A, involved in the method of forming the memory cell area of the semiconductor device of FIG. 28 in accordance with a second embodiment of the present invention.

FIG. 29A is a plan view of a region in which the memory cell array is formed, FIG. 29B is a cross-sectional view taken along a line A-A of a structure shown in FIG. 29A, FIG. 29C is a cross-sectional view taken along a line B-B of the structure shown in FIG. 29A, FIG. 29D is a cross-sectional view taken along a line C-C of the structure shown in FIG. 29A, and FIG. 29E is a cross-sectional view taken along a line D-D of the structure shown in FIG. 29A.

Further, positions of the lines A-A, B-B, C-C and D-D shown in FIGS. 29A through 29E correspond to those of the lines A-A, B-B, C-C and D-D shown in FIG. 1, respectively.

Next, a method of fabricating the semiconductor device 80 (specifically, memory cell array 81) according to the second embodiment will be described with main reference to FIGS. 29A through 29E.

First, the processes from the process shown in FIGS. 3A through 3E to the process shown in FIGS. 13A through 13E, which have been described in the first embodiment, are sequentially performed to form the structure shown in FIGS. 13A through 13E.

Next, in a process shown in FIGS. 29A through 29E, impurities having the same conductivity type as the semiconductor substrate 12 (p-type silicon substrate) are ion-implanted with a higher concentration than the semiconductor substrate 12 into the semiconductor substrate 12 located below the bottom 54a of the second element isolation trench 54 through the second insulating film 56-1 arranged in the bottom 54a of the second element isolation trench 54, to thereby form the third impurity diffusion region 83 covering the bottom 54a of the second element isolation trench 54.

Specifically, boron (B), which is a p-type impurity, is ion-implanted into the semiconductor substrate 12 located below the bottom 54a of the second element isolation trench 54 through the second insulating film 56-1 arranged in the bottom 54a of the second element isolation trench 54, to thereby form the third impurity diffusion region 83.

When the boron (B) is ion-implanted, ion-implantation energy may be a few KeV and a dose amount may be 1E12 $cm^{-2}$ to 1E14 $cm^{-2}$.

Further, if a p-type impurity concentration of the semiconductor substrate 12 is 1E14 $cm^{-3}$ to 1E15 $cm^{-3}$, a p-type impurity concentration of the third impurity diffusion region 83 may be, for example, 1E16 $cm^{-3}$ to 1E20 $cm^{-3}$.

Further, as a type of ion, $BF_2$ may be used in place of boron (B). In this case, ion-implantation energy may be 10 KeV.

Next, the processes from the process shown in FIGS. 14A through 14E to the process shown in FIG. 21, which have been described in the first embodiment, are sequentially performed to fabricate the semiconductor device 80 of the second embodiment shown in FIG. 28.

According to the method of fabricating a semiconductor device of the second embodiment, after the gate insulating film 21 and the gate electrode 22 are formed in the gate electrode trench 18, the p-type impurities are ion-implanted into the semiconductor substrate 12 located below the bottom 54a of the second element isolation trench 54 through the second insulating film 56-1 formed in the bottom 54a of the second element isolation trench 54 to thereby form the third impurity diffusion region 83 having a higher impurity concentration than the semiconductor substrate 12 and covering the bottom 54a of the second element isolation trench 54 in the semiconductor substrate 12 located below the second element isolation trench 54. Thus, the element forming regions R (see FIG. 28) can be securely electrically isolated from each other.

FIGS. 30A through 30E and FIGS. 31A through 31E are diagrams showing a process of fabricating a variant of the memory cell array provided in the semiconductor device according to the second embodiment of the present invention.

Figure 30A:
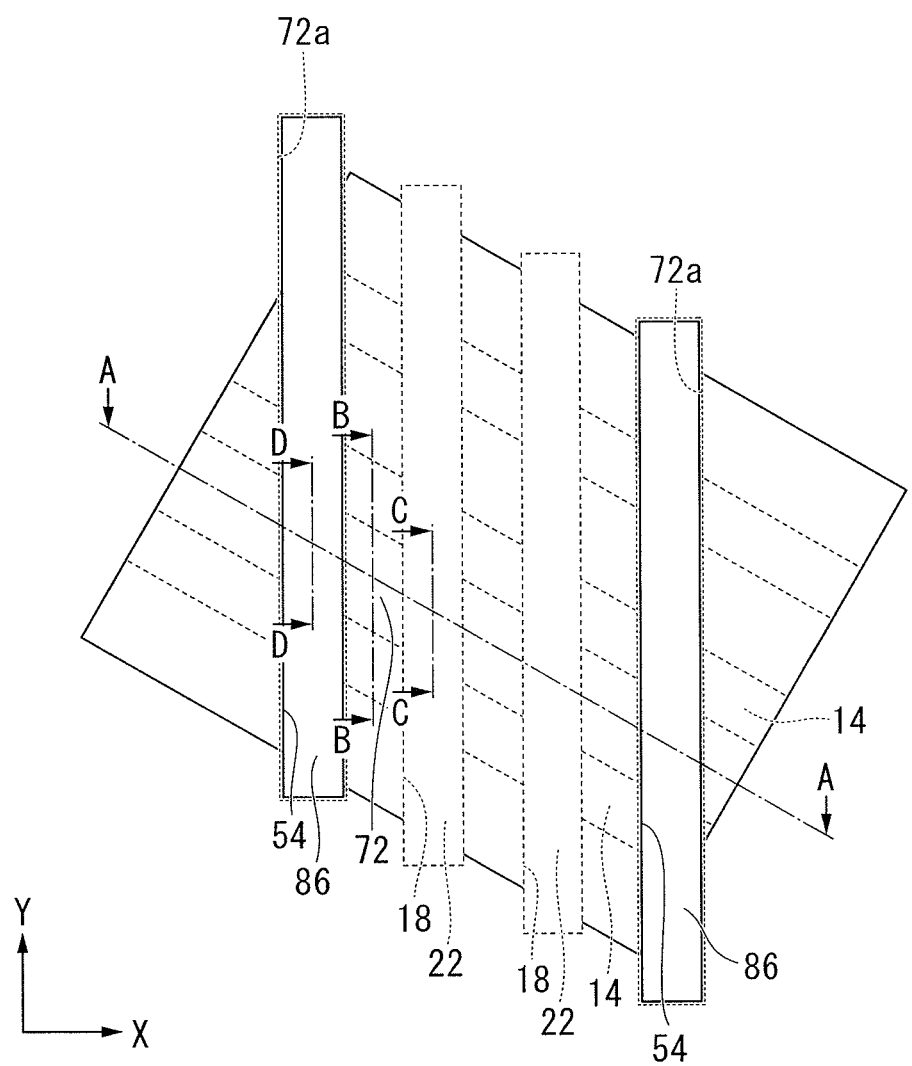
FIG. 30A is a fragmentary schematic plain view of a step involved in a method of forming the memory cell area of the semiconductor device of FIG. 28 in accordance with a modification to the second embodiment of the present invention.
Figure 30B:
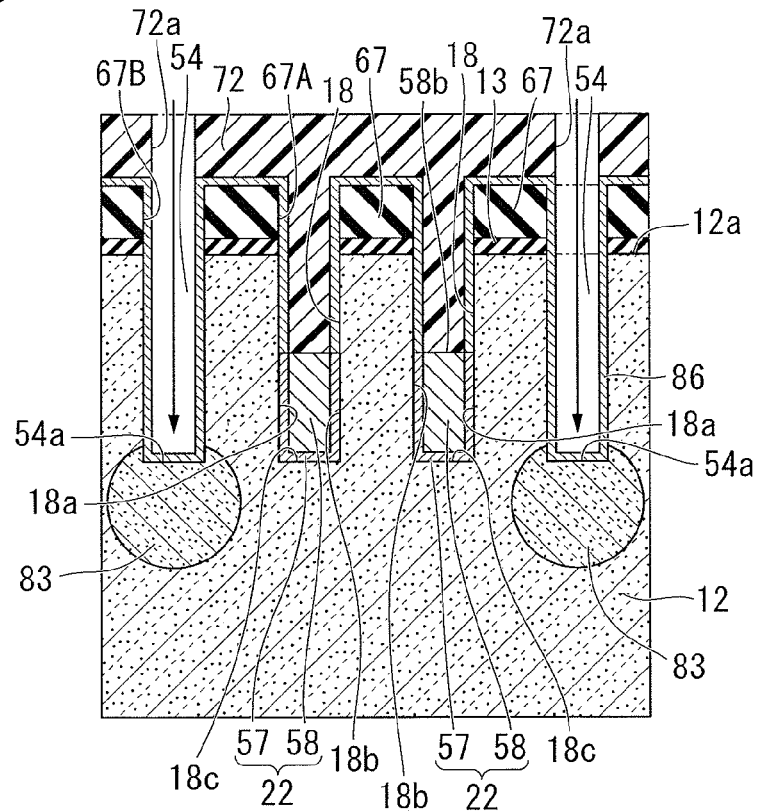
Figure 30C:
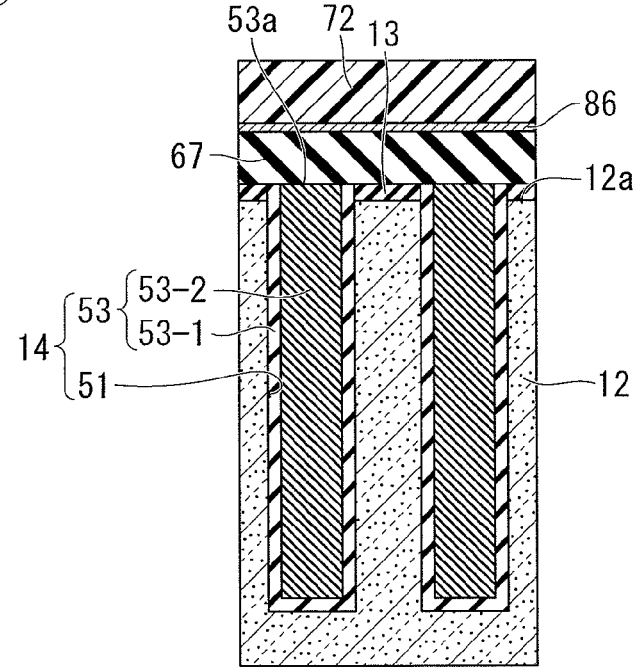
Figure 30D:
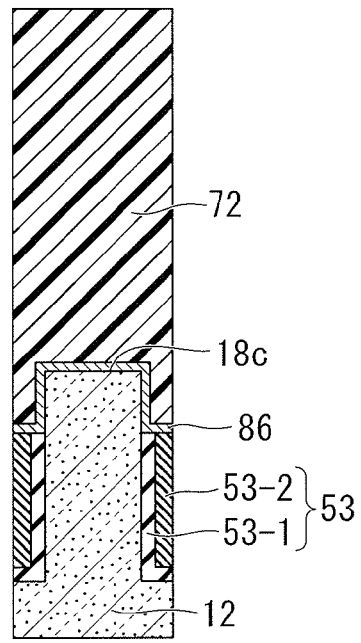
Figure 30E:
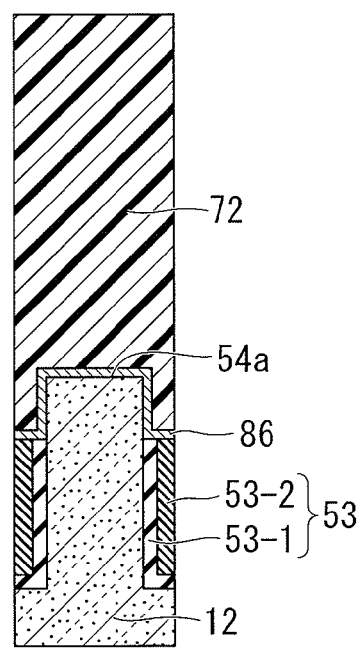

FIG. 30A is a plan view of a region in which the memory cell array is formed, FIG. 30B is a cross-sectional view taken along a line A-A of a structure shown in FIG. 30A, FIG. 30C is a cross-sectional view taken along a line B-B of the structure shown in FIG. 30A, FIG. 30D is a cross-sectional view taken along a line C-C of the structure shown in FIG. 30A, and FIG. 30E is a cross-sectional view taken along a line D-D of the structure shown in FIG. 30A.

Figure 31A:
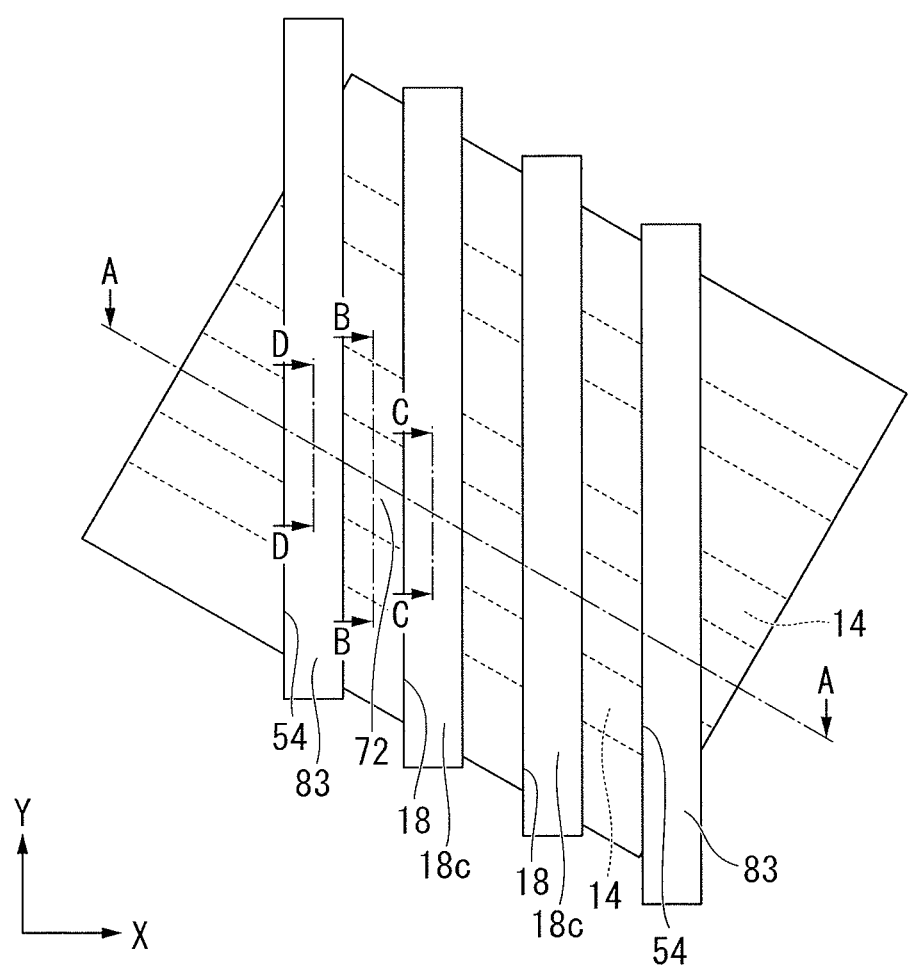
Figure 31B:
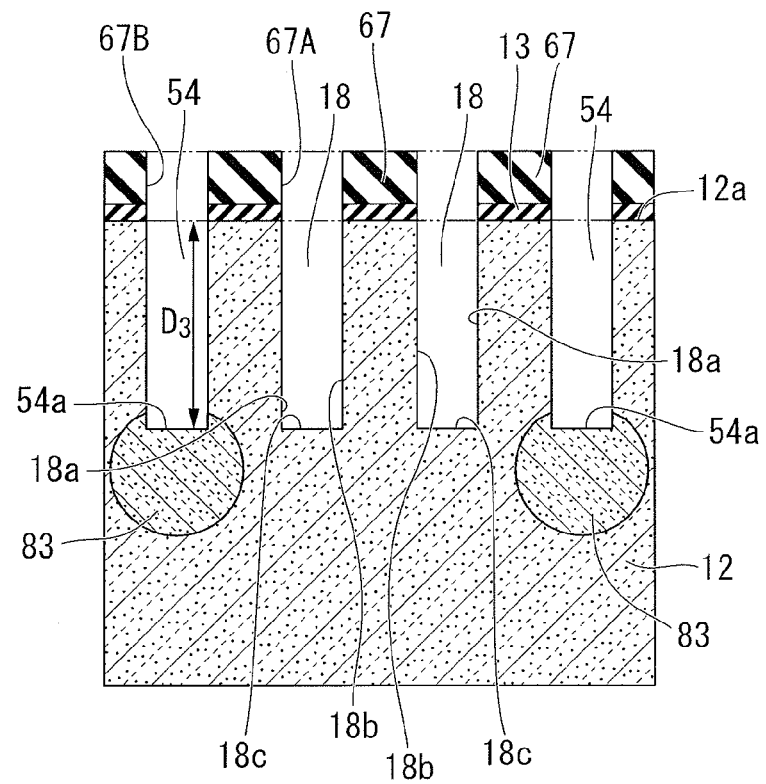
Figure 31C:
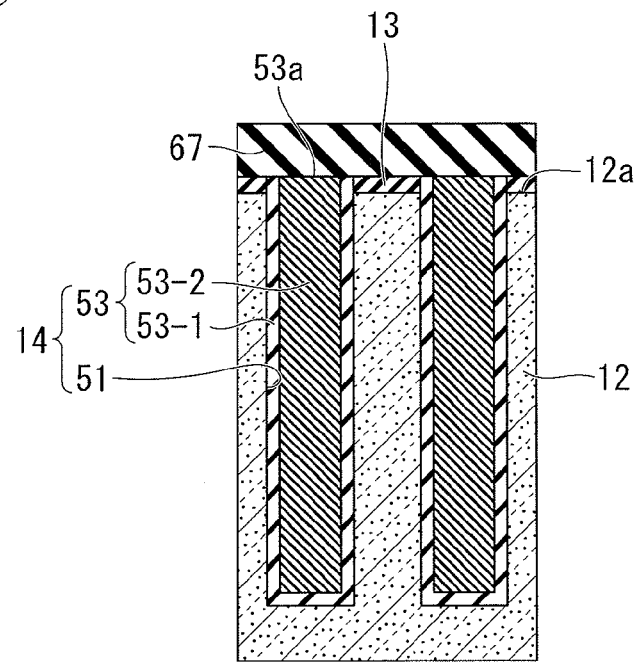
Figure 31D:
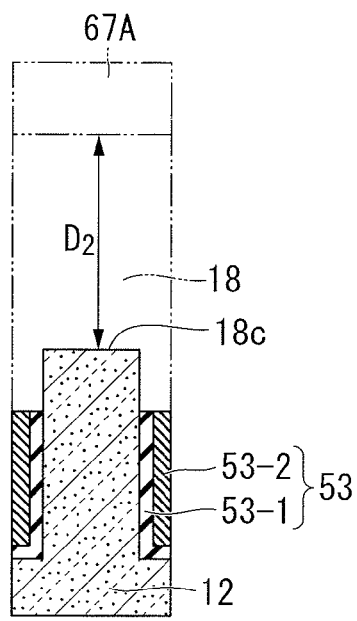
Figure 31E:
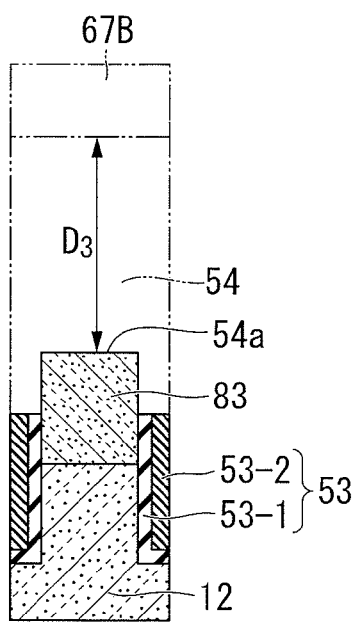

FIG. 31A is a plan view of a region in which the memory cell array is formed, FIG. 31B is a cross-sectional view taken along a line A-A of a structure shown in FIG. 31A, FIG. 31C is a cross-sectional view taken along a line B-B of the structure shown in FIG. 31A, FIG. 31D is a cross-sectional view taken along a line C-C of the structure shown in FIG. 31A, and FIG. 31E is a cross-sectional view taken along a line D-D of the structure shown in FIG. 31A.

Positions of the lines A-A, B-B, C-C, and D-D shown in FIGS. 30A through 30E and FIGS. 31A through 31E correspond to those of the lines A-A, B-B, C-C, and D-D shown in FIG. 1, respectively.

Next, a method of fabricating a variant of the semiconductor device 80 (specifically, memory cell array 81) according to the second embodiment will be described with main reference to FIGS. 30A through 30E and FIGS. 31A through 31E.

First, the processes from the process shown in FIGS. 3A through 3E to the process shown in FIGS. 6A through 6E, which have been described in the first embodiment, are sequentially performed to thereby form the structure shown in FIGS. 6A through 6E.

Next, in a process shown in FIGS. 30A through 30E, an insulating film 86 covering at least an inner surface of the gate electrode trench 18 (specifically, a bottom 18c and first and second opposing side surfaces 18a and 18b), and an inner surface of the second element isolation trench 54 is formed using a thermal oxidation method.

Specifically, for example, the insulating film 86 covering the inner surface of the gate electrode trench 18 and the inner surface of the second element isolation trench 54 is formed using a thermal oxidation method. In this case, the insulating film 86 is formed to cover a side surface of the pad insulating film 13 and a side surface and an upper surface of the mask insulating film 67.

Next, using the same ion-implant conditions as in the process shown in FIGS. 29A through 29E, which has been previously described, impurities having the same conductivity type as the semiconductor substrate 12 (p-type silicon substrate) (in this case, p-type impurities) are ion-implanted into a main surface 12a of the semiconductor substrate 12 through the insulating film 86 arranged in the bottom 54a of the second element isolation trench 54, to thereby form the third impurity diffusion region 83 covering the bottom 54a of the second element isolation trench 54.

Next, in a process shown in FIGS. 31A through 31E, the photoresist 72 and the insulating film 86 shown in FIGS. 30A through 30E are sequentially removed. Accordingly, the inner surface of the gate electrode trench 18 and the inner surface of the second element isolation trench 54 are exposed.

Next, the gate insulating film 21 covering the inner surface of the gate electrode trench 18, and the second insulating film 56-1 covering an inner surface of the second element isolation trench 54 and contacting the third impurity diffusion region 83 formed in the bottom 54a of the second element isolation trench 54 are simultaneously formed using the same technique as in the process shown in FIG. 7, which has been described in the first embodiment.

Then, the processes from the process shown in FIGS. 8A through 8E to the process shown in FIG. 21, which have been described in the first embodiment, are sequentially performed to thereby fabricate the semiconductor device 80 shown in FIG. 28.

According to the method of fabricating the variant of the semiconductor device of the second embodiment, the insulating film 86 covering the inner surface of the second element isolation trench 54 is formed and then the p-type impurities are selectively ion-implanted into the bottom 54a of the second element isolation trench 54 through the insulating film 86 to thereby form the third impurity diffusion region 83 with a higher impurity concentration than the semiconductor substrate 12. Then, the insulating film 86 damaged by the ion-implantation is removed. Next, the second insulating film 56-1 covering the inner surface of the second element isolation trench 54 (an undamaged insulating film) is formed and then the second element isolation trench 54 is buried with the second element isolation insulating film 56 through the second insulating film 56-1 to thereby form the second element isolation region 17 consisting of the second element isolation trench 54, the second insulating film 56-1, and the second element isolation insulating film 56. Thus, insulation resistance of the second element isolation region 17 can be improved and generation of defects of a semiconductor substrate 12 interface (silicon interface) can be suppressed, such that the element forming regions R (see FIG. 28) can be securely electrically isolated.

Third Embodiment

FIG. 32 is a cross-sectional view showing a schematic configuration of a memory cell array provided in a semiconductor device according to a third embodiment of the present invention. FIG. 32 corresponds to the cross-sectional view taken along a line A-A of the memory cell array shown in FIG. 1.

In FIG. 32, a DRAM is described as an example of the semiconductor device 90 of the third embodiment.

In FIG. 32, the same components as those of the semiconductor device 80 of the second embodiment shown in FIG. 28 are assigned the same reference numerals.

Referring to FIG. 32, a semiconductor device 90 of the third embodiment has the same configuration as the semiconductor device 80 except that the semiconductor device 90 has a memory cell array 91 including a third impurity diffusion region 93, in addition to the configuration of the memory cell array 81 of the semiconductor device of the second embodiment.

The third impurity diffusion region 93 has the same configuration as the third impurity diffusion region 83 previously described except that the third impurity diffusion region 93 is arranged to cover the gate insulating film 21 arranged on the bottom 18c of the gate electrode trench 18.

That is, the third impurity diffusion region 93 is an impurity diffusion region containing the same conductive p-type impurities (specifically, boron (B), $BF_2$ or the like) as the semiconductor substrate 12 (p-type silicon substrate), with a higher concentration than the semiconductor substrate 12.

According to the semiconductor device of the third embodiment, since the third impurity diffusion region 93 containing the p-type impurities with a higher concentration than the semiconductor substrate 12 is provided to cover the gate insulating film 21 arranged on the bottom 18c of the gate electrode trench 18, concentration of a channel is high. Accordingly, a threshold voltage of the transistors 19-1 and 19-2 can increase and leak current of the transistors 19-1 and 19-2 in an off state can decrease.

Further, since the semiconductor device 90 of the third embodiment includes the third impurity diffusion region 83 provided in the semiconductor device 80 of the second embodiment, the same effects as those of the semiconductor device 80 of the second embodiment can be obtained.

FIGS. 33A through 33E are diagrams showing a process of fabricating the memory cell array provided in the semiconductor device according to the third embodiment of the present invention.

FIG. 33A is a plan view of a region in which the memory cell array is formed, FIG. 33B is a cross-sectional view taken along a line A-A of a structure shown in FIG. 33A, FIG. 33C is a cross-sectional view taken along a line B-B of the structure shown in FIG. 33A, FIG. 33D is a cross-sectional view taken along a line C-C of the structure shown in FIG. 33A, and FIG. 33E is a cross-sectional view taken along a line D-D of the structure shown in FIG. 33A.

Further, positions of the lines A-A, B-B, C-C and D-D shown in FIGS. 33A through 33E correspond to those of the lines A-A, B-B, C-C and D-D shown in FIG. 1, respectively.

Next, a method of fabricating the semiconductor device 90 (specifically, memory cell array 91) according to the third embodiment will be described with main reference to FIGS. 33A through 33E.

First, processes from the process shown in FIGS. 3A through 3E to the process shown in FIGS. 6A through 6E, which have been described in the first embodiment, are sequentially performed to form the structure shown in FIGS. 6A through 6E.

Next, in a process shown in FIGS. 33A through 33E, p-type impurities having the same conductivity as the semiconductor substrate 12 are selectively ion-implanted into the bottom 18c of the gate electrode trench 18 and the bottom Ma of the second element isolation trench 54 through a mask insulating film 67 having openings 67A and 67B to simultaneously form the third impurity diffusion region 83 having a higher impurity concentration than the semiconductor substrate 12 and covering the bottom 54a of the second element isolation trench 54 and the third impurity diffusion region 93 having a higher impurity concentration than the semiconductor substrate 12 and covering the bottom 18c of the gate electrode trench 18.

Then, the processes from the process shown in FIGS. 7A through 7E to the process shown in FIG. 21, which have been described in the first embodiment, are sequentially performed to fabricate the semiconductor device 90 of the third embodiment shown in FIG. 32.

According to the method of fabricating a semiconductor device of the third embodiment, after the gate electrode trench 18 and the second element isolation region trench 54 are formed, p-type impurities with a higher concentration than the semiconductor substrate 12 (p-type silicon substrate) are selectively ion-implanted into the bottom 18c of the gate electrode trench 18 and the bottom 54c of the second element isolation region trench 54 to simultaneously form the third impurity diffusion region 83 covering the bottom 54a of the second element isolation trench 54 and the third impurity diffusion region 93 covering the bottom 18c of the gate electrode trench 18. Accordingly, the process of fabricating the semiconductor device 90 can be simplified in comparison with the case in which the third impurity diffusion regions 83 and 93 are formed through separate processes.

Further, since the third impurity diffusion region 93 containing p-type impurities with a higher concentration than the semiconductor substrate 12 is formed to cover the gate insulating film 21 arranged on the bottom 18c of the gate electrode trench 18, the concentration of a channel is high. Accordingly, a threshold voltage of the transistors 19-1 and 19-2 can increase and leak current of the transistors 19-1 and 19-2 in an off state can decrease.

Furthermore, with the method of fabricating the semiconductor device 90 of the third embodiment, the same effects as those of the method of fabricating the semiconductor device 80 of the second embodiment can be obtained.

Fourth Embodiment

FIG. 34 is a cross-sectional view showing a schematic configuration of a memory cell array provided in a semiconductor device according to a fourth embodiment of the present invention. FIG. 34 corresponds to the cross-sectional view taken along a line A-A of the memory cell array shown in FIG. 1.

In FIG. 34, a DRAM is described as an example of the semiconductor device 100 of the fourth embodiment.

In FIG. 34, the same components as the semiconductor device 10 of the first embodiment shown in FIG. 2 are assigned the same reference numerals.

Referring to FIG. 34, a semiconductor device 100 of the fourth embodiment has the same configuration as the semiconductor device 10 of the first embodiment except that the semiconductor device 100 includes a memory cell array 101 in which a depth of the second element isolation trench 54 provided in the memory cell array 11 of the semiconductor device 10 is greater than that of the gate electrode trench 18. That is, a lower end of the second element isolation region 17 is arranged below the bottom 18c of the gate electrode trench 18.

According to the semiconductor device of the fourth embodiment, since the depth of the second element isolation trench 54 is greater than that of the gate electrode trench 18 and the lower end of the second element isolation region 17 is arranged below the bottom 18c of the gate electrode trench 18, the element forming regions R (see FIG. 28) can be securely electrically isolated from each other.

FIGS. 35A through 35E, FIGS. 36A through 36E, and FIGS. 37A through 37E are diagrams showing a process of fabricating the memory cell array provided in the semiconductor device according to the fourth embodiment of the present invention.

FIG. 35A is a plan view of a region in which the memory cell array is formed, FIG. 35B is a cross-sectional view taken along a line A-A of a structure shown in FIG. 35A, FIG. 35C is a cross-sectional view taken along a line B-B of the structure shown in FIG. 35A, FIG. 35D is a cross-sectional view taken along a line C-C of the structure shown in FIG. 35A, and FIG. 35E is a cross-sectional view taken along a line D-D of the structure shown in FIG. 35A.

FIG. 36A is a plan view of a region in which the memory cell array is formed, FIG. 36B is a cross-sectional view taken along a line A-A of a structure shown in FIG. 36A, FIG. 36C is a cross-sectional view taken along a line B-B of the structure shown in FIG. 36A, FIG. 36D is a cross-sectional view taken along a line C-C of the structure shown in FIG. 36A, and FIG. 36E is a cross-sectional view taken along a line D-D of the structure shown in FIG. 36A.

FIG. 37A is a plan view of a region in which the memory cell array is foamed, FIG. 37B is a cross-sectional view taken along a line A-A of a structure shown in FIG. 37A, FIG. 37C is a cross-sectional view taken along a line B-B of the structure shown in FIG. 37A, FIG. 37D is a cross-sectional view taken along a line C-C of the structure shown in FIG. 37A, and FIG. 37E is a cross-sectional view taken along a line D-D of the structure shown in FIG. 37A.

Further, positions of the lines A-A, B-B, C-C and D-D shown in FIGS. 35A through 35E, FIGS. 36A through 36E, and FIGS. 37A through 37E correspond to those of the lines A-A, B-B, C-C and D-D shown in FIG. 1, respectively.

Next, a method of fabricating the semiconductor device 100 (specifically, memory cell array 101) according to the fourth embodiment will be described with main reference to FIGS. 35A through 35E, FIGS. 36A through 36E, and FIGS. 37A through 37E.

First, the processes from the process shown in FIGS. 3A through 3E to the process shown in FIGS. 5A through 5E, which have been described in the first embodiment, are sequentially performed and the structure shown in FIGS. 5A through 5E is formed.

Next, in a process shown in FIGS. 35A through 35E, the same process as the process shown in FIGS. 6A through 6E, which has been described in the first embodiment, is performed and a mask insulating film 67 having the trench-shaped openings 67A and 67B shown in FIGS. 6A through 6E is formed on the structure shown in FIGS. 5A through 5E.

Next, photoresist 105 having an opening 105A, which buries the opening 67B and exposes the opening 67A, is formed on the mask insulating film 105.

Next, the semiconductor substrate 12 exposed from the opening 67A is etched by anisotropic etching using the photoresist 105 as a mask to thereby form two gate electrode trenches 18 opposing the second side surface 18b. In this case, depths $D_2$ of the gate electrode trenches 18 may be, for example, 150 nm.

Next, in a process shown in FIGS. 36A through 36E, after the photoresist 105 shown in FIGS. 35A through 35E is removed, photoresist 107 having an opening 107A, which buries the gate electrode trench 18 and exposes the opening 67B, is formed on a structure shown in FIG. 36A.

Next, the semiconductor substrate 12 exposed from the opening 67B is etched by anisotropic etching using the photoresist 107 as a mask to form a second element isolation trench 54 having a depth greater than the gate electrode trench 18.

If a depth $D_2$ of the gate electrode trench 18 is 150 nm, the depth $D_5$ of the second element isolation trench 54 (a depth from a main surface 12a of the semiconductor substrate 12) may be, for example, 250 nm.

Next, in a process shown in FIGS. 37A through 37E, the photoresist 107 shown in FIGS. 36A through 36E is removed. Then, the processes from the process shown in FIGS. 7A through 7E to the process shown in FIG. 21, which have been described in the first embodiment, are performed to fabricate the semiconductor device 100 of the fourth embodiment shown in FIG. 34.

According to the method of fabricating the semiconductor device of the fourth embodiment, the gate electrode trench 18 and the second element isolation trench 54 are formed through separate processes such that the depth of the second element isolation trench 54 can be greater than that of the gate electrode trench 18.

Accordingly, since the lower end of the second element isolation region 17 is arranged below the bottom 18c of the gate electrode trench 18, the element forming regions R (see FIG. 28) can be securely electrically isolated from each other.

Although the preferred embodiments of the present invention have been described above, the present invention is not limited to such specific embodiments and various modifications and variations may be made without departing from the scope and spirit of the present invention defined in claims.

For example, the second element isolation region 17 described in the fourth embodiment and the third impurity diffusion regions 83 and 93 described in the third embodiment may be combined to form a semiconductor device.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a semiconductor substrate having first and second isolation grooves, the first isolation grooves extending in a first direction, the first isolation grooves defining a first active region, the second isolation groove extending in a second direction different from the first direction, the second isolation groove extending to divide the first isolation groove into divided groove portions, the second isolation groove extending to divide the first active region into device formation regions, the device formation regions being defined by the first and second isolation grooves, the device formation regions each having a first gate groove extending in the second direction;
   a first isolation insulating film in the first isolation groove;
   a second isolation insulating film in the second isolation groove;
   a first gate insulating film in a lower portion of the first gate groove;
   a first gate electrode on the first gate insulating film, the first gate electrode being in the lower portion of the first gate groove;
   a first buried insulating film over the first gate electrode, the first buried insulating film being in an upper portion of the first gate groove;
   a first diffusion region in the device formation region, the first diffusion region being disposed in a first side of the first gate groove; and
   a second diffusion region in the device formation region, the second diffusion region being disposed in a second side of the first gate groove, opposite to the first side.

2. The semiconductor device according to claim 1, wherein the first gate groove has substantially the same depth as the second isolation groove.

3. The semiconductor device according to claim 1, further comprising:
   a fourth diffusion region in the semiconductor substrate, the fourth diffusion region being disposed under the second isolation groove, the fourth diffusion region being higher in impurity concentration than the semiconductor substrate.

4. The semiconductor device according to claim 1, further comprising:
   a fifth diffusion region in the semiconductor substrate, the fifth diffusion region being disposed under the first gate groove, the fifth diffusion region being higher in impurity concentration than the semiconductor substrate.

5. The semiconductor device according to claim 1, wherein the first gate groove has a shallower depth than the second isolation groove.

6. The semiconductor device according to claim 1, further comprising:
   a bit line electrically coupled to the first diffusion region.

7. The semiconductor device according to claim 1, wherein the device formation region has a second gate groove extending in the second direction, and the first diffusion region is disposed between the first and second gate grooves.

8. The semiconductor device according to claim 7, further comprising:
   a second gate insulating film in a lower portion of the second gate groove;
   a second gate electrode on the second gate insulating film, the second gate electrode being in the lower portion of the second gate groove;
   a second buried insulating film over the second gate electrode, the second buried insulating film being in an upper portion of the second gate groove; and
   a third diffusion region in the device formation region, the third diffusion region being disposed in an opposite side to the first diffusion region with reference to the second gate groove.

9. The semiconductor device according to claim 8, wherein the first and second gate grooves have substantially the same depth as the second isolation groove.

10. The semiconductor device according to claim 8, wherein the first and second gate grooves have a shallower depth than the second isolation groove.

11. The semiconductor device according to claim 1, wherein the first isolation insulating film comprises:
   a first insulating layer covering inside walls of the first isolation groove; and
   a second insulating layer on the first insulating layer, the second insulating layer filling the first isolation groove.

12. The semiconductor device according to claim 11, wherein the first insulating layer comprises a thermal oxidation layer.

13. The semiconductor device according to claim 1, wherein the second isolation insulating film comprises:
   a third insulating layer covering inside walls of the second isolation groove; and
   a fourth insulating layer on the third insulating layer, the fourth insulating layer filling the second isolation groove.

14. The semiconductor device according to claim 13, wherein the third insulating layer comprises a thermal oxidation layer.

15. The semiconductor device according to claim 1, further comprising:
   an inter-layer insulating film over the semiconductor substrate; and
   a contact plug in the inter-layer insulating film, the contact plug being coupled to the second diffusion region.

16. The semiconductor device according to claim 15, further comprising:
   a capacitive contact pad over the inter-layer insulating film, the capacitive contact pad being in contact with the contact plug; and
   a capacitor coupled to the capacitive contact pad.

17. A semiconductor device comprising:
   a semiconductor substrate having a device formation region, the device formation region defined by first and second device isolation regions, wherein the first device isolation region defines a first active region that extends in a first direction, and the second device isolation region extends in a second direction different from the first direction, the second device isolation region extending to divide the first device isolation into divided groove portions; the device formation region having a first gate groove which extends in the second direction; a first gate insulating film in a lower portion of the first gate groove; a first gate electrode on the first gate insulating film, the first gate electrode being in the lower portion of the first gate groove; and a buried insulating film over the first gate electrode, the buried insulating film being in an upper portion of the first gate groove.

18. The semiconductor device according to claim 17, further comprising:
   first and second diffusion regions in the device formation region, the first and second diffusion regions being disposed in opposite sides of the first gate groove.

19. A semiconductor device comprising:
   a semiconductor substrate having first and second isolation grooves, the first isolation grooves extending in a first direction, the first isolation grooves defining active regions, the second isolation grooves extending in a second direction different from the first direction, the second isolation grooves extending to divide the first isolation grooves into divided groove portions, the second isolation grooves extending to divide the active region into device formation regions, the device formation regions being each defined by the first and second isolation grooves, the device formation region each having first and second gate grooves extending in the second direction;
   first isolation insulating films in the first isolation grooves;
   second isolation insulating films in the second isolation grooves;
   first gate insulating films in lower portions of the first gate grooves;
   first gate electrodes on the first gate insulating films, the first gate electrodes being in the lower portions of the first gate grooves;
   first buried insulating films over the first gate electrodes, the first buried insulating films being in upper portions of the first gate grooves;
   second gate insulating films in lower portions of the second gate grooves;
   second gate electrodes on the second gate insulating films, the second gate electrodes being in the lower portions of the second gate grooves;
   second buried insulating films over the second gate electrodes, the second buried insulating films being in upper portions of the second gate grooves;
   a first diffusion region in the device formation region, the first diffusion region being disposed between the first and second gate grooves; and
   a second diffusion region in the device formation region, the second diffusion region being disposed in an opposite side to the first diffusion region with reference to the first gate groove; and
   a third diffusion region in the device formation region, the third diffusion region being disposed in an opposite side to the first diffusion region with reference to the second gate groove.

20. The semiconductor device according to claim 19, further comprising:
   a fourth diffusion region in the semiconductor substrate, the fourth diffusion region being disposed under the second isolation region, the fourth diffusion region being higher in impurity concentration than the semiconductor substrate;
   a fifth diffusion region in the semiconductor substrate, the fifth diffusion region being disposed under the first gate groove, the fifth diffusion region being higher in impurity concentration than the semiconductor substrate;
   a bit line electrically coupled to the first diffusion region;
   an inter-layer insulating film over the semiconductor substrate;
   a contact plug in the inter-layer insulating film, the contact plug being coupled to the second diffusion region;
   a capacitive contact pad over the inter-layer insulating film, the capacitive contact pad being in contact with the contact plug; and
   a capacitor coupled to the capacitive contact pad.

* * * * *